(12) United States Patent
Grannis, III

(10) Patent No.: US 6,754,863 B1
(45) Date of Patent: Jun. 22, 2004

(54) SCAN INTERFACE CHIP (SIC) SYSTEM AND METHOD FOR SCAN TESTING ELECTRONIC SYSTEMS

(75) Inventor: Louis C. Grannis, III, San Jose, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/542,431

(22) Filed: Apr. 4, 2000

(51) Int. Cl.[7] ............................................. G01R 31/28
(52) U.S. Cl. ...................................................... 714/729
(58) Field of Search ................................ 714/726, 727, 714/729, 733, 734

(56) References Cited

U.S. PATENT DOCUMENTS

| | | | | |
|---|---|---|---|---|
| 5,056,093 A | * | 10/1991 | Whetsel | ...................... 714/729 |
| 5,448,576 A | * | 9/1995 | Russell | |
| 5,497,378 A | * | 3/1996 | Amini et al. | |
| 5,768,289 A | * | 6/1998 | James | |
| 5,781,560 A | * | 7/1998 | Kawano et al. | |
| 5,935,266 A | * | 8/1999 | Thurnhofer et al. | |
| 6,035,431 A | * | 3/2000 | Higashida | |
| 6,052,808 A | * | 4/2000 | Wu et al. | |
| 6,324,614 B1 | * | 11/2001 | Whetsel | |
| 6,324,663 B1 | * | 11/2001 | Chambers | |
| 6,418,545 B1 | * | 7/2002 | Adusumilli | |
| 6,427,217 B1 | * | 7/2002 | Hartnett | |

* cited by examiner

Primary Examiner—Albert Decady
Assistant Examiner—Matthew C. Dooley
(74) Attorney, Agent, or Firm—Schwegman, Lundberg, Woessner & Kluth, P.A.

(57) ABSTRACT

A scan test interface system and method provides an interface between upstream scan test devices and downstream scan test devices. In one embodiment, the present invention utilizes a scan test interface comprising a scan interface chip (SIC) that facilitates a flexibly programmable system level scan test architecture. The SIC includes a scan test interface register, a system interface, a scan test interface controller, a board interface and a selection circuit.

25 Claims, 44 Drawing Sheets

| INSTRUCTION | OPCODE |
|---|---|
| EXTEST | XXXXXXXX0000 |
| IDCODE | XXXXXXXX0001 |
| SAMPLE | XXXXXXXX0010 |
| BYPASS | XXXXXXXX0011 |
| LOAD_AR | XXXXXXXX0100 |
| BYPASS | XXXXXXXX0101 |
| BYPASS | XXXXXXXX0110 |
| BYPASS | XXXXXXXX0111 |
| LOAD_CER | XXXXXXXX1000 |
| LOAD_IOR | XXXXXXXX1001 |
| STORE_IOR | XXXXXXXX1010 |
| BYPASS | XXXXXXXX1011 |
| LOAD_NCR | XXXXXXXX1100 |
| STORE_TSR | XXXXXXXX1101 |
| LOAD_MR | XXXXXXXX1110 |
| BYPASS | XXXXXXXX1111 |

FIG. 11B

| MR7:3 | SIGNAL |
|---|---|
| 0x00 | DEBUG OUTPUT PIN DISABLED |
| 0x01 | DATA_OUT (FROM NIC SEQUENCE BLOCK) |
| 0x02 | DATA_VALID (FROM NIC SEQUENCE BLOCK) |
| 0x03 | BYPASS_REGISTER |
| 0x04 | TEST_DATA_OUT_NOT (FROM OUTPUT_CONTROL) |
| 0x05 | LOAD_ADDRESS_REGISTER (FROM INSTRUCTION_DECODE) |
| 0x06 | IDCODE (FROM INSTRUCTION_DECODE) |
| 0x07 | LOAD_CHAIN_ENABLE_REGISTER (FROM INSTRUCTION_DECODE) |
| 0x08 | BYPASS (FROM INSTRUCTION_DECODE) |
| 0x09 | LOAD_NIC_CONTROL_REGISTER (FROM INSTRUCTION_DECODE) |
| 0x0A | LOAD_MODE_REGISTER (FROM INSTRUCTION_DECODE) |
| 0x0B | EXTEST (FROM INSTRUCTION_DECODE) |
| 0x0C | SAMPLE (FROM INSTRUCTION_DECODE) |
| 0x0D | TEST_LOGIC_RESET (FROM TAP_CONTROLLER) |
| 0x0E | RUN_TEST_IDLE (FROM TAP_CONTROLLER) |
| 0x0F | CAPTURE_DR (FROM TAP_CONTROLLER) |
| 0x10 | SHIFT_DR (FROM TAP_CONTROLLER) |
| 0x11 | UPDATE_DR (FROM TAP_CONTROLLER) |
| 0x12 | CAPTURE_IR (FROM TAP_CONTROLLER) |
| 0x13 | SHIFT_IR (FROM TAP_CONTROLLER) |
| 0x14 | UPDATE_IR (FROM TAP_CONTROLLER) |
| 0x15 | MICRO_LAN_IN (FROM MICROLAN) |
| 0x16 | MICRO_LAN_OUT (FROM NIC_SEQUENCE_BLOCK) |
| 0x17 | TEST_DATA_IN (FROM SIC) |
| 0x18 | RESET (FROM RESET) |
| 0x19 | CHIP_ENABLE (FROM CHIP_ENABLE) |
| 0x1A | ADDRESS_MATCH (FROM ADDRESS_MATCH) |
| 0x1B | BROADCAST_MATCH (FROM ADDRESS_MATCH) |
| 0x1C | STORE_TAP_STATE_REGISTER (FROM INSTRUCTION_DECODE) |
| 0x1D | LOAD_INPUT_OUTPUT_REGISTER (FROM INSTRUCTION_DECODE) |
| 0x1E | STORE_INPUT_OUTPUT_REGISTER (FROM INSTRUCTION_DECODE) |
| 0x1F | RESERVED |

SCAN INTERFACE CHIP (SIC) SYSTEM AND METHOD FOR SCAN TESTING ELECTRONIC SYSTEMS

FIELD OF THE INVENTION

The present invention relates to the field of electrical integrated circuit testing. More particularly, the present invention relates to a scan test interface utilized to facilitate a system level scan test architecture.

BACKGROUND OF THE INVENTION

Electronic systems and circuits have made a significant contribution towards the advancement of modem society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, electronic systems designed to provide these results include numerous printed circuit boards (PCBs) comprising a variety of microelectronic integrated circuits (ICs). Efficient and reliable system wide testing of ICs included in an electronic system is critical in determining if a system operates properly and provides desired results.

The complexity of commonly used integrated circuits has advanced dramatically and built in self test (BIST) diagnostics capability is essential for effective circuit testing, debugging, and maintenance. Modern BIST techniques typically include the insertion of a scan test architecture in an IC to provide controllability and observability of IC components. Usually, scan test architectures include the ability to extract or insert state information to and from a number of devices within a system (e.g., a computer system) that conform to a scan testing specification. Scan testing of complex electronic systems and circuits often requires analysis of measurements taken or "captured" at numerous test points (e.g., appropriately selected circuit nodes) after the application of test vectors to stimulate certain aspects of a circuit (e.g., a NAND gate, OR gate, functional logic devices, etc.).

Scan test architectures usually include special signals that provide directions and test vectors for scan test operations. For example, an International Electrical and Electronic Engineering (IEEE) Standard 1149.1 (also referred to as Joint Task Action Group (JTAG)) boundary scan compliant architecture requires at least 4 signals to be dedicated to scan test operations. The IEEE 1149.1 standard signals are Test Data In (TDI), Test Data Out (TDO), Test Clock (TCK) and Test Mode Select (TMS). In addition JTAG IEEE 1149.1 boundary scan standard architectures often include other optional signals, such as a very common test reset (TRST) signal. Coordinating the communication of typical scan test signals (e.g., IEEE 1149.1 compliant signals) to a multitude of various destinations throughout a typical electronic system (e.g., test points, test controllers, test registers, etc.) often requires significant resources.

Traditional system level scan test architectures typically rely upon dedicated communication lines to communicate scan test signals. The dedicated scan test communication lines are often arranged in a star configuration in which scan test control signals are transmitted directly from a central controller to test points or PCB slots in the scan test system. Typically, each test point or PCB slot in a system requires a set of scan test control signals resulting in significant resources being expended on providing numerous dedicated lines for communication of scan test signals to each testing point or PCB slot. The numerous lines typically required in a star configuration also imposes significant limitations of the number of PCBs that are scanned in an individual module.

Traditional scan test systems also typically require the insertion of an external scan control PCB for system level scan control and signaling. These external scan control PCBs pose particular problems for module to module interconnect testing, often requiring additional resources to be expended designing and implementing a scan multiplexer box to direct scan operations at particular modules. Additionally, scan controller PCBs are usually difficult to physically install and remove since they are not typically part of a product design. Furthermore, a scan controller PCB is not usually controlled (e.g., reset) by an overall electronic system controller and thus causes additional problems when it is installed during normal operations.

In addition to requiring significant resources to be expended on providing numerous dedicated lines for scan test communications, traditional system level scan test architectures typically have other serious limitations and inconvenient idiosyncrasy that detract from desirable scan test control and observability functions. For example, typical system levels scan test architectures are usually limited to one scan test chain on each target PCB. This makes testing of PCBs that have scannable devices on subordinate (e.g., daughter) PCBs difficult, especially if the PCBs are reconfigured. Reconfiguring in a traditional system level scan test architecture is particularly problematic for most scan test tools because they usually require significant resources to program the software to cope with the large number of reconfiguration scenarios that are possible.

Additional difficulties are experienced in traditional system level scan test architecture systems that do not provide flexibility in scan test programming. Traditional systems often require a full reset between programming operations that resets information in scan test registers. The scan test information stored in the register is lost when the register is reset. A full reset also typically resets the state of signals on scan test chains resulting in undesirable effects on the target scannable devices. Another problem that often occurs during programming is spurious transitions on a scan chain that typically result in the logic values on the chain that complicate test vector generation. Additionally, scan operations that require one board to hold the state of a scan operation while a second board is selected for scan test operations may not be possible when the signals of subordinate scan test chains are reset during a programming operation on the second board.

What is required is a system and method that facilitates a flexibly programmable system level scan test architecture. The system and method should facilitate resets of a TAP controller without necessarily resetting other scan test registers. The system an method should also facilitate reduction of spurious transitions on a scan chain and assist one board to hold the state of a scan operation while a second board is selected for scan test operations.

SUMMARY OF THE INVENTION

Accordingly, the present invention is a scan test interface system and method that facilitates a flexibly programmable system level scan test architecture. The present invention provides a scan test signal interface between an upstream scan test device and downstream scan test devices and facilitates resets of a scan test interface TAP controller without necessarily resetting other scan test registers. A present invention scan test interface system also facilitates reduction of spurious transitions on a scan chain and assists one board to hold the state of a scan operation while a second board is selected for scan test operations.

One embodiment of a present invention includes a scan interface chip (SIC) that acts as a communication interface and supports a partial scan test interface reset and a full scan test interface reset. In one embodiment of a present invention partial scan test interface reset, a first circuit (e.g., a SIC TAP controller) included in the scan test interface is reset and a second circuit (e.g., a SIC register) is not. The full scan test interface reset includes resetting both the first and second circuit included in the scan test interface. A present invention scan test interface with a full and partial reset does not require an intervening full reset operation to occur between programming operations. One embodiment of a present invention scan test interface facilitates programming activities by holding logic levels of subordinate scan test chain signals constant when a scan test interface is placed into or enters programming mode. This permits programming to proceed without causing spurious transitions on a scan chain during programming operations.

BRIEF DESCRIPTION OF THE DRAWINGS

FIG. 11B is an instruction decode table of one embodiment of the present invention.

FIG. 32 is a debug select decode table illustrating the correspondence between mode register bits and a debug signal included in one embodiment of the present invention.

DETAILED DESCRIPTION OF THE INVENTION

Figure 1:
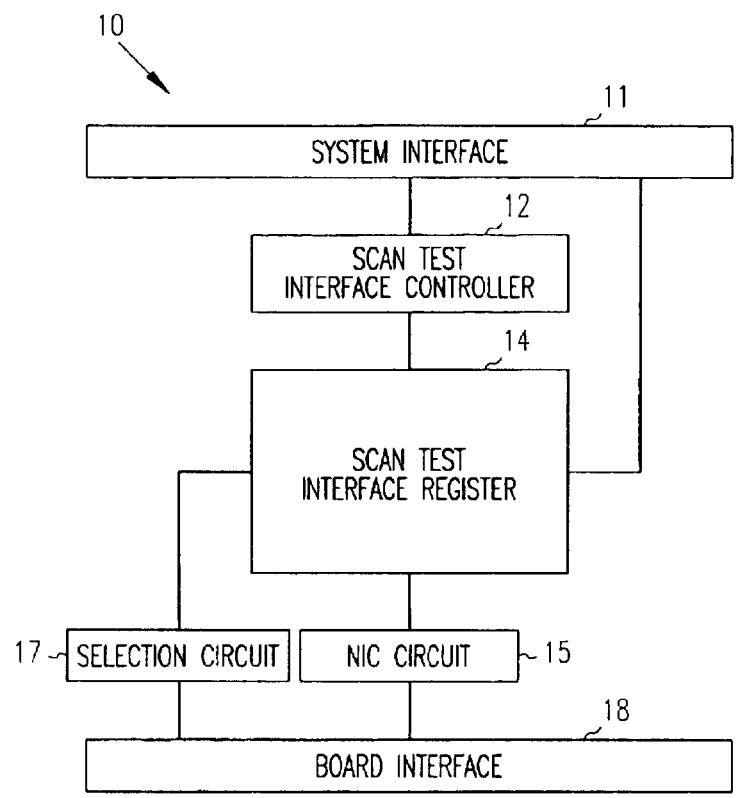
FIG. 1 is a block diagram of a scan test interface of the present invention.

Reference will now be made in detail to the preferred embodiments of the invention, a scan test interface system and method for scan testing electronic systems, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Some portions of the detailed descriptions which follow are presented in terms of procedures, logic blocks, processing, and other symbolic representations of operations on data bits within an electronic system. These descriptions and representations are the means used by those skilled in the digital arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in the electronic system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise or as apparent from the following discussions, it is appreciated that throughout the present invention, discussions utilizing terms such as "processing" or "computing" or "calculating" or "determining" or "displaying" or the like, refer to the action and processes of an electronic device that manipulates and transforms data represented as physical (electronic) quantities within the system (e.g., within registers, logic gates, memories, etc.) into other data similarly represented as physical quantities within the system devices or other such information storage, transmission or display devices.

The present invention is a scan test interface system and method that provides interfacing between upstream scan test devices and downstream scan test devices. The scan test interface system and method receives scan test signals, facilitates flexible configuration of scan test signals and transmits scan test signals on subordinate scan test chains. In one embodiment, the present invention utilizes a scan test interface comprising a scan interface chip (SIC) to provide an interface between upstream devices (e.g., a system scan test controller) and downstream devices (e.g., devices included on a PCB the SIC services). In one embodiment, the present invention performs scan test interfacing operations without imposing extraneous data bits into scan test data and have to be tracked by system software.

In one embodiment of the present invention, a plurality of PCB slots are arranged in a multi-drop configuration in which one copy of each scan test signal communicated to and from a scan test system controller is distributed to multiple PCB slots via a master scan test bus. The PCB slots are configured to couple with a PCB that includes a scan test interface (e.g., a SIC). Scan test signals from the scan test system controller to downstream scan test devices (and vise versa) are processed and communicated via the scan test interface. A scan test interface of the present invention includes numerous features that facilitate efficient and effective scan testing operations. For example, various embodiments of the present invention include support for multiple separate subordinate scan test chains, expedient programming operations, downstream device accommodations, and scan test information recovery attributes.

One embodiment of the present invention supports scan test signal communication to and from multiple subordinate separate scan test chains. For example, one embodiment of a present invention scan test interface provides communication of a separate set of scan test signals to each downstream scan test chain. By supporting multiple scan test chains with their own separate set of scan test signals, a present invention scan test interface provides programmatic control for each of the scan test chains. Providing accommodations for a separate set of scan test signals to each scan test chain also facilitates scan testing of devices operating in different voltage and or time domains. In one exemplary implementation of the present invention, downstream functional devices operating in the same voltage and time (e.g., clock) domain are assigned to the same scan test chain. As the scan test signals are "divided" onto different scan test chains the scan test interface facilitates flexible coordination of scan test signals communicated to and from different voltage and timing domains. The scan test interface also concatenates scan test signals from the separate scan test chains (e.g., scannable devices on a PCB) back together so that they appear as a contiguous system scan test chain to scan test software. Supporting multiple scan test chains also allows PCBs to be easily reconfigured (e.g., addition of daughter boards) and reduces problems associated with tracking numerous configuration combinations.

In one embodiment of the present invention, a scan test interface also includes scan test information recovery attributes and support for multi-thread environment. For example, one embodiment of a scan test interface tracks and stores a "duplicate" copy of the state of internal scan test interface components or scan test signals. In one embodiment of the present invention, the scan test interface tracks and stores the state of an internal scan test interface circuit (e.g., a test access port (TAP) controller) and scan test signals associated with a subordinate scan test chain the scan test interface services. Thus, the state of the internal scan test interface circuit and scan test signals associated with a subordinate scan test chain are effectively preserved while other operations proceed. Furthermore, the scan test interface is capable of returning the stored or saved state information to system level devices or software.

One embodiment of the present invention facilitates expedient programming of a scan test interface. In one embodiment of the present invention, a scan test interface supports a partial scan test interface reset and a full scan test interface reset. In one embodiment of a present invention partial scan test interface reset, a first circuit included in the scan test interface is reset and a second circuit is not. In one embodiment of a full scan test reset of the present invention, both a first and a second circuit included in a scan test interface are reset. One embodiment of the present invention supporting a full and partial reset does not require an intervening full reset operation to occur between programming operations. One embodiment of a present invention scan test interface facilitates programming activities by holding logic levels of subordinate scan test chain signals constant when a scan test interface is placed into or enters programming mode. This permits programming to proceed without causing spurious transitions on a scan chain during programming operations.

One embodiment of the present invention facilitates scan testing of downstream devices by flexibly interacting with the downstream devices. The present invention supports retrieval of information regarding a PCB (e.g., a board or device type, revision level and serial number). One embodiment of a scan test interface also includes general purpose Input/Output (I/O) ports that are independently programmed to operate as an input, an output or bi-directional I/O. The scan test interface also facilitates programmatic control of signals utilized to assist non-compliant devices to function compliantly during scan test operations.

FIG. 1 is a block diagram of scan test interface 10, one embodiment of the present invention. Scan test interface 10 comprises system interface 11, scan test interface controller 12, scan test interface register 14, selection circuit 17 and board interface 18. Scan test interface register 14 is coupled to scan test interface controller 12, system interface 11, and selection circuit 17 which is coupled to board interface 18. One embodiment of scan test interface 10 also includes a number in can (NIC) circuit 15 coupled to scan test interface register 14. System interface 11 provides a communication port for communicating scan test operation information between scan test interface 10 and upstream scan test devices (e.g., other components of a system not included on a board that scan test interface 10 services). Scan test interface controller 12 directs operations of scan test interface register 14. Scan test interface register 14 stores information related to scan test operations. In one embodiment of the present invention, scan test interface register 14 supports both an partial reset operation and full reset operation. Board interface 18 provides a communication port for communicating information between scan test interface 10 and down stream scan test devices (e.g., devices included on a board that scan test interface 10 services). Selection circuit 17 facilitates selection of a port (e.g., a scan test chain port) included in board interface 18. In one embodiment of the present invention, selection circuit 17 maintains the state of a downstream scan test signal transmission during programming operations. NIC circuit 15 facilitates retrieval of information (e.g., a unique number in an electronically readable device) associated with downstream scan test devices (e.g., components included on a board scan test interface 10 services).

In one embodiment of the present invention, board interface 18 includes multiple sets of scan test chain ports. In one embodiment of board interface 18, each set of scan test chain ports provides a separate set of scan test signals for each scan test chain. In one embodiment of scan test interface 10, each set of scan test chain port includes a test data in output (TDIO) port, a test data out input (TDOI) port, a test mode select output (TMS0) port, a test clock output (TCKO) port, and test reset output (TRSTN0) port for each scan test chain. For example, in one embodiment of the present invention in which a scan test interface services two downstream scan test chains there is a first TDIO port and a second TDIO port. Thus, there is a TDIO port for transmitting test data in (TDI) signals out to each down stream scan test chain (e.g., a scan test chain included on the PCB SIC 10 services). Providing a complete set of scan test signals for each scan test chain a scan test interface services also facilitates programmatic control over the separate subordinate scan test chain signals.

In one embodiment of scan test interface 10, each of the set of scan test chain ports service a scan test chain in a different voltage or clock domain. Thus, scan test interface 10 allows each subordinate scan test chain to be independently coupled to devices operating in a different voltage or clock domain from devices coupled to another scan test chain. In one embodiment of a system utilizing the present invention, devices included in a PCB that operate in the same voltage domain are coupled together on the same subordinate scan test chain. In one embodiment of the present invention, scan test interface 10 internally concatenates the signals from the different scan test chains together in a manner that implements appropriate voltage and time conversions to make the different scan test chains appear as one continuous system scan test chain to scan test system software.

One embodiment of scan test interface 10 facilitates efficient programming of a scan test interface. One embodiment of scan test interface 10 facilitates programming activities by preventing a scan test interface from causing scan test chain signal movement in subordinate scan test chain signals. Scan test interface 10 holds logic levels of subordinate scan test chain signals static when a scan test interface is placed into or enters programming mode. This permits programming to proceed without causing spurious transitions on a scan chain during programming operations. In one embodiment of the present invention, scan test interface 10 holds the logic levels of subordinate scan test chain signals static by storing the logical value of the last scan test signal in a scan chain signal storage circuit (e.g., a latch) before entering a programming mode and transmitting the stored logical value to the subordinate scan test chain.

In one embodiment of scan test interface 10 facilitates partial scan test interface reset and a full scan test interface reset. The partial reset facilitates programming processes without requiring an intervening full reset operation to occur between programming operations. During one embodiment of a present invention partial scan test interface reset, scan test interface controller 12 is reset but not scan test interface register 14. In one embodiment of a full reset of the present invention, both the scan test interface controller and the scan test interface register are reset. In one embodiment of the present invention, scan test interface controller 12 and scan test interface register 14 are reset in response to reset trigger signals. In one embodiment of the present invention, a power up process or a test reset (e.g., TRST) signal assertion triggers a full reset (e.g., resetting scan test interface controller 12 and scan test interface register 14). In one embodiment of a partial reset of scan test interface 10, scan test interface controller 12 is synchronously put in a reset state by issuing a predetermined number of test clock cycles (e.g., 5) with a test mode signal asserted (e.g., high). However, in one embodiment of present invention, scan test interface registers are not reset by issuing the test clock cycles with a test mode signal asserted (e.g., high).

In one embodiment of the present invention, scan test interface 10 facilitates scan testing of downstream devices by flexibly interacting with the downstream devices. For example, number in can (NIC) circuit 15 supports retrieval of information regarding downstream devices (e.g., the device type, revision level, serial number, etc.). The retrieved information enables scan test software to configure itself rather than needing manual input of this information or empirically extracting the information. One embodiment of a board interface 18 also includes general purpose Input/Output (I/O) bits or ports that are independently programmed to operate as an input, an output or bidirectional I/O. The general purpose I/O ports are programmatically controlled and available to support a variety of functions (e.g., lighting an LED). Selection circuit 17 facilitates the selection of general I/O ports as an input, an output or bi-directional I/O. Scan test interface 10 also provides programmatic control of signals utilized to assist non-compliant devices to function compliantly during scan test operations. In one embodiment of the present invention, scan test interface 10 provides signals that enable scannable devices for operation in a scan test mode. In one embodiment of the present invention, scan test interface 10 provides signals that control whether a functional reset signal is utilized to reset scan test features of a downstream device during scan test operations.

Scan test interface 10 also includes scan test information recovery attributes in one embodiment of the present invention and supports multi-thread operations. For example, one embodiment of scan test interface 10 tracks the state of scan test signals from scan test interface controller 12. In one embodiment of scan test interface 10, the state of the scan test signals from the scan test interface controller 12 reflect aspects of the state of scan test interface controller 12 and by tracking the state of signals from scan test interface 12, the present invention also tracks aspects of the state of scan test interface 12. In one embodiment of the present invention, a scan test chain duplicate test access port (TAP) controller (not shown) tracks the state of a primary TAP controller (included in scan test interface controller 12) scan test signals associated with a subordinate scan test chain that scan test interface 10 services. In one embodiment of the present invention, a scan test interface stores the state of the scan test interface signals in a register. Thus, aspects of a scan test interface controller 12 state associated with a subordinate scan test chain is effectively preserved by scan test chain duplicate test access port (TAP) controller and a scan test interface register. The state is preserved even if other operations of the system (e.g., multiple users on the system running different processes) inadvertently cause the scan test interface controller 12 state to change. Furthermore, the scan test interface is capable of returning the stored or saved aspects of the scan test interface controller 12 state information to system level devices or software.

In one embodiment of the present invention, scan test interface 10 comprises outputs that are configured as tri-state or pseudo open collector (OC) depending upon a mode selection. When configured as a pseudo open collector the ports of scan test interface 10 are able to drive signals at different voltage levels. In one embodiment of the present invention, a pseudo open collector output is not open collector in terms of actual transistors. A pseudo open collector output comprises a tri-state gate with a tri-state gate enable signal coupled to its active control that forces it to operate "rail to rail". When the tri-state gate enable signal is asserted (e.g., low) the tri-state output becomes a "dual state of low and high" impedance and the output is "pulled up" to an appropriate voltage level (e.g., the voltage level of devices included in a scan test chain) for high or logical 1 values. When the Tri-state gate enable signal is not asserted (e.g., high) the output operates as a tri-state output in that it drives both low, high or is a high impedance. Tri-state mode does not require an output signal to be "pulled up".

Figure 1A:
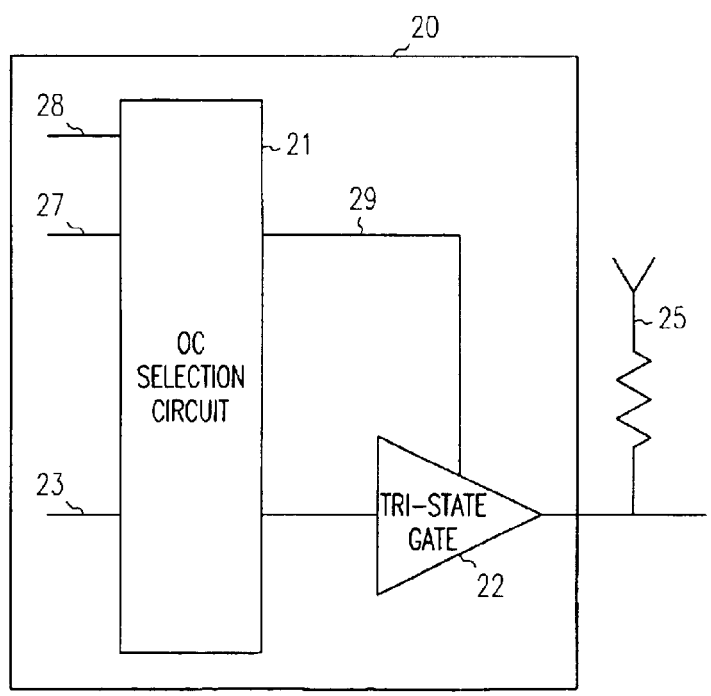
FIG. 1A is a schematic of one embodiment of a scan test interface output port of the present invention.

FIG. 1A is a schematic of a pseudo open collector (OC) tri-state circuit 20, one embodiment of the present invention. Pseudo OC tri-state circuit performs in a pseudo OC mode or tri-tri-state mode depending upon a mode control signal such as OC selection control signal 27. Pseudo OC tri-state circuit 20 comprises OC selection circuit 21, and tri-state gate 22. OC selection circuit 21 is coupled to tri-state gate 22, tri-state gate enable signal 29, OC selection control signal 27 and OC output indication signal 23. OC selection circuit 21 transmits tri-state gate enable signal 29 based upon input from OC selection control signal 27 and OC output indication signal 23. One embodiment of the present invention includes a tri-state override signal 28 (e.g., TRISTATE) that "overrides" OC selection control signal 27 and OC output indication signal 23. In one exemplary implementation of the present invention, assertion of tri-state override signal 28 ensures tri-state gate enable signal 29 is not active and forces tri-state gate 22 to operate in "rail to rail" tri-state mode.

Tri-state gate enable signal 29 governs whether tri-state gate 22 operates as a tri-state "rail to rail" output or a tri-state "high impedance" output. As a tri-state "rail to rail" output tri-state gate 22 transmits OC output indication signal 23. As a tri-state "high impedance" output, tri-state gate 22 transmits a logical value of output indication signal 23 when tri-state gate 22 is enabled by tri-state gate enable signal 29 and tri-state gate 22 output appears a high impedance when tri-state gate 22 is disabled. For, example, tri-state gate 22 transmits output indication signal 23 if it is a logical 0 value (e.g., low or ground) and tri-state gate 22 appears as a high impedance to downstream devices if OC output indication signal 23 if it is a logical 1 value. In one embodiment of the present invention, output indication signal 23 indicates the logical value to appear on the output of tri-state gate 22 and tri-state gate enable signal 29 is the inverted phase of output indication signal 23. When tri state gate 22 appears as a high impedance, a logical 1 value of high voltage Vdd is transmitted to downstream devices.

In one embodiment of the present invention, the value of Vdd is dependent upon a source feeding downstream devices on a PCB (e.g., same as a scan test chain voltage). One embodiment of the present invention includes an appropriate OC pull up resistor 25, for example included on the PCB. Thus, scan test interface outputs are interchangeable to a number of applications with differing voltage domains. One embodiment of the present invention does not include a pull of resistor if the output is a "rail to rail" tri-state output and not operating as a pseudo OC output.

Figure 2:
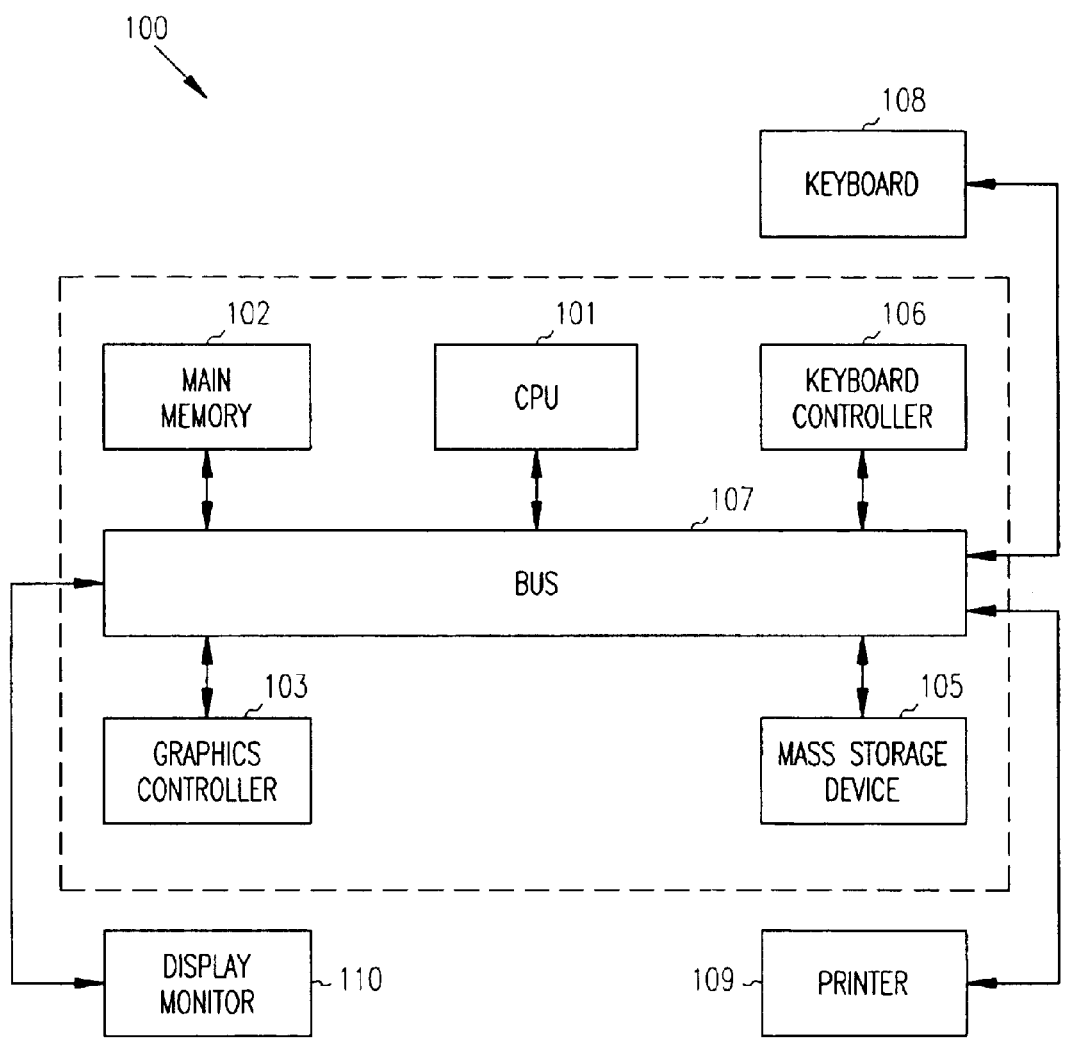
FIG. 2 is a schematic of a computer system that includes one embodiment of the present invention.

In one embodiment of the present invention, scan test interface 10 is included in a computer system. Refer to FIG. 2 which illustrates a computer system 100 that includes one embodiment of the present invention. In general, computer system 100 comprises a central processing unit (CPU) 101, a main memory 102, graphics controller 103, mass storage device 105, keyboard controller 106, keyboard 108, printer 109 and display monitor 110, all of which are coupled to bus 107. CPU 101 handles most of the control and data processing. Main memory 102 provides a convenient method of storing data for quick retrieval by CPU 101. Graphics controller 103 processes image data in pipelined stages. Mass storage device 105 stores data associated with multiple images and applications. Keyboard controller 106 controls keyboard 108, which operates as an input device. Printer 109 prints hard copies of graphical images and display monitor 110 displays graphical images. The components of computer system 100 comprise PCBs that include a scan test interface of the present invention. BUS 107 provides a communication path between components of computer system 100 and includes communication lines comprising a master scan test bus.

In one embodiment of the present invention, scan test interfaces are included on PCB's arranged in a multidrop-configuration system (e.g., a computer system). The multi-drop system of the present invention facilitates the movement of scan test control to a scan test system controller rather than being located at a central workstation and distributed to each module via a separate cable and separate PCB plugged into each module. The multi-drop configuration also greatly reduces the number of signals and wires that are routed from the scan test system controller to each scannable PCB slot in a module. As such, a multi-drop configuration doesn't impose the same wiring limits as a star configuration does with respect to the number of PCBs that can be scanned in an individual module. In one example implementation of the present invention, the system or upstream side of a scan test interface comprises from the PCB slot back to a system controller and the PCB or downstream side of the scan test interface includes from the scan test interface to devices on a board the scan test interface services. One embodiment of the present invention scan test interface 10 includes a scan interface chip (SIC).

Figure 3:
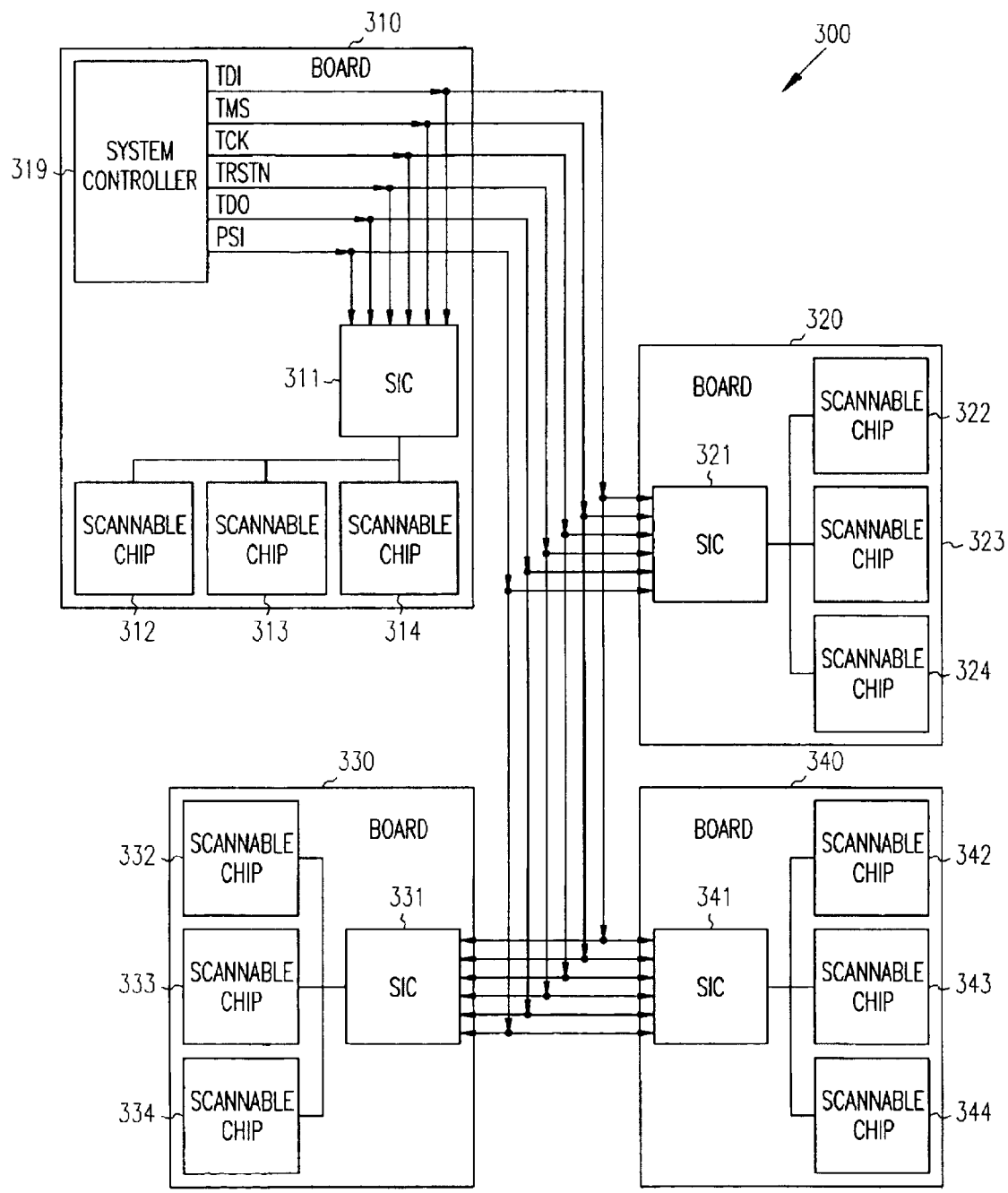
FIG. 3 is a block diagram illustration of a multi-drop SIC scan test system embodiment of the present invention.

FIG. 3 is a block diagram illustration of a multi-drop SIC scan test system 300, one embodiment of the present invention. Multi-drop SIC scan test system 300 comprises printed circuit boards 310, 320, 330 and 340. Printed circuit board 310 comprises scan test system controller 319, SIC 311, and downstream scannable chips 312 through 314. Printed circuit board 320 comprises SIC 321 and downstream scannable chips 322 through 324. Printed circuit board 330 comprises SIC 331 and downstream scannable chips 332 through 334. Printed circuit board 340 comprises SIC 341 and downstream scannable chips 342 through 344. Printed circuit board 310 is coupled to printed circuit boards 320, 330 and 340. System controller 319 is coupled to SIC 341, SIC 331, SIC 321 and SIC 311 which is coupled to downstream scannable chips 312 through 314. SIC 321 is coupled to downstream scannable chips 322 through 324. SIC 331 is coupled to downstream scannable chips 332 through 334. SIC 341 is coupled to downstream scannable chips 342 through 344.

The components of multi-drop SIC scan test system 300 cooperatively operate to facilitate scan testing on a system level. In one embodiment of the present invention, multi-drop SIC scan test system 300 utilizes a multi-drop configuration in which scan test signals are communicated to and from scan test system controller 319 on a single set of communication lines (e.g., a scan test master bus) that feed drops to each SIC. System controller 319 transmits and receives scan test signals to and from each SIC component in multi-drop scan test system 300 (e.g., SIC 311, 321, 331, and 334). For example, scan test system controller 319 transmits a test data in (TDI) signal, a test mode select (TMS) signal, a test clock (TCK) signal, and a test reset negative asserted (TRSTN) signal to each SIC in multi-drop SIC scan test system 300 and receives a test data out (TDO) signal from each SIC in multi-drop SIC scan test system 300. System controller 319 also transmits a program scan interface (PSI) signal to each SIC in multi-drop SIC scan test system 300. SICs 311, 321, 331 and 341 handle interfacing of scan test information to and from devices the respective SICs service. For example, SIC 311 handles transmission and reception of scan test information between scan test system controller 319 and scannable chips 312 through 314.

A multi-drop SIC scan test system of the present invention is flexibly adaptable to numerous embodiments. For example, the number of scan test chains supported by different embodiments of individual SICs vary. In another situation in which a board has more scan test chains, NIC interfaces or general purpose I/O signals than a single SIC accommodates, multiple SICs are included on a single board. In one example in which multiple SICs are included on a single PCB, the interface to the scan test system controller is a cascading configuration. In another embodiment of the present invention, multiple SICs are included on a PCB in a multi-drop configuration. In one embodiment of the present invention, the scan test system controller resides on a PCB that is also scannable and a SIC is used to interface between the scan test system controller and the scannable chips on the PCB (e.g., SIC 311).

Figure 4A:
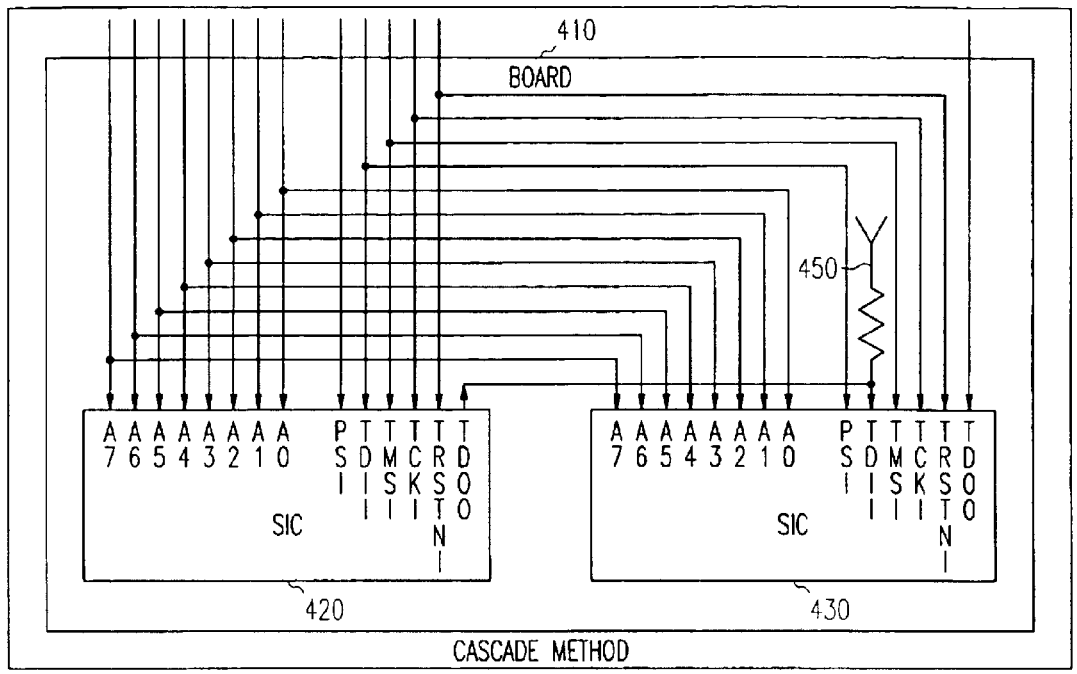
FIG. 4A is a block diagram illustrating one embodiment of cascade connections between multiple SICs included on the same PCB.

FIG. 4A is a block diagram illustrating one embodiment of cascade connections between SIC 420 and SIC 430 included on PCB 410. Address lines A0 through A7 on SIC 420 are coupled in parallel to corresponding address lines A0 through A7 on SIC 430. The address interface of the SIC 420 and SIC 430 on PCB 410 are programmed to the same address. The test reset input (TRSTNI) port, test clock input (TCKI) port and test mode select input (TMSI) port of SIC 420 are coupled to corresponding TRSTNI, TCKI and TMSI ports of SIC 430. Thus TMS, TCK, TRSTN and PSI signals from the scan test system controller are coupled to the inputs of SIC 420 and 430 in parallel. A TDI signal from the scan test system controller is coupled to the test data in input (TDII) port of SIC 420 and the test data out output (TDOO) port of SIC 420 is coupled to the TDII port of SIC 430. The TDOO port of SIC 430 is coupled to the TDO scan test bus master line. In another embodiment, a TDOO port from a first SIC (e.g., SIC 420) and subsequent SIC's (not shown) except a last SIC (e.g., SIC 430) are connected to TDII port of a proceeding SIC. In one embodiment of the present invention, the signals between the TDOI port of one SIC to the TDII port of another SIC are pulled up (e.g., to 3.3 volts with a 330 ohm resistor 450). The address ports (e.g., A0 port through A7 port) of SIC 480 are coupled to the corresponding address ports of SIC 490.

Figure 4B:
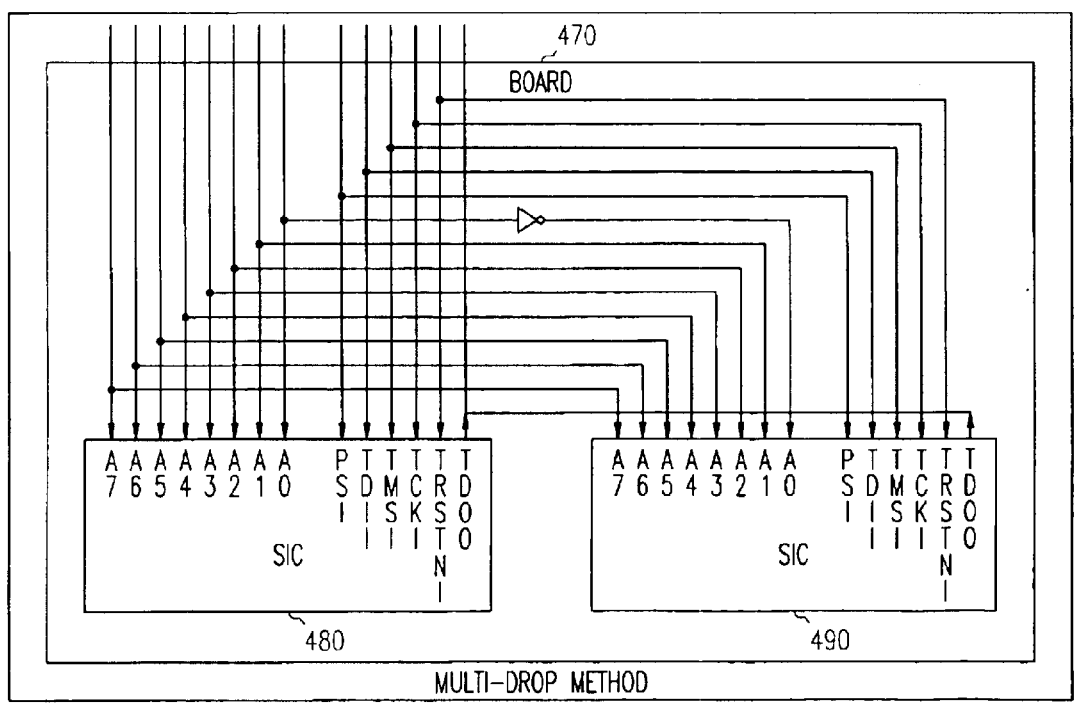
FIG. 4B is a block diagram illustration of one embodiment of multi-drop connections multiple SICs included on the same PCB.

FIG. 4B is a block diagram illustration of one embodiment of multi-drop connections between SIC 480 and SIC 490 included on a single PCB 470. This multi-drop configuration is also applicable in a situation in which a board includes multiple SICs. The test reset negative asserted input (TRSTNI) port, test clock input (TCKI) port, program scan interface (PSI) port, test data in input (TDDII) port, test data out output (TDOO) port and test mode select input (TMSI) port of SIC 480 are coupled to corresponding TRSTNI, TCKI, TDII and TDOO and TMSI ports of SIC 490. Thus TMS, TCK, TRSTN, TDI, TDO and PSI signals from the scan test system controller are coupled to the inputs of SIC 480 and 490 in parallel. The first address port of SIC 480 is coupled to the input of address bit inverter 485 and the first address port of SIC 490 is coupled to the output of address bit inverter 485. The other address ports (e.g., address ports for signals A1 through A7) of SIC 480 are coupled to the corresponding address ports of SIC 490.

One propose of a SIC on each scannable PCB is to act as addressable interface which the system controller enables individually in order to perform scan test operations on one board at a time. In one embodiment of the present invention, SICs that are not enabled do not enable their TDO output (TDOO) port during normal scan test operations and thus do not interfere with the TDOO of the enabled SIC. One embodiment of the present invention includes a special broadcast address that triggers enablement of all the SICs on the multi-drop bus simultaneously, but the SICs do not drive their TDOO port.

Figure 5:
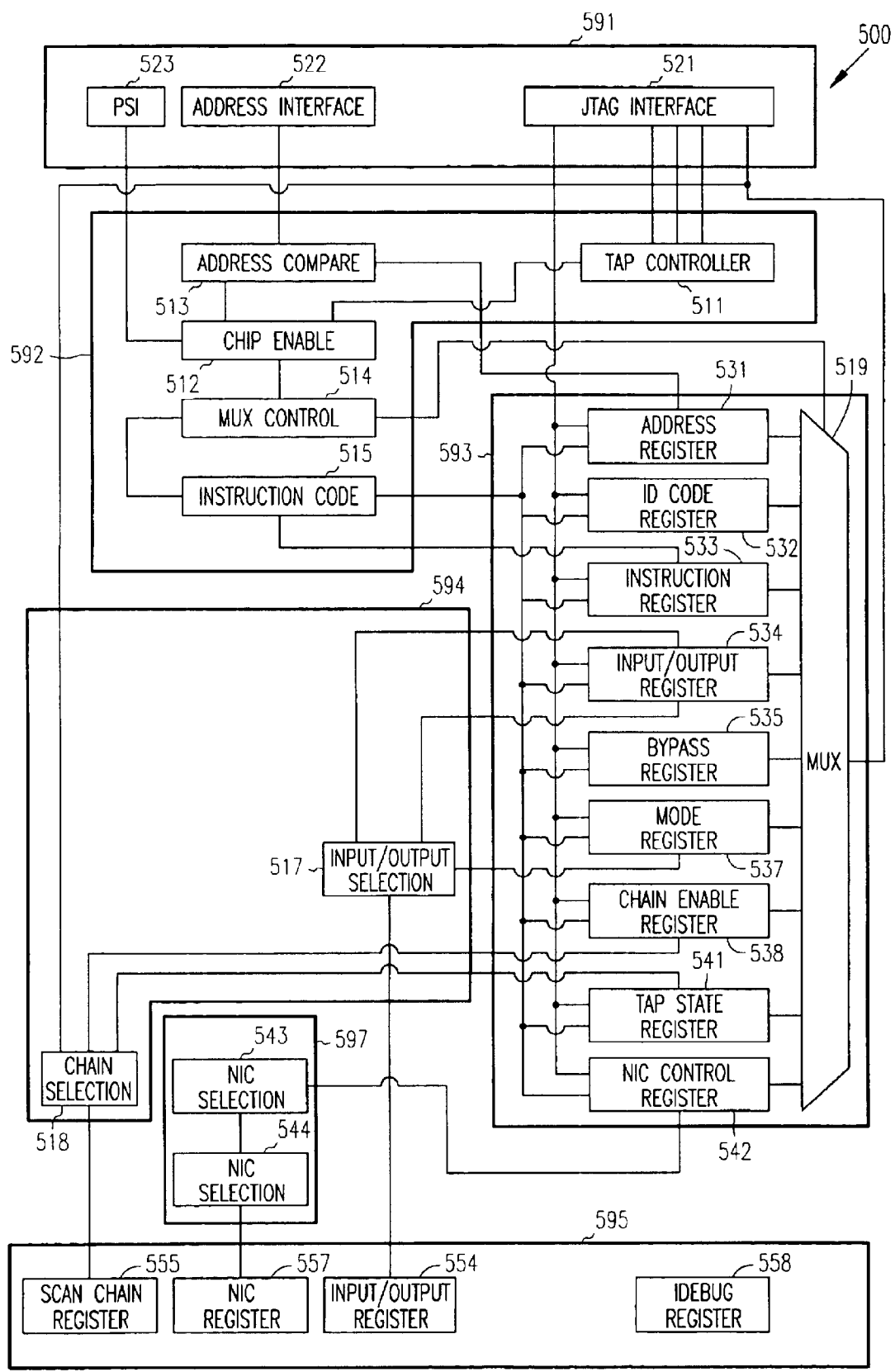
FIG. 5 is a block diagram illustration of a SIC embodiment of the present invention.

FIG. 5 is a block diagram illustration of SIC 500, one embodiment of scan test interface 10. SIC 500 comprises system interface 591, scan test interface controller 592, scan test interface register 593, a selection circuit 594, NIC circuit 597 and board interface 595. System interface 591 comprises system JTAG interface 521, address interface 522, and program scan interface (PSI) 523. Scan test interface controller 592 comprises test access port (TAP) controller 511, chip enable circuit 512, address compare circuit 513, multiplexer (MUX) control circuit 514, and instruction decode circuit 515. Selection circuit 594 comprises Input/Output (I/O) selection circuit 517 and chain selection circuit 518. Scan test interface register 593 comprises register output MUX 519, address register 531, IDcode register 532, instruction register 533, Input/Output (I/O) register 534, bypass register 535, mode register 537, scan enable register 538, TAP state register 541, and number in can (NIC) control register 542. NIC circuit 597 comprises NIC sequence circuit 543 and NIC selection circuit 544. Board interface 595 comprises Input/Output (I/O) interface 554, scan test chain interface 555 and NIC interface 557.

The components of SIC 500 are communicatively coupled to facilitate scan testing operations. For example, scan test interface register 593 is coupled to the scan test interface controller 592, system interface 591, selection circuit 594, board interface 595, and NIC circuit 597. Test access port (TAP) controller 511 is coupled to chip enable circuit 512, chain selection circuit 518, system JTAG interface 521, Input/Output (I/O) interface 554, scan test chain interface 555, address register 531, IDcode register 532, instruction register 533, Input/Output (I/O) register 534, bypass register 535, mode register 537, TAP state register 541, and number in can (NIC) control register 542. Chip enable circuit 512 is coupled to program scan interface (PSI) 523, multiplexer (MUX) control circuit 514, and address compare circuit 513, which is coupled to address interface 522. Instruction register 533 is coupled to instruction decode circuit 515. Input/Output (I/O) register 534 is coupled to Input/Output (I/O) selection circuit 517. Input/Output (I/O) selection circuit 517 is coupled to Input/Output interface 554. Chain selection circuit 518 is coupled to scan test chain interface 555. NIC control register 542 is coupled to NIC sequence circuit 543 which is coupled to NIC selection circuit 544, which in turn is coupled to NIC interface circuit 557. Register output MUX 519 is coupled to address register 531, IDcode register 532, instruction register 533, Input/Output (I/O) register 534, bypass register 535, mode register 537, chain enable register 538, TAP state register 541, number in can (NIC) control register 542 and system JTAG interface 521.

The components of SIC 500 cooperatively operate as a scan interface between downstream scan test devices (e.g., board devices) and upstream scan test devices (e.g., a scan test system controller). The system interface 591 provides a communication port to transmit test operation information between SIC 500 and a system controller (e.g., a JTAG bus master included in a scan test system controller not shown). Scan test interface register 593 stores information related to scan test operations. Scan test interface controller 592 directs operations of scan test interface register 593. Board interface 595 provides a communication port to transmit test operation information between a device included on a PCB and SIC 500. Selection circuit 594 facilitates selection of a scan test chain port set included in board interface 595. NIC circuit 597 facilitates retrieval of information associated with components included on a board SIC 500 services.

System Interface

Figure 6:
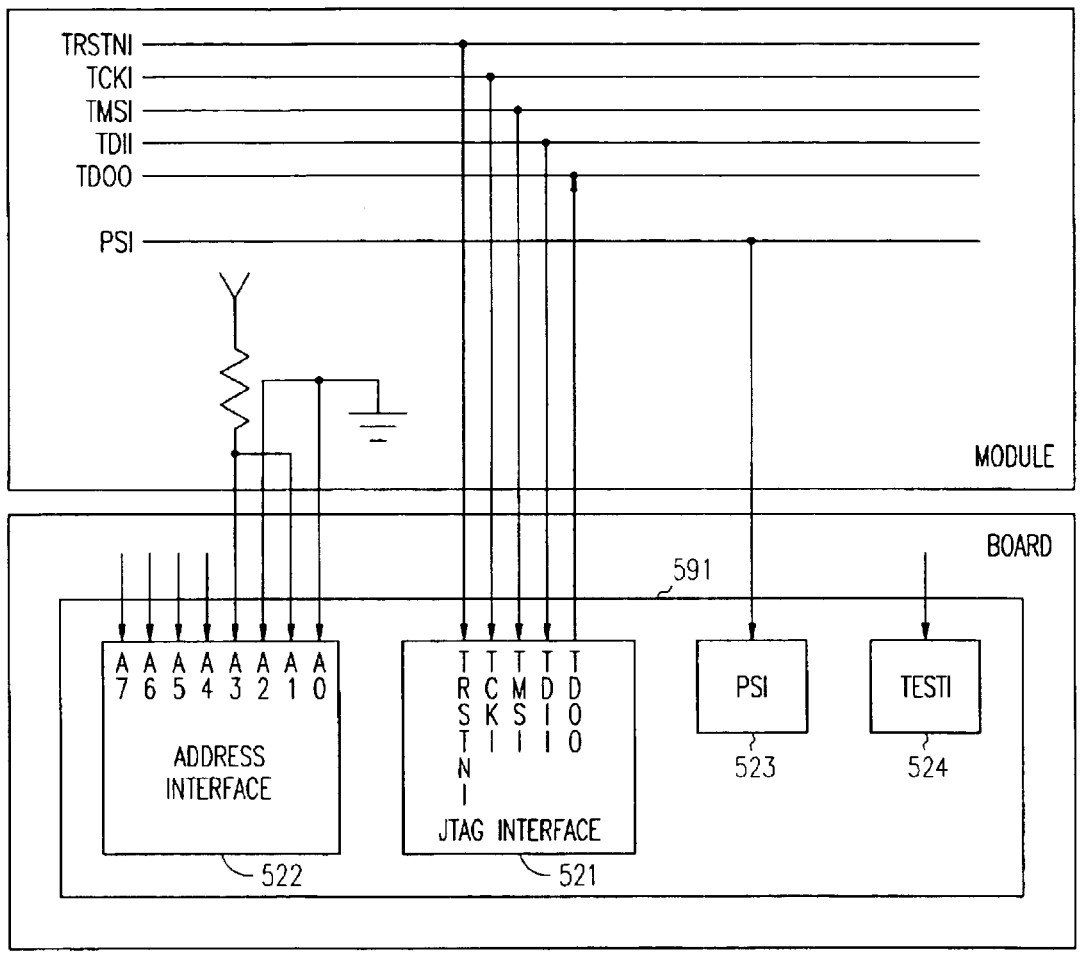
FIG. 6 is a block diagram illustrating one embodiment of a system interface included in a SIC.

FIG. 6 is a block diagram illustrating one embodiment of system interface 591 included in SIC 500. System interface 591 comprises address interface 522, system JTAG interface 521, PSI interface 523. In one embodiment, system interface 591 also includes test input (TESTI) port 524. System JTAG interface 521 provides a communication port for standard JTAG interface signals. Address interface 522 provides a communication port for slot identification signals. Program scan interface (PSI) 523 provides a communication port for a PSI signal that puts a SIC in a mode that permits the SIC to be programmed. Signals communicated via TESTI port 524 control whether the SIC is in functional mode or test mode.

System JTAG Interface

In one embodiment of the present invention, system JTAG interface 521 comprises five communication ports (e.g., pins) and each of the communication ports communicate one of five standard JTAG signals. For example, JTAG interface 521 includes a TRSTNI port, a TCKI port, a TMSI port, a TDII port and a TDOO port that communicate a TRSTN, TCK, TMS, TDI, and TDO signals respectively. The TDI, TMS, TCK, TRST and TDO signals function in accordance with IEEE 1149.1 standard guidelines. In one embodiment of system JTAG interface 521, the input signals are distributed to enabled chains on board interface 595.

In one embodiment of system JTAG interface 521, the input ports (e.g., a TRSTNI port, a TCKI port, a TMSI port, a TDII port) comprise low voltage (e.g., 3.3 volts) TTL circuits that tolerate a voltage swing (e.g., from 0 to 5.5 volts) without damage to the part. In one exemplary embodiment of system JTAG interface 521, the logic switching level is 2.0 (Vih) volts and the input ports operate properly in lower voltage applications. In one embodiment of the present invention, the TDOO port can either operate as an pseudo open-collector (OC) output or as a tri-state (TS) output depending on a mode control. In one embodiment of a pseudo OC mode of the present invention, a voltage level necessary to pull the TDOO signal to a logical 1 (high) value corresponds to a system controller TDOI signal and the system utilizes an appropriate pull up resistance (e.g., included on the system controller PCB) to achieve the desired (e.g., a corresponding) voltage level. In one embodiment of the present invention there is one SIC in a system enabled to drive its TDOO at any particular time in pseudo OC mode and the TDOO port is able to sink enough current to overcome the effects of a pull up resistor at a scan test system controller.

PSI Interface

Program scan interface (PSI) 523 provides a communication port for a PSI signal. The PSI signal is an input to the SIC and puts the SIC into a mode allowing it to be programmed. In one embodiment of the present invention, the PSI signal is similar to the JTAG input signals and PSI 523 includes low voltage (e.g., 3.3 volts) TTL circuits that tolerate a voltage swing (e.g., from 0 to 5.5 volts) without damage to the part. In one example of SIC 500, the logic switching level is 2.0 (Vih) volts and the PSI port operates properly in lower voltage applications. In one embodiment of the present invention, assertion of the PSI signal (high) will synchronously reset a chip enable flip-flop on the enabled SIC (or all of the SICs in the case of broadcast operations). Asserting the PSI signal causes the TDO ports of enabled SICs to stop driving and it synchronously enables the TAP controllers on the SICs simultaneously.

Address Interface

Address interface 522 comprises address communication ports that provide a communication path for address signals that identify a selected SIC (e.g., a PCB slot address) in the scan test system. In one embodiment of system interface 591, some address communication ports are coupled to ground (pulled down) and some address communication ports are coupled to a pull up resister (pulled up). In one embodiment of the present invention, the address interface signals are static signals that are pulled up or pulled down on the system side of a scannable slot and the pulled up and pulled down address interface signals uniquely identify scannable slots in a module. In one example, address interface 510 accommodates eight address input signals A0 through A7 and the address interface ports include low voltage TTL circuits. In one embodiment of the present invention, the address interface ports (e.g., pins) that are not utilized (e.g., not connected) are internally pulled down inside the SIC so that the input value will be a logical 0. In one embodiment of the present invention, even though there are eight address bits there are only 254 logical addresses available (e.g., 253:0). In one embodiment of SIC 500, address 254 (0xFE) is the broadcast address and address 255 (0xFF) is used to put outputs in a tri-state condition. In one example of the present invention, the address of the board that includes the system controller (not shown) is zero by convention and the SIC address interface bits are pulled down.

Board Interface

Figure 7:
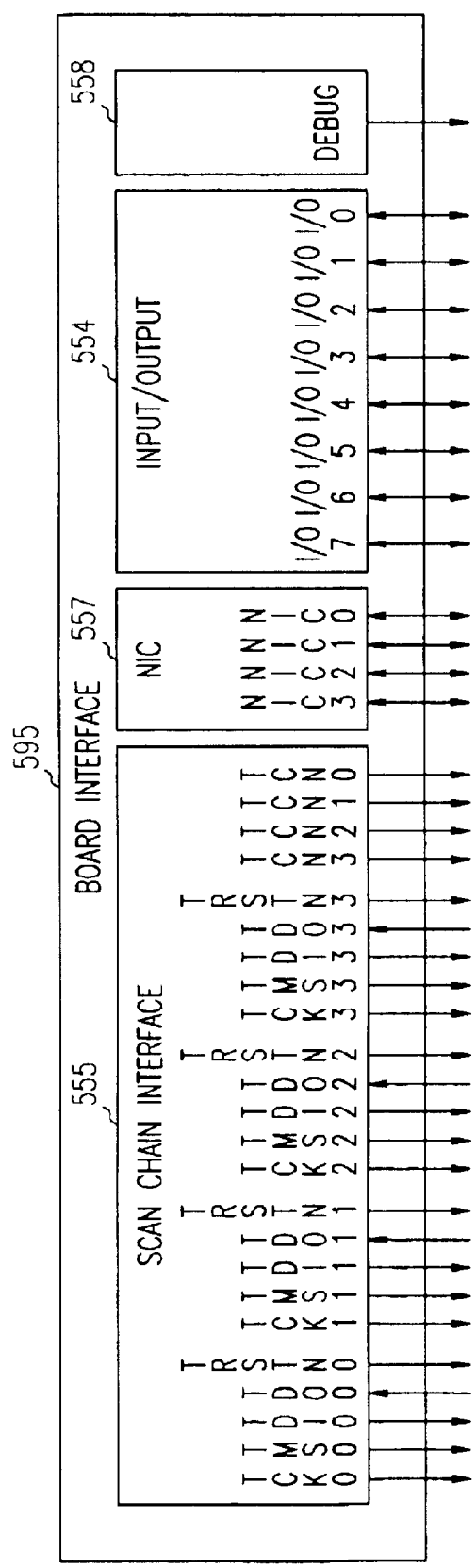
FIG. 7 is a block diagram of one embodiment of a board interface included in a SIC.

FIG. 7 is a block diagram of one embodiment of board interface 595. Board interface 595 comprises Input/Output (I/O) interface 554, scan test chain interface 555 and NIC interface 557. In one embodiment of the present invention board interface 595 also includes debug port 558. The scan test chain communication ports of board interface 595 provide communication paths between the SIC and the devices the SIC services. Input/Output interface 554 provides a bidirectional communication port for board input signals and board output signals. NIC interface 557 provides a communication port for NIC signals. Debug port 558 provides a communication path for a debug signal. Scan test chain interface 555 provides multiple communication ports for a plurality of standard JTAG signal sets. One embodiment of board interface 595 includes a set of scan test chain communication ports for each scan test chain the SIC services.

Scan Test Chain Interface

One embodiment of scan test chain interface 555 comprises four sets of scan test chain ports. Each set of scan test chain ports includes a TDIO port, a TDOI port, a TMS0 port, a TCK0 port and a TRSTN0 port. The first set of scan test chain ports provide communication ports for signals associated with a first scan test chain, including signals TDI0, TDO0, TMS0, TCK0, and TRSTN0. The second set of scan test chain ports provide communication ports for signals associated with a second scan test chain, including signals TDI1, TDO1, TMS1, TCK1, and TRSTN1. The third set of scan test chain ports provide communication ports for signals associated with a third scan test chain, including signals TDI2, TDO2, TMS2, TCK2, and TRSTN2. The forth set of scan test chain ports provide communication ports for signals associated with a forth scan test chain, including signals TDI3, TDO3, TMS3, TCK3, and TRSTN3. In one embodiment of the present invention, the signals TDI0 through TDI3, TMS0 through TMS3 and TCK0 through TCK3 function in accordance with IEEE 1149.1 standard guidelines and are active high outputs from SIC 500. In one embodiment of the present invention, if one or more chains are enabled to participate in a scan test operation (e.g., as defined by the corresponding bits in chain enable register 538) then TDI0 through TDI3, TMS0 through TMS3 and TCK0 through TCK3 signals are respective buffered logical copies of the TDI, TMS and TCK input signals received by SIC 500 (e.g., received via a TDII port, a TMSI port, and a TCKI port included in JTAG interface 521).

In one embodiment of the present invention, TDI0 through TDI3 are not buffered logical copies of the TDI signal received via a TDII port included in JTAG interface 521. In one embodiment of the present invention a buffered copy of a TDI signal is one that is not clocked (e.g., does not go through a register). In one embodiment of the present invention, the TDI signal is "daisy chained" through different sets of downstream circuits (e.g., the circuits of a scan test chain). The TDI returned by one set of downstream circuits (e.g., a first scan test chain) and fed into a second set of downstream circuits (e.g., a second scan test chain) port is not necessarily a buffered copy of the input to the first set of down stream circuits. For example, a TDI signal forwarded from a SIC to a first scan test chain is a buffered logical copy of the TDI signal received by the SIC from a system controller. However, after flowing though the circuits of the first scan test chain and back to the SIC, if the TDI is forwarded to a second scan test chain it is not necessarily a buffered logical copy of the original TDI received by the SIC if the TDI signal is clocked in the first scan test chain (e.g., the first scan test chain includes a register).

In one example of the present invention operating under mode control, TDIO ports, TMSO ports, and TCKO ports included in scan test chain interface 555 behave as pseudo open-collector outputs and in another example they behave as tri-state outputs. When enabled as pseudo OC outputs, a board is able to pull TDIO ports, TMSO ports, and TCKO ports up to the appropriate voltage level for the chain (e.g., the same voltage as the operating voltage of the scannable devices coupled to the scan test chain). In one embodiment of the present invention, the different voltage partitions and clock domains of the circuits included on the board correspond to different scan test chains and the assignment of scannable chips on a board to a scan test chain. In one exemplary embodiment of the present invention, scannable chips of the same voltage domain and clock domain are assigned to a scan test chain.

In one embodiment of the present invention, signals TRSTN0 through TRSTN3 function in accordance with IEEE 1149.1 standard guidelines and are active low outputs from SIC 500 to board components. If one or more scan test chains are enabled to participate in a scan operation (e.g., defined by the corresponding bits in chain enable register 538) the signals are copies of the TRSTN signal received by SIC 500 via a TRSTNI port of JTAG interface 521. In one example operating under mode control, TRSTNO ports of scan test chain interface 555 behave as pseudo open-collector outputs and in another example they behave as tri-state outputs. When enabled as pseudo OC outputs, a board is able to pull the TRSTNO signals up to the appropriate voltage level for the chain (e.g., the same voltage as the operating voltage of the scannable devices coupled to the scan test chain).

In one embodiment of the present invention, signals TDO0 through TDO3 function in accordance with IEEE 1149.1 standard guidelines. The TDO0 through TDO3 signals are inputs to SIC 500 from components included on a PCB SIC 500 services. In one embodiment of the present invention, the TDOI ports include low voltage (e.g., 3.3 volts) TTL circuits. In one exemplary embodiment the logic switching level is 2.0 (Vih) volts and the TDOI ports operate properly in lower voltage applications.

In one embodiment of scan test chain interface 555, each set of scan test chain communication ports also include a Test Chain Enable Not Output (TCENO) port. The TCENO ports provide a communication port for special scan test support signals. In one exemplary embodiment of the present invention, signals TCEN0 through TCEN3 are active low outputs from SIC 500 and are included as compliance facilitating signals for scannable devices (not shown) or scan test enable facilitating signals for scan devices that require external stimulus to enable their scan functions. In one embodiment of the present invention, the TCENO signals are inverted copies of the corresponding bit in the chain enable register.

In one example of a SIC operating under mode control, the TCENO ports behave as pseudo open-collector outputs and in another example they behave as tri-state outputs. When enabled as a pseudo OC output a TCENO port is pulled up to the appropriate voltage level depending upon the board design and scan test chain coupled to the TCENO port. Additionally, the TCENO ports drive their output, to a particular logical value (e.g., logic 0 or low) value when the corresponding bit in chain enable register 538 is set.

NIC Interface

In one embodiment of the present invention, NIC Interface 557 comprises NICI/O ports (e.g., four bidirectional data signal pins) that provide a communication interface for NIC signals. For example NIC0 through NIC3 signals are used to read the contents of the NIC devices attached to a first through a forth scan test chain respectively. NIC interface 557 allows scan test software to identify information associated with scannable hardware (e.g., the contents of a NIC device, the board type, revision level, the part number, design level and serial number) coupled to a board included in a module. In one embodiment of the present invention, the identified information allows scan test software to configure itself based upon information about scan topology for a corresponding piece of hardware (e.g., previously stored or downloaded information). In one embodiment of the present invention hardware components installed in a module are identified without booting up the operating system.

In one embodiment of the present invention, programming action for the NIC information requires delivery of relatively high voltage (e.g., 12 volt) logic levels for certain periods of time (e.g., 500 microseconds). Precautions are taken to protect the NICI/O ports (e.g., pins) from damage during this process. For example, an additional current limiting resister is utilized on the board to protect SIC 500 during the NIC programming sequence.

Input/Output Interface

Input/Output interface 554 provides a bidirectional communication port for board input signals and board output signals. In one embodiment of the present invention, Input/Output (I/O) interface 554 comprises eight communication ports (e.g., eight general purpose bi-directional Input/Output signal pins) including I/O ports I/O0 through I/O7. In one embodiment of the present invention each I/O port (e.g., pin) is individually programmed, via a mode register bit (e.g., mode register 537 bits 15:8) to be either an Input or an Output. In another embodiment of the present invention they are used as true bi-directional pins through programming sequences in which mode register bits are switched off and on at appropriate times. If programmed as outputs, in one embodiment of the present invention the I/O ports are defined as pseudo open-collector outputs and the board design pulls the signals up to a desired (e.g., corresponding) output voltage level. If defined as inputs, the I/O ports include low voltage TTL (3.3 volts) circuits. The logic switching level is 2.0 (Vih) volts and operate properly in lower voltage applications.

In one embodiment of the present invention, the board design uses one or more of I/O ports I/O0 through I/O7 as inputs and the SIC scan test software connects them up to non open-collector type output devices. The I/O ports are not enabled as an output thereby avoiding damage to the SIC, the other device or both. To help prevent damage, in one embodiment of the present invention the SIC powers up and resets I/O ports defined as inputs. In one example implementation, the SIC scan test software does not reset the SIC if any of these I/O ports are defined as outputs and are used to control critical functions of the design (e.g., power control).

Debug Interface

In one embodiment of the present invention, debug interface 558 comprises a communication port (e.g., a pin) which communicates a DEBUG signal (e.g., one of the internal chip signals of the chip). In one embodiment of the present invention, a debug selection of zero disables the debug output interface. The selection is accomplished via designated mode register bits (e.g., mode register 537 bits 7:3). In one embodiment of the present invention a non-zero value is shifted into the designated bits of the mode register and an internal signal is selected to be forwarded via a debug output port.

SIC Controller

Scan test interface controller 592 controls the basic core scan test functions of SIC 500 (e.g., interfacing JTAG signals between a system controller and scannable devices). In one embodiment of the present invention scan test interface controller 592 comprises test access port (TAP) controller 511, chip enable circuit 512, address compare circuit 513, multiplexer (MUX) control circuit 514, and instruction decode circuit 515. Scan test interface controller 592 directs interfacing operations in response to scan test signals received via system interface 591.

Figure 8:
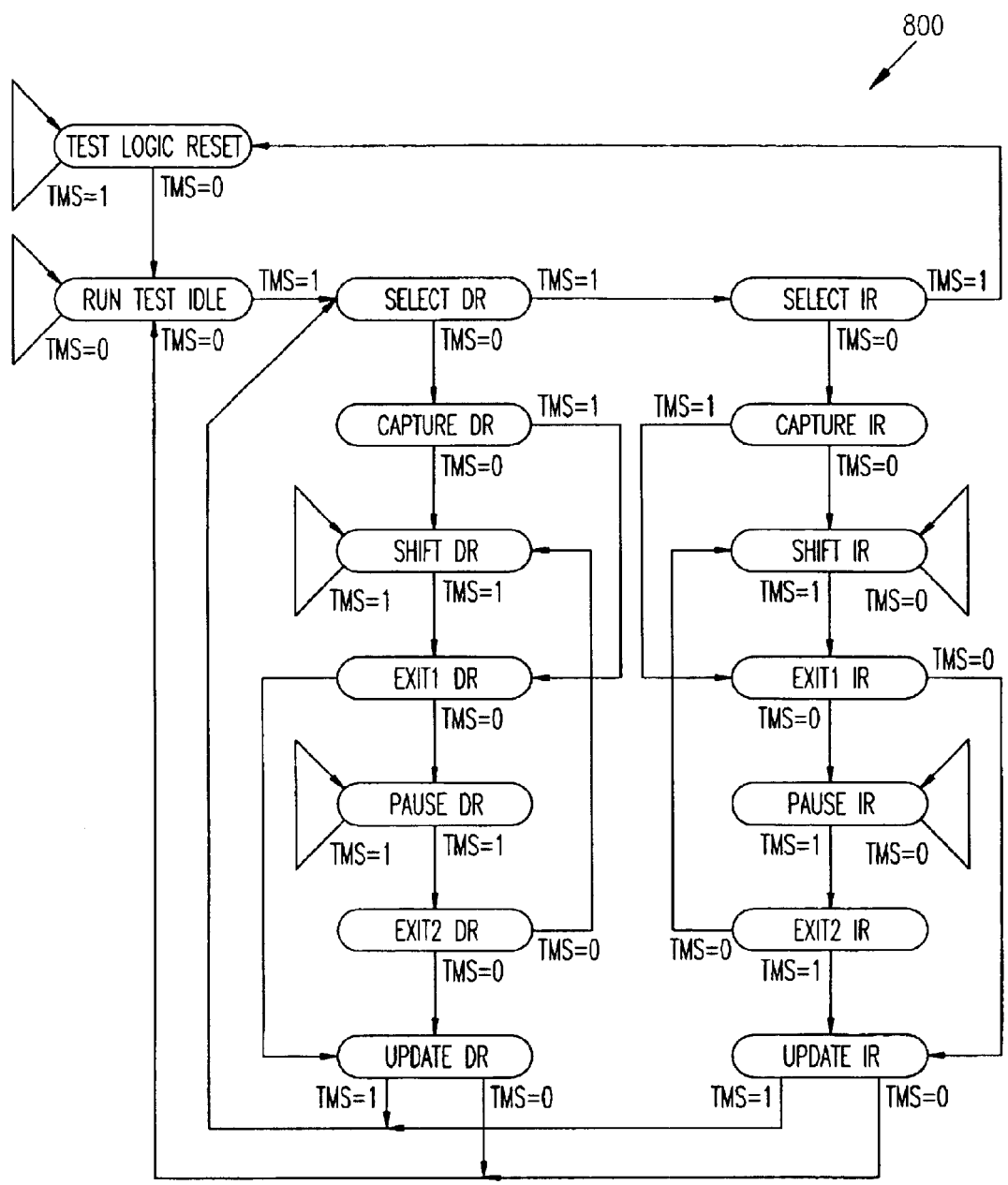
FIG. 8 is a schematic state diagram representation of one embodiment of sixteen states of a TAP controller of the present invention.

In one embodiment of the present invention, TAP controller 511 is an IEEE 1149.1 compliant fully decoded state machine that controls scan test operations in response to directions provided via system JTAG interface 521. FIG. 8 is a schematic state diagram representation of one embodiment of sixteen states of TAP controller 511. However, when the PSI signal is active or asserted (indicating programming mode), the TDOO port of system JTAG interface 521 does not drive when the TAP state is in either the SHIFT_IR or the SHIFT_DR state unless chip enable is set (asserted). In one embodiment of the present invention including broadcast operations, the TDOO port does not drive when chip enable is set. In one embodiment of the present invention, TAP controller 511 samples the TMS input on the rising edge of TCK and changes its state on the falling edge of TCK.

Reset Circuit

In one embodiment of the present invention, SIC 500 includes both partial and full reset features and supports three reset "triggers". In one embodiment of the present invention a power up or a TRSTN signal assertion triggers a full reset. For example, one embodiment of TAP controller 511 "powers up" in the TEST_LOGIC_RESET state in accordance with IEEE 1149.1 specification and the registers in a SIC (e.g., scan test interface register 14) are reset. In one embodiment of the present invention, a TRSTN signal resets the TAP controller (e.g., "moves" the TAP controller to the TEST_LOGIC_RESET state) and the registers in a SIC while a PSI signal is asserted. In one embodiment, a partial reset occurs during which TAP controller 511 is "reset" and asynchronously put in the TEST_LOGIC_RESET state.

In one embodiment of the present invention, TAP controller 511 is asynchronously put in the TEST_LOGIC_RESET state by issuing 5 TCK cycles with the TMS signal asserted (e.g., high). However, in one embodiment of present invention, the SIC registers (other than the TAP controller) are not reset by issuing 5 TCKs with the TMS signal asserted. For example, the IDCODE instruction is not forced into instruction register 533, if the IDCODE function is implemented, or a BYPASS instruction if IDCODE is not implemented. In one embodiment of a SIC, all three of the reset triggers types are used by various blocks in the core logic. In one embodiment of the present invention the TRSTN input signal has an effect when the PSI signal is asserted (e.g., high). In one embodiment of the present invention, a SIC reset circuit is utilized to initiate a full reset operation in which the registers and the TAP controller are reset.

Figure 9:
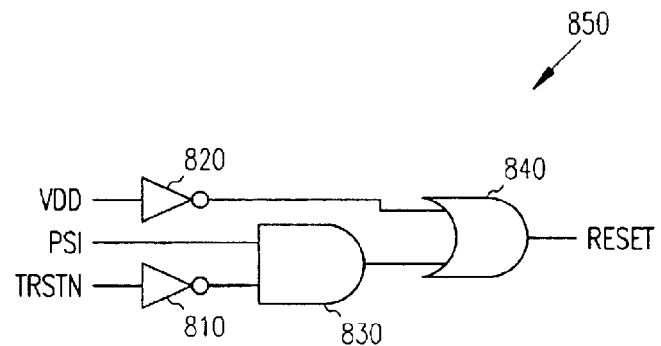
FIG. 9 is a schematic of one embodiment of a SIC reset circuit of the present invention.

FIG. 9 is a block diagram of one embodiment of a SIC reset circuit 850 of the present invention. In one embodiment of the present invention, reset circuit 850 comprises a voltage inverter 820, a reset inverter 810, a reset AND gate 830 and a reset OR gate 840. Reset OR gate 840 is coupled to reset inverter 820 and reset AND gate 830 which is coupled to reset inverter 810. Reset OR gate 840 asserts a RESET signal when the output of voltage inverter 820 is a logical 1 value (e.g., high) or the output of reset AND gate 830 is a logical 1 value. The output of voltage inverter 820 causes a RESET signal to assert whenever the power is turned on and the TAP controller and a SIC register is reset during "power up". The output of reset AND gate 830 is a logical 1 value and a RESET signal is asserted when a PSI signal is asserted and a TRSTN signal is asserted. Again the RESET signal resets the TAP controller and a SIC register. In one embodiment of the present invention, the TEST_LOGIC_RESET state of the TAP controller does not impact the RESET signal (e.g., the RESET signal for a SIC register). Thus, issuing 5 TCKs with the TMS signal asserted does reset the TAP controller (e.g., put it in a TEST_LOGIC_RESET state) but does not reset other SIC registers.

In one embodiment of the present invention, a SIC does not include a partial reset feature. The SIC complies with IEEE 1149 and all three triggering events reset the SIC registers and the Tap controller. For example a power up operation, a TRSTN signal and 5 TCKs with the TMS signal asserted reset the SIC registers and the TAP controller.

SIC Register Macro

Scan test interface register 593 tracks scan test information. In one embodiment of the present invention, a bit of a SIC register is implemented in a register bit macro (register cell) that stores or latches a bit. In one embodiment of the present invention a register bit macro comprises a D type flip-flop, with a positive, edge triggered clock, a positive clock enable and a positive asynchronous reset. In one embodiment of the present invention, registers of various lengths are implemented by coupling register bit macros together. In one embodiment of the present invention, the desired number of register cells or register bit macros are coupled together in a cascading fashion. In one embodiment of the present invention, cascading of register cells is accomplished by coupling the Shift Data Out (SDO) output of a preceding bit to the Shift Data In (SDI) input of a subsequent bit. The remaining inputs are coupled to common signals (e.g., a reset signal, a load signal, an update signal, a shift signal, a capture signal, and a clock signal) while the Parallel Data Out (PDO) output communicates the "updated" register bit.

Figure 10:
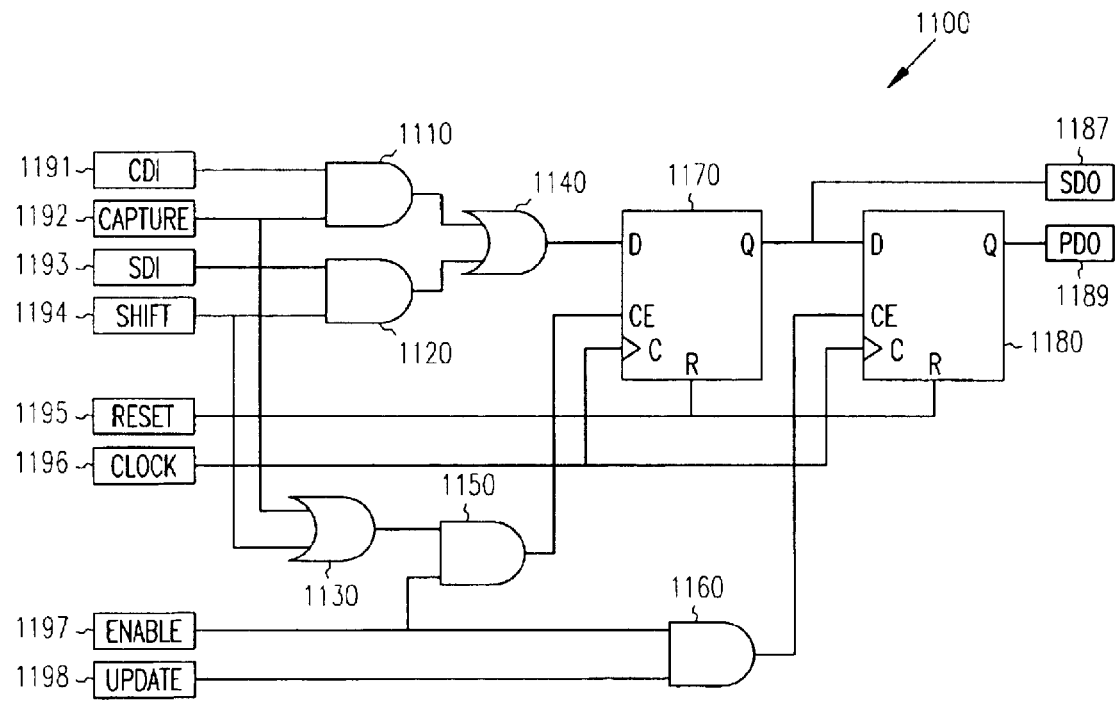
FIG. 10 is a block diagram of one embodiment of a register macro of the present invention.

FIG. 10 is a block diagram of register macro 1100, one embodiment of a register macro of the present invention. Register macro 1100 comprises a register macro first AND gate 1110, a register macro second AND gate 1120, a register macro third AND gate 1150, a register macro fourth AND gate 1160, a register macro first OR gate 1130, a register macro second OR gate 1140, a register macro first flip-flop 1170 and a register macro second flip-flop 1180. Register macro 1100 also comprises several communication ports, including a capture data in (CDI) port 1191, a capture port 1192, a shift data in (SDI) port 1193, a shift port 1194, a reset port 1195, a clock port 1196, an enable port 1197, an update port 1198, a serial data out port 1187 and a parallel data out port 1189.

The components of register macro 1100 are communicatively coupled to facilitate register operations. Register macro second OR gate 1140 is coupled to register macro first AND gate 1110, register macro second AND gate 1120 and register macro first flip-flop 1170 which is coupled to register macro second flip-flop 1180. Register macro first flip-flop 1170 is coupled to register macro third AND gate 1150 which is coupled to register macro first OR gate 1130. Register macro second flip-flop 1180 is coupled to register macro fourth AND gate 1160. Register macro first AND gate 1110 is coupled to CDI port 1191 and capture port 1192 which is also coupled to register macro first OR gate 1130. Register macro second AND gate 1120 is coupled to SDI port 1193 and shift port 1194 which is also coupled to register macro first OR gate 1130. Reset port 1195 and clock port 1196 are coupled to register macro firs t flip-flop 1170 and register macro second flip-flop 1180. Enable port 1197 is coupled to register macro third AND gate 1150 and a register macro fourth AND gate 1160, which is also coupled to update port 1198. Register macro first flip-flop 1170 is coupled to SDO port 1187 and register macro second flip-flop 1180, and PDO port 1189 is coupled to register macro second flip-flop 1180.

The components of register macro 1100 cooperatively function to store a bit. The register macro 1100 is enabled by an ENABLE signal. The stored bit is either shifted into or captured by register macro 1100 in response to a "capture" or "shift" signal from the TAP controller (e.g., TAP controller 511). The shifted in information is stored in register macro first flip-flop 1170 in response to clock (e.g., TCK) transitions and shifted out via SDO port 1187. The bit in register macro first flip-flop 1170 is stored in register macro second flip-flop 1180 in response to an update signal from the TAP controller and transmitted via parallel data out port 1189.

Instruction Register

Instruction register 533 stores a scan test instruction. In one embodiment of the present invention, instruction register 533 includes twelve register bit macros and is enabled during the SHIFT_IR TAP controller state. In one exemplary operation, an instruction register captures a fixed code of 0001 in bit register macros IR03 through IR00 (IR3:0) respectively during the CAPTURE_IR TAP controller state as specified by IEEE 1149.1 specification and shifts it out during the SHIFT_IR TAP controller state. In order to determine the address of the enabled SIC, the state of the address interface bits A7:A0 are captured in instruction register bit macros IR11 through IR04 (IR11:4) during the CAPTURE_IR TAP controller state and shifted out during the SHIFT_IR TAP controller state. During an UPDATE_IR TAP controller state instruction register 533 stores the shifted in instruction and transmits it for decoding of instructions associated with subsequent SHIFT_DR scan operations. In one embodiment of the present invention, bits IR11:4 of instruction register 533 are implemented for the purpose of returning the address of the enabled SIC and bits IR11:4 do not participate in instruction decoding.

Figure 11A:
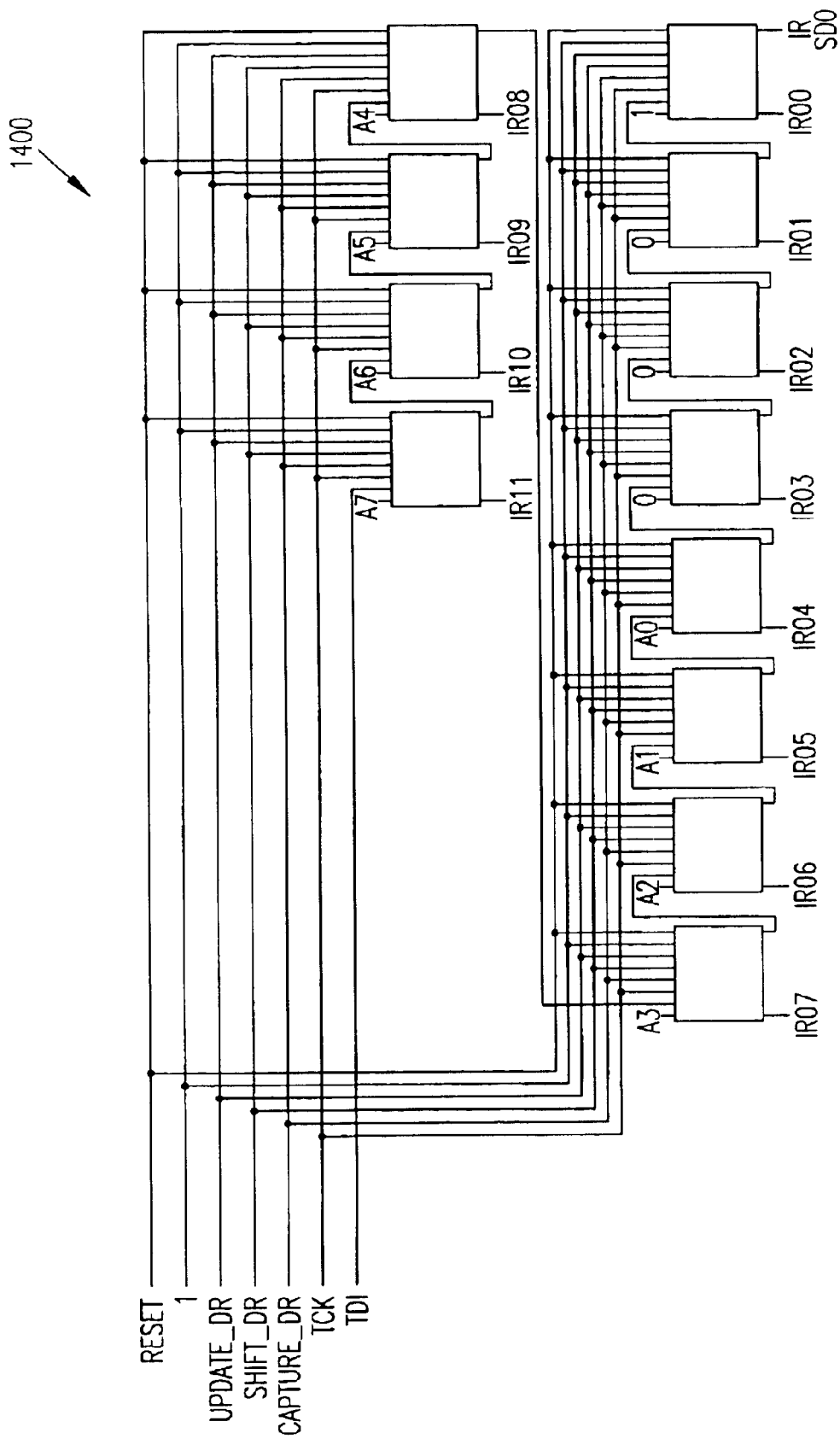
FIG. 11A is a block diagram of one embodiment of an instruction register included in a SIC of the present invention.

FIG. 11A is a block diagram of instruction register 1400, one embodiment of instruction register 533. Instruction register 1400 comprises register bit macros IR00 through IR11. In one embodiment of instruction register 1400, the ports of the register bit macros (e.g., IR00 through IR11) provide communication paths for SIC signals, including the reset port for a RESET signal, the enable port for a static enable signal (e.g., logical value 1 or high), the update port for an UPDATE_IR signal, the shift port for a SHIFT_IR signal, a capture port for a CAPTURE_IR signal and the clock port for a TCK signal. The SDI port of register bit macro IR11 provides a communication path for a TDI signal. The CDI ports of register bit macros IR11 through IR07 are coupled to input signals A7 through A0. In one embodiment of instruction register 1400, input signals A7 through A0 are signals representing the state of the address interface (e.g., address interface 522) bits 7:0. The CDI ports of register bit macros IR03 through IR01 are coupled to a static logical value (e.g., logic value 0 or low) and the CDI port of register bit macro IR00 is also coupled to a static logical value (e.g., logic value 1 or high). The PDO ports of register bit macro IR11 through register bit macro IR00 output an IR11 signal through IR00 signal respectively. The SDO ports of register bit macro IR11 through register bit macro IR01 are coupled to the SDI ports of register bit macro IR10 through register bit macro IR00 respectively. The SDO port of register bit macro IR00 outputs an IR_SDO signal.

Instruction Decode Circuit

Figure 11C:
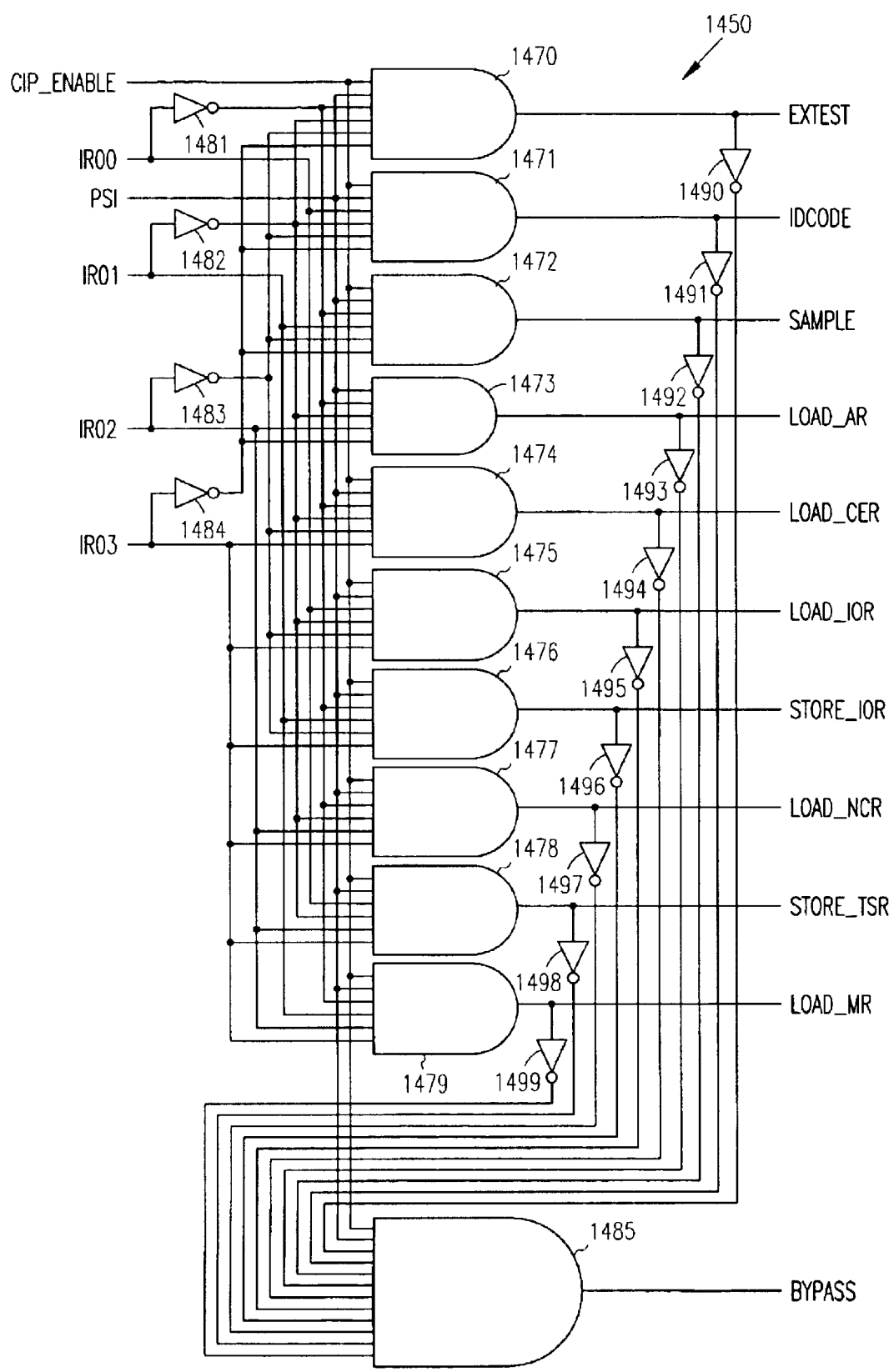
FIG. 11C is a schematic of one embodiment of an instruction decode circuit included in a SIC.

One embodiment of the present invention includes instruction decode logic in an instruction decode circuit that decodes scan test instructions. For example, instruction decode circuit 515 decodes an instruction shifted into instruction register 533. In one example, instruction decode circuit 515 decodes instructions (e.g., IR00 signal through IR03 signal) shifted into and latched in the lower 4 bits (e.g., register bit macros IR03 through IR00) of an instruction register (e.g., instruction register 1400). The instruction opcodes are decoded in a manner that provides one function per each specific opcode. FIG. 11B is a instruction decode table of one embodiment of the present invention. The instruction decode table comprises a column of operation code logical values (opcode) and corresponding decoded instructions FIG. 11C is a schematic decode circuit 1450, one embodiment of instruction decode circuit 515. Instruction decode circuit 1450 comprises address compare input inverters 1481 through 1484, address compare AND gates 1470 through 1479, address compare bypass AND gate 1485, and address compare bypass inverters 1490 through 1499. Signal PSI is coupled to AND gates 1470 through 1479 and AND gate 1485. Signal CHIP_ENABLE is coupled to AND gates 1470 through 1472, AND gates 1474 through 1479, and AND gate 1485. Signal IR00 is coupled to 1471, 1475 and 1478. The inverse of signal IR00 is coupled to 1470, 1472, 1473, 1474, 1476, 1477, and 1479. Signal IR01 is coupled to 1472, 1476, and 1479. The inverse of signal IR01 is coupled to 1470, 1471, 1473, 1474, 1475 1477 and 1478. Signal IR02 is coupled to 1473, 1477, 1478 and 1479. The inverse of signal IR02 is coupled to 1470, 1471, 1472, 1474, 1475 and 1476. Signal IR03 is coupled to 1474 through 1479. The inverse of signal IR03 is coupled to 1470 through 1473. The AND gates of instruction decode circuit 1450 output decode instructions latched in the lower 4 register bit macros (IR3:0) of an instruction register (e.g., instruction register 1400). For example, AND gates 1470 through 1479 output instruction signals EXTEST, IDCODE, SAMPLE, LOAD_AR, LOAD_CER, LOAD_IOR, STORE_IOR, LOAD_NCR, STORE_TSR, and LOAD_MR respectively and AND gate 1485 outputs a BYPASS signal.

Address Register

Figure 12:
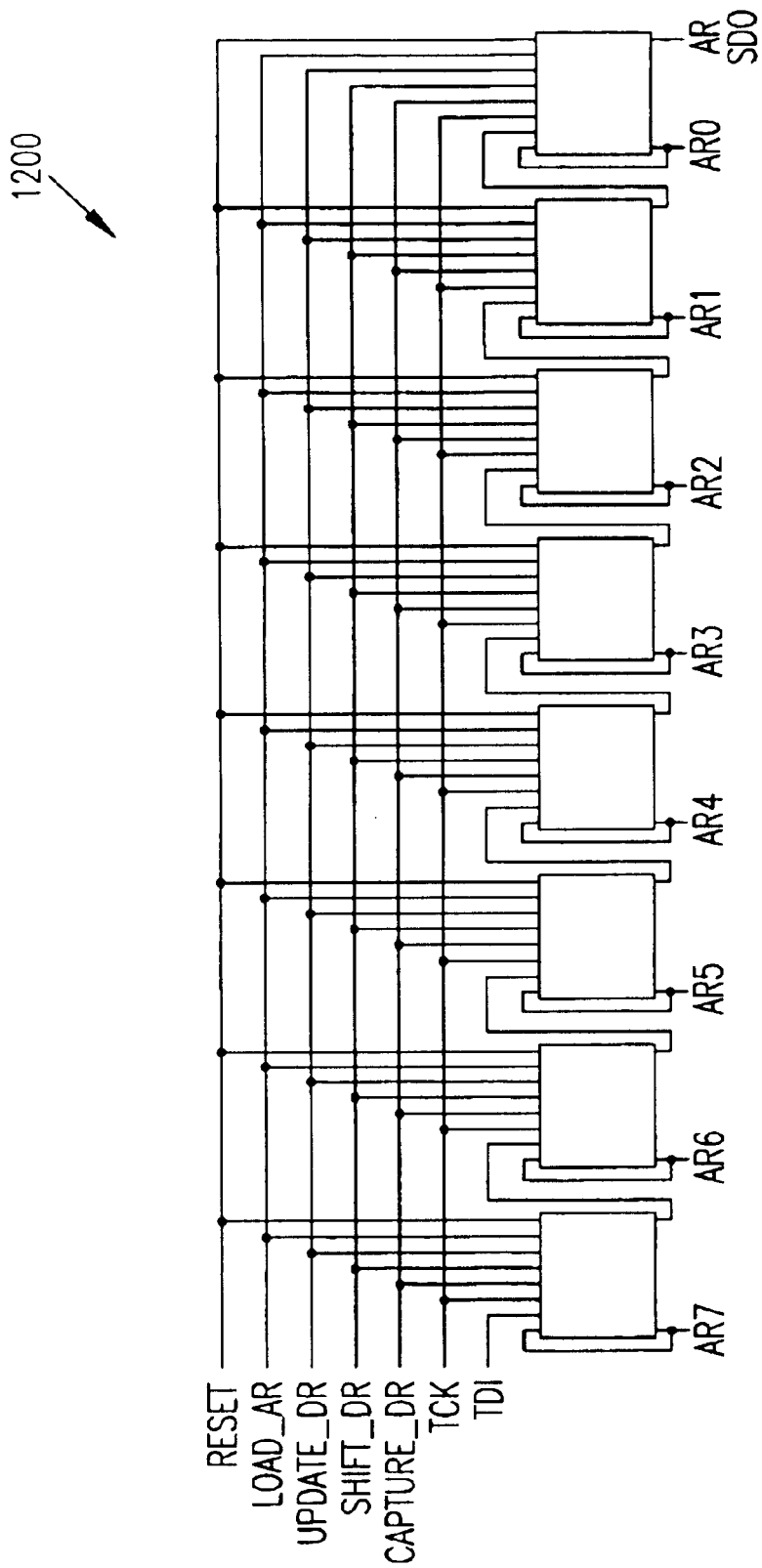
FIG. 12 is a block diagram of an address register.

Address register 531 stores an address that is shifted into SIC 500 and captured during scan test operations. In one embodiment of the present invention address register 531 includes eight register bit macros and is enabled with the decode of the LOAD_AR instruction in instruction register 533. It holds the shifted in address to compare with the address interface in order to set the CHIP_ENABLE signal. FIG. 12 is a block diagram of address register 1200, one embodiment of address register 531. Address register 1200 comprises register bit macros AR0 through AR7 that transmit AR0 through AR7 bit signals respectively. In one embodiment of address register 531 the ports of the register bit macros provide communication paths for SIC signals, including the reset port for a RESET signal, the enable port for a LOAD_AR signal, the update port for an UPDATE_DR signal, the shift port for a SHIFT_DR signal, a capture port for a CAPTURE_DR signal and the clock port for a TCK signal. The SDI port of register bit macro AR7 provides a communication path for a TDI signal. The CDI port is coupled to the PD0 port in each register bit macro. The PDO ports of register bit macro AR7 through register bit macro AR0 output an AR7 signal through AR0 signal respectively. The SDO ports of register bit macro AR7 through register bit macro AR1 are coupled to the SDI ports of register bit macro AR6 through register bit macro AR0 respectively. The SDO port of register bit macro AR0 outputs an AR_SDO signal.

Address Compare Circuit

One embodiment of the present invention includes address compare logic that compares an address shifted into an address register to the address from an address interface. In one example, address compare circuit 513 compares an address shifted into an address register (e.g., address register 531) to the address from an address interface (e.g., address interface 522) for the purpose of determining a match and asserting a SIC CHIP_ENABLE signal. In one embodiment of the present invention, the addresses are fully compared ensuring one SIC in a system is enabled at a time. One SIC in the system is enabled unless the shifted in address is a broadcast address (e.g., 0xFE), in which case address compare circuit issues a broadcast match signal and the SIC reacts in a manner similar to matching addresses except that TDOO in not enabled. In another example, one SIC in the system is enabled unless the shifted in address is a tri-state address (e.g., 0xFF), in which case the outputs of the SICs are forced to a tri-state.

Figure 13:
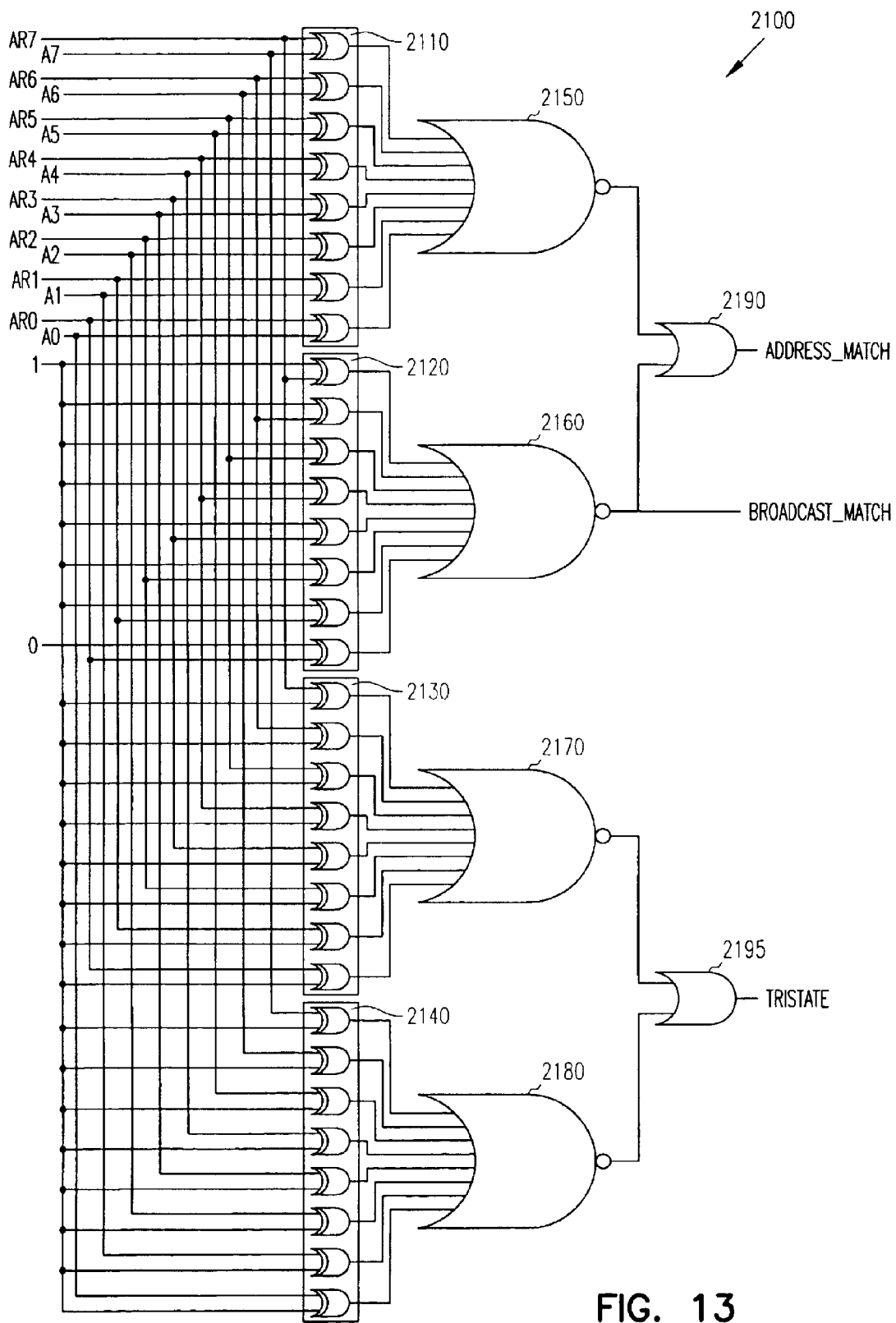
FIG. 13 is a block diagram of address compare circuit included in one embodiment the present invention.

FIG. 13 is a block diagram of address compare circuit 2100, one embodiment of address compare circuit 513. Address compare circuit 2100 comprises XOR gate groups 2110, 2120, 2130 and 2140, NOR gates 2150, 2160, 2170, and 2180, and OR gates 2190 and 2195. XOR gate groups 2110, 2120, 2130 and 2140 each comprise eight XOR gates with two inputs each. The eight XOR gates of XOR gate group 2110 perform Boolean exclusive-or functions on signals AR7 through AR0 with signals A7 through A0 respectively. The outputs of XOR gates from XOR gate group 2110 are coupled to NOR gate 2150. One input of the first seven XOR gates of XOR gate group 2120 is coupled to a logical 1 (high) value and the other inputs are coupled to signals AR7 through AR1 respectively. One input of the last XOR gate of the XOR gate group 2120 is coupled to a logical 0 (low) value and the other input is coupled to signal AR0. The outputs of XOR gate group 2120 are coupled to NOR gate 2160. One input of the XOR gates of XOR gate group 2130 is coupled to a logical 1 (high) value and the other inputs are coupled to signals AR7 through AR0 respectively. The outputs of XOR gate group 2130 are coupled to NOR gate 2170. One input of the XOR gates of XOR gate group 2140 is coupled to a logical 1 (high) value and the other inputs are coupled to signals A7 through A0 respectively. The outputs of XOR gate group 2140 are coupled to NOR gate 2180. The outputs of NOR gates 2150 and 2160 are coupled to OR gate 2190 which performs a Boolean "or" function and the result is represented by ADDRESS_MATCH signal that enables the SIC for programming. The output of NOR gate 2160 also serves as BROADCAST_MATCH signal but does not permit a TDOO port to transmit a TDO signal. The outputs of NOR gate 2170 and 2180 are coupled to OR gate 2195 which performs an "or" Boolean function resulting in a TRISTATE signal.

Chip Enable Circuit

Figure 14:
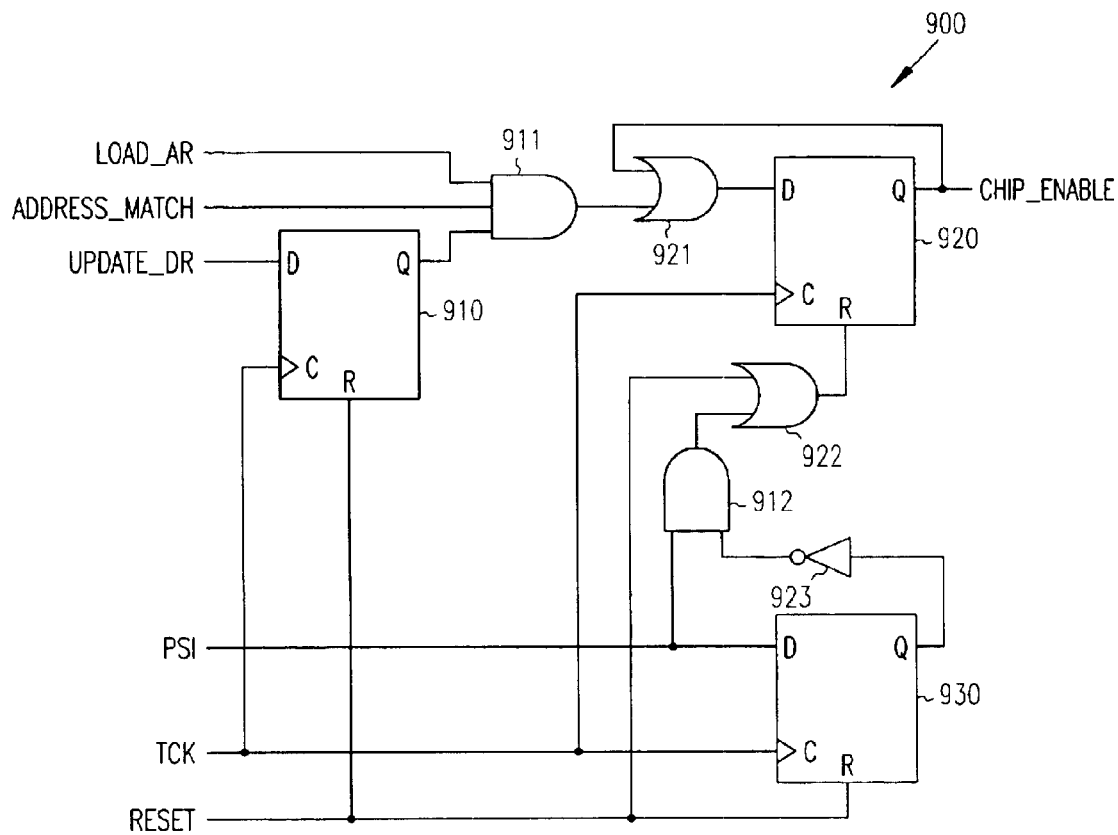
FIG. 14 is a schematic of one embodiment of a chip enable circuit of a SIC.

In one embodiment of the present invention, a chip enable circuit 512 issues a CHIP_ENABLE signal indicating that the specific SIC is enabled for programming of SIC or scan test operations on the selected scan test chains. In one embodiment of the present invention, there is only one SIC enabled at a time unless a broadcast address is specified. FIG. 14 is a schematic of chip enable circuit 900, one embodiment of a chip enable circuit comprising update flip-flop 910, enable flip-flop 920, control flip-flop 930, address AND gate 911, address OR gate 921, control AND gate 912, control OR gate 922 and control inverter 923. Update flip-flop 910 is coupled to address AND gate 911 which is coupled to address OR gate 921 which is in turn coupled to enable flip flop 920. Control flip-flop 930 is coupled to control AND gate 912 which is coupled to control inverter 923 and control OR gate 922. Control OR gate 922 is coupled to enable flip flop 920.

In one embodiment of chip enable circuit 512, update flip-flop 910, enable flip-flop 920, control flip-flop 930 are D flip-flops. The three D type flip-flops each have a positive, edge triggered clock and a positive edge triggered asynchronous reset. In one embodiment of the present invention a Chip_Enable signal is asynchronously reset by one of the following two conditions, the rising edge of the PSI signal or the TRSTN signal being asserted (low) while the PSI signal is asserted (high). This last condition is used to reset all the SICs simultaneously.

Figure 15:
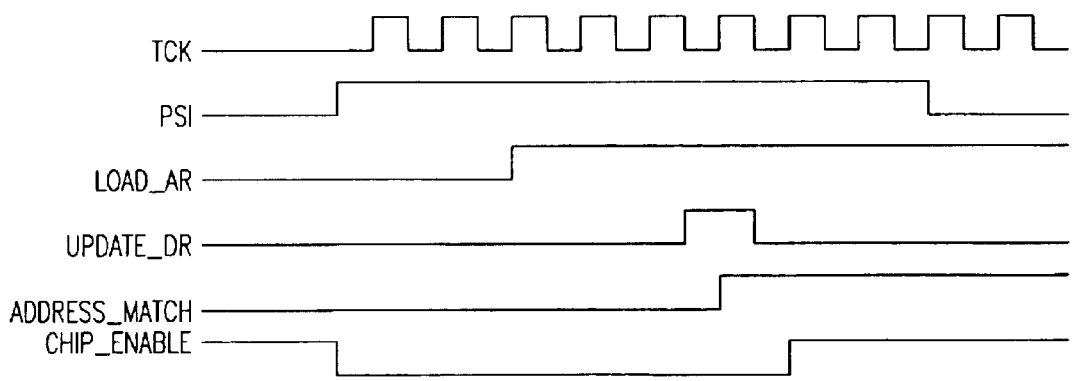
FIG. 15 is a timing diagram for operations of one embodiment of the present invention.

In one embodiment of the present invention the Chip-Enable signal is set one TCK cycle after the UPDATE_DR TAP controller state is decoded and the decoded instruction in the instruction register is LOAD_AR and the address in the address register matches that of the address interface or a broadcast address is transmitted. In one embodiment of the present invention the operation following the assertion of the PSI signal is the shifting of the LOAD_AR instruction into instruction register 533 and then shifting the address of the desired SIC into address register 531. These two operations occur approximately simultaneously on all SICs in a system and one SIC detects an address match since each SIC has a unique address. Thus, in one embodiment of the present invention, one SIC in a system sets its Chip_Enable signal if the transmitted address matches the SIC address, unless the broadcast address is detected. The broadcast address causes all SICs to set their CHIP_ENABLE signal but none of the SICs drive the TDOO. Even though the TAP controllers on all the SICs in a system change their TAP state simultaneously during all subsequent programming operations (e.g., PSI asserted) without the Chip_Enable being set, no DR shift operations (with the exception of LOAD_AR) are allowed. FIG. 15 is a timing diagram for operations of one embodiment of the present invention.

Idcode Register

Idcode register 532 captures a fixed SIC identification code during a CAPTURE_DR TAP controller state and shifts out the fixed SIC identification code during a SHIFT_DR TAP controller state. In one embodiment of the present invention Idcode Register 532 comprises 32 register bit macros. In one embodiment of the present invention Idcode Register 532 is enabled with the decode of the IDCODE instruction in instruction register 533. In one embodiment of the present invention the Idcode register 532 captures a fixed SIC identification code (e.g., 0001 00000001 10000000 000000000101) during a CAPTURE_DR TAP controller state (e.g., as specified by IEEE 1149.1 specification) and shifts it out during the SHIFT_DR TAP controller state. In one example, the first 4 bits are the version number, (e.g., 0001 for the first release of the SIC) the next 16 bits are a base part number, (0x0180) the next 11 bits are a manufacturer number (e.g., 0x002 for company X) and the last bit functions as a mandatory '1' as defined in IEEE 1149.1 specification.

Figure 16:
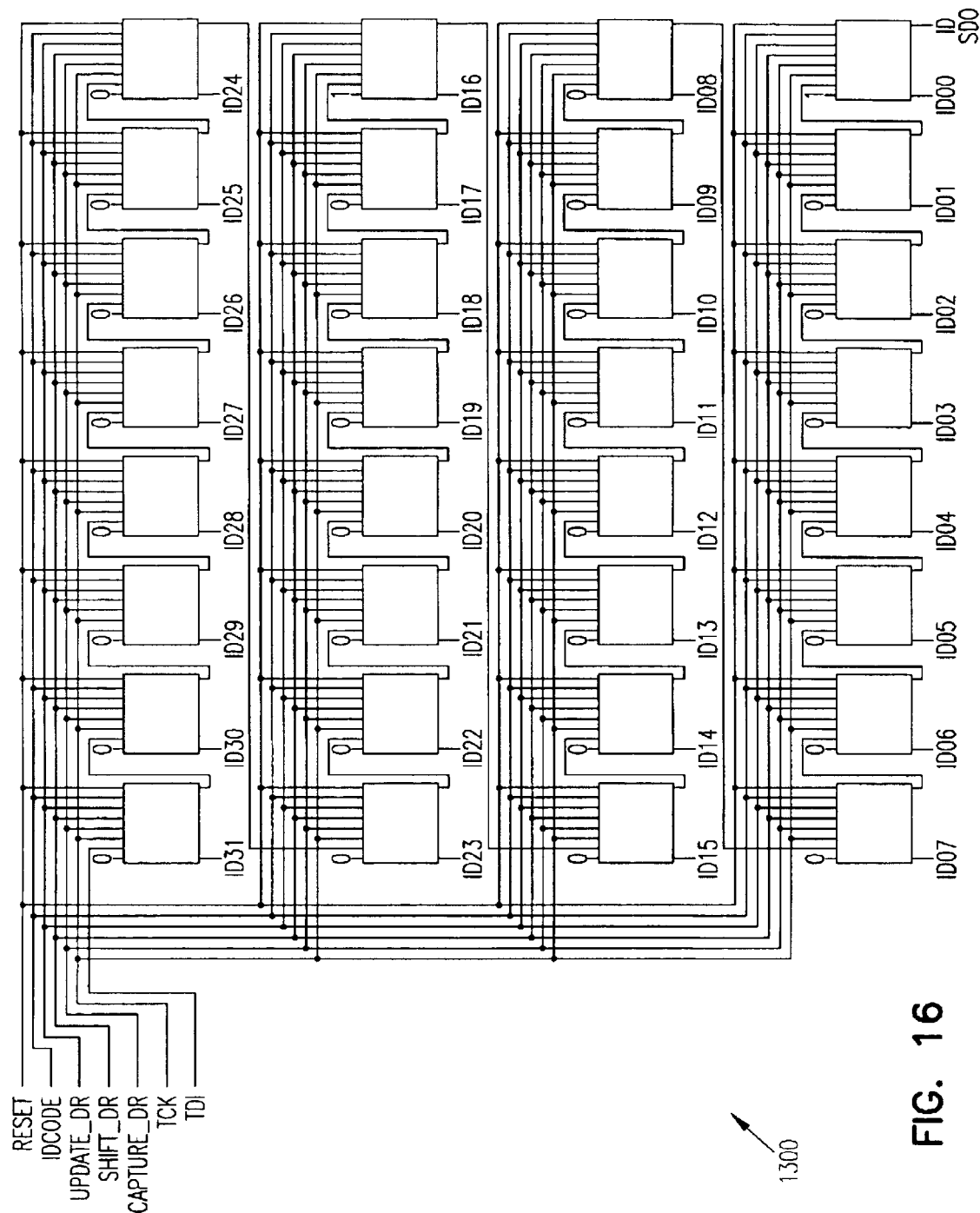
FIG. 16 is a block diagram of one embodiment of a SIC Idcode register.

FIG. 16 is a block diagram of Idcode Register 1300, one embodiment of Idcode register 532. Idcode register 1300 comprises ID register bit macros IDOO through ID31. In one embodiment of IDcode Register 1300 the ports of the register bit macros provide communication paths for SIC signals, including the reset port for a RESET signal, the enable port for a IDCODE signal, the update port for an UPDATE_DR signal, the shift port for a SHIFT_DR signal, a capture port for a CAPTURE_DR signal and the clock port for a TCK signal. The SDI port of register bit macro ID31 provides a communication path for a TDI signal. The CDI port is coupled to a logical value (e.g., logical 0 or low) in each register bit macro. The PDO ports of register bit macro ID31 through register bit macro ID00 output an ID31 signal through ID00 signal respectively. The SDO ports of register bit macro ID31 through register bit macro ID01 are coupled to the SDI ports of register bit macro ID30 through register bit macro ID00 respectively. The SDO port of register bit macro ID00 outputs an ID_SDO signal.

Bypass Register

Bypass register 535 captures information (e.g., fixed codes) associated with bypass functions in accordance with IEEE 1149.1 JTAG specifications. In one embodiment of the present invention, bypass register 535 is implemented with one register bit macro. Bypass register 535 is enabled a decode of a BYPASS instruction in instruction register 533. In one embodiment of the present invention bypass register 535 captures a fixed code (e.g. a logical 0 value) in the register bit macro of bypass register 535 during the CAPTURE_DR TAP controller state as specified by IEEE 1149.1 specification and shifts it out on during the SHIFT_DR TAP controller state.

Figure 17:
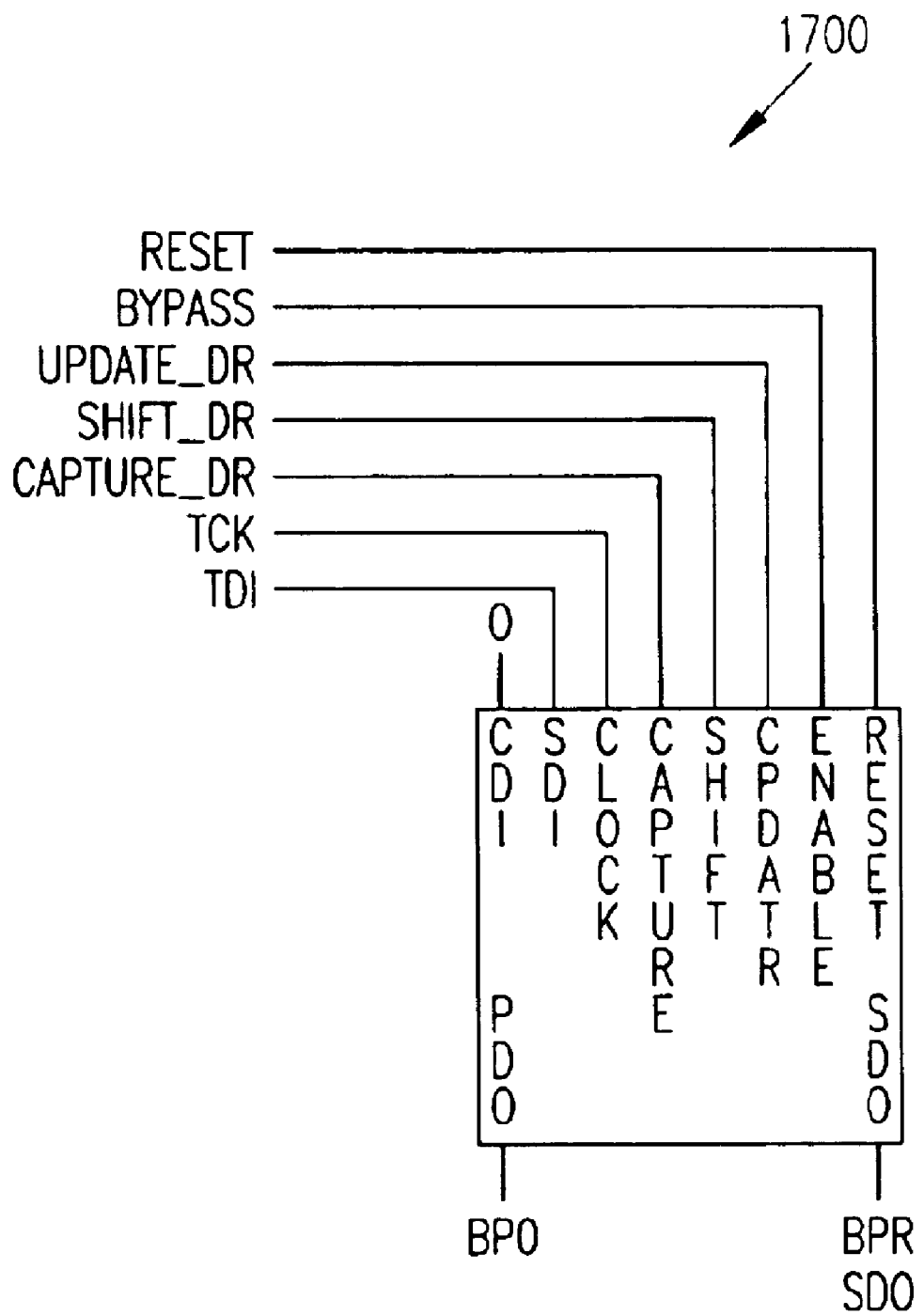
FIG. 17 is a block diagram of one embodiment of a bypass register of the present invention.

FIG. 17 is a block diagram of bypass register 1700 one embodiment of Bypass Register 535. In one embodiment of bypass (BP) register 1700 the ports of the register bit macros provide communication paths for SIC signals, including the reset port for a RESET signal, the enable port for a logical values (e.g., logical value 1 or high) signal, the update port for an UPDATE_DR signal, the shift port for a SHIFT_DR signal, a capture port for a CAPTURE_DR signal and the clock port for a TCK signal. The SDI port of register bit macro BP provides a communication path for a TDI signal. The CDI port of register bit macros BP is coupled to a static logical value (e.g., logic value 0). PDO port transmits a BPO signal and SDO port transmits a BPR_SDO signal.

Mode Register

Mode register 537 stores information associated with a mode of scan test operations. In one embodiment of the present invention mode register 537 includes twenty four register bit macros. In one embodiment of the present invention mode register 537 is enabled with the decode of the LOAD_MR instruction in instruction register 533. The mode register shifts in and out information during the SHIFT_DR TAP controller state when a LOAD_MR instruction is decoded. The mode register captures the current contents of the mode register bits during the CAPTURE_DR TAP controller state. Mode Register 537 holds or latches the shifted in mode bits (MR23:0). In one embodiment of the present invention a mode register supports several different functions.

A first function supported by mode register 537 in one embodiment of the present invention is "bypassing" or forwarding a TDO signal to a TDI signal unchanged during shift operations. In one embodiment of the present invention, when mode register bit zero (MR00) is not set (e.g., a logic 0 value or low) and the PSI signal is not asserted, (e.g., logic 0 value or low) the TDIO of the first enabled chain (e.g., TDIO0 of scan chain interface 555) follows the TDII of the SIC (e.g., a TDII of system JTAG interface 521). When MR0 is set (e.g., logic 1 value or high) and the PSI signal is not asserted (e.g., logic 0 value or low) and there is at least one enabled chain as indicated by any bit being set (e.g., a logical 1 value or high) in a chain enable register (e.g. register macros CER3 through CER0 of scan test chain enable register 1500), a TDIO of the first enabled chain follows a TDOI of the last enabled chain. When the PSI signal is asserted (e.g., high) the value of MR0 is ignored. (See FIG. 23 and discussion below on TDI input control circuit 2500).

A second function supported by mode register 537 is controlling the nature of the TDOO port. In one embodiment of the present invention, when mode register bit one (MR01) is not set, which is the reset state (e.g., a logical 0 value), the TDOO port acts like an pseudo open-collector output in that it drives low or is a high impedance. In one embodiment of the present invention, this mode requires the presence of an external pull-up resistor to pull the voltage up to the desired voltage (e.g., the same voltage as the input voltage of the system JTAG interface TDOI port). When mode register bit one (MR01) is set, the TDOO port acts as a tri-state output in that it drives both low and high or is a high impedance. This mode does not require an external pull-up resistor.

A third function supported by mode register 537 is controlling the nature of the TDIO3:0 ports during Broadcast operations. In one embodiment of the present invention, when mode register bit two (MR02) is not set, which is the reset state (e.g., a logical 0 value), and the scan test chain enable register bit zero (CER0) is set (e.g., a logical 1 value) the TDIO0 output port follows the state of the TDOI1 port and when scan test chain enable register bit one (CER1) is set (e.g., a logical 1 value) the TDIO1 port follows the state of the TDOI2 port. When the chain enable register bit two (CER2) is set (e.g., a logical 1 value) the TDIO2 port follows the state of the TDOI3 port. When scan test chain enable register bit three (CER3) is set (e.g., a logical 1 value) the TDIO3 port follows the state of the TDII port. When mode register bit two (MR02) is set (e.g., logical 1 value) all TDIO3:0 ports follow the state of the TDII port provided that the corresponding bit in the scan test chain enable register (CER3:0) is set (e.g., a logical 1 value). (See FIGS. 23 and 24 and discussion below on TDII control circuit 2500 and TDOO control circuit 2600).

A fourth function supported by mode register 537 is capture signals that direct the selection of one of 31 internal signals in the SIC for transmission on the debug output port. In one embodiment of the present invention, selecting and enabling an internal signal for transmission on the debug output port is done by encoding mode register bits MR7:3. ( See FIG. 31 and discussion below on debug selection circuit 2700)

A fifth function supported by mode register 537 is to define which bits of Input/Output register 534 designate which I/O port of Input/Output interface 554 is an input and which is an output. In one embodiment of the present invention mode register bits 15:8 correspond bit for bit to Input/Output register bits IOR7:0 with a logical 1 value in the mode register position defining the corresponding bit position in the Input/Output register as an output and a logical 0 value in the mode register position defining the corresponding bit position in the Input/Output register as an input. (See FIG. 26 and discussion below on Input/Output selection circuit 2800)

A sixth function supported by mode register 537 is controlling the nature of the JTAG output ports. In one embodiment of the present invention, when mode register bits nineteen to sixteen (MR19:16) are not set, which is the reset state (e.g., a logical 0 value), the JTAG output ports for scan test chains 3:0 respectively are open-collector outputs in that they will only drive low or be a high impedance. This mode requires the presence of an external pull-up resistors to the desired input voltage of the JTAG input pins. When mode register bits nineteen to sixteen are set, the JTAG output pins are rail-to-rail outputs in that it will drive both low and high or be a high impedance. This mode does not require external pull-up resistors and, if any exist, will interfere with the proper operation of the JTAG output pins.

Figure 18:
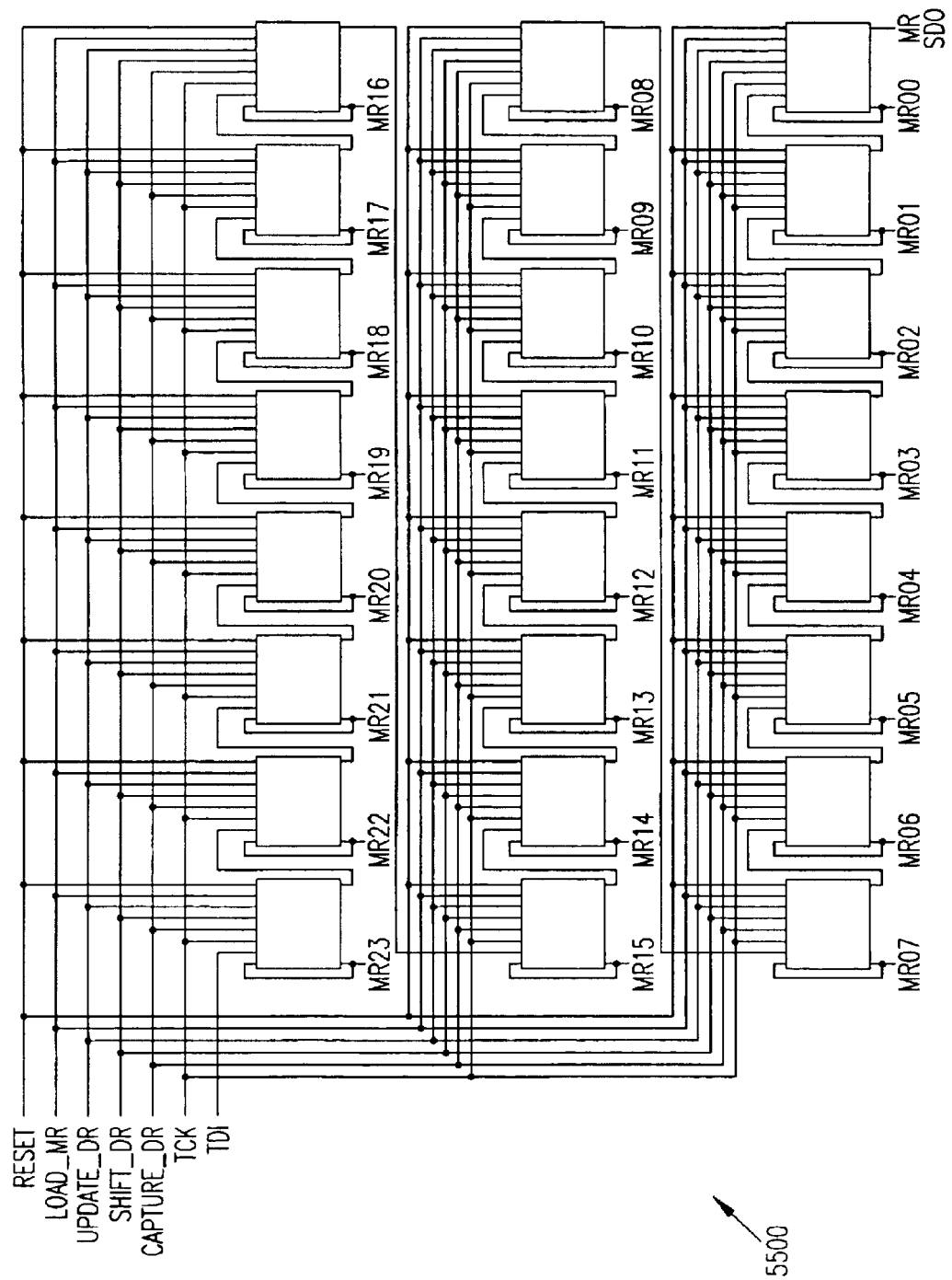
FIG. 18 is a block diagram of one embodiment of a SIC mode register.

FIG. 18 is a block diagram of mode register 5500 one embodiment of mode register 537. Mode register 5500 comprises Register Bit Macros MR00 through MR23. In one embodiment of node register 5500 the ports of the register bit macros provide communication paths for SIC signals, including the reset port for a RESET signal, the enable port for a LOAD_MR signal, the update port for an UPDATE_DR signal, the shift port for a SHIFT_DR signal, a capture port for a CAPTURE_DR signal and the clock port for a TCK signal. The SDI port of register bit macro MR23 provides a communication path for a TDI signal. The CDI port is coupled to the PDO port in each register bit macro. The PDO ports of register bit macro MR23 through register bit macro MR00 output a MR23 signal through MR00 signal respectively. The SDO ports of register bit macro MR23 through register bit macro MR01 are coupled to the SDI ports of register bit macro MR22 through register bit macro MR00 respectively. The SDO port of register bit macro MR00 outputs an MR_SDO signal.

Chain Enable Register

Chain enable register 538 stores information associated with enabling a test chain. One embodiment of Chain Enable Register 538 comprises eight register bit macros. The eight register bit macros are split into two halves of four bits each. In one embodiment, the high order half (bits 7:4) correspond to the output Test Chain Enable Not bits 3:0 (TCEN3:0) while the low order half (bits 3:0) correspond to Chain Enable Register bits 3:0 (CER3:0). In one embodiment of the present invention, chain enable register 538 is enabled with the decode of the LOAD CER instruction in instruction register 533. Chain enable register 538 captures the current contents of the Test Chain Enable Not and Chain Enable Register bits during the CAPTURE_DR TAP controller state and shifts them out during the SHIFT_DR TAP controller state. Chain enable register 538 holds the shifted in state for the Test Chain Enable Not bits 3:0 (TCEN3:0) and the Chain Enable Register bits 3:0 (CER3:0).

Figure 19:
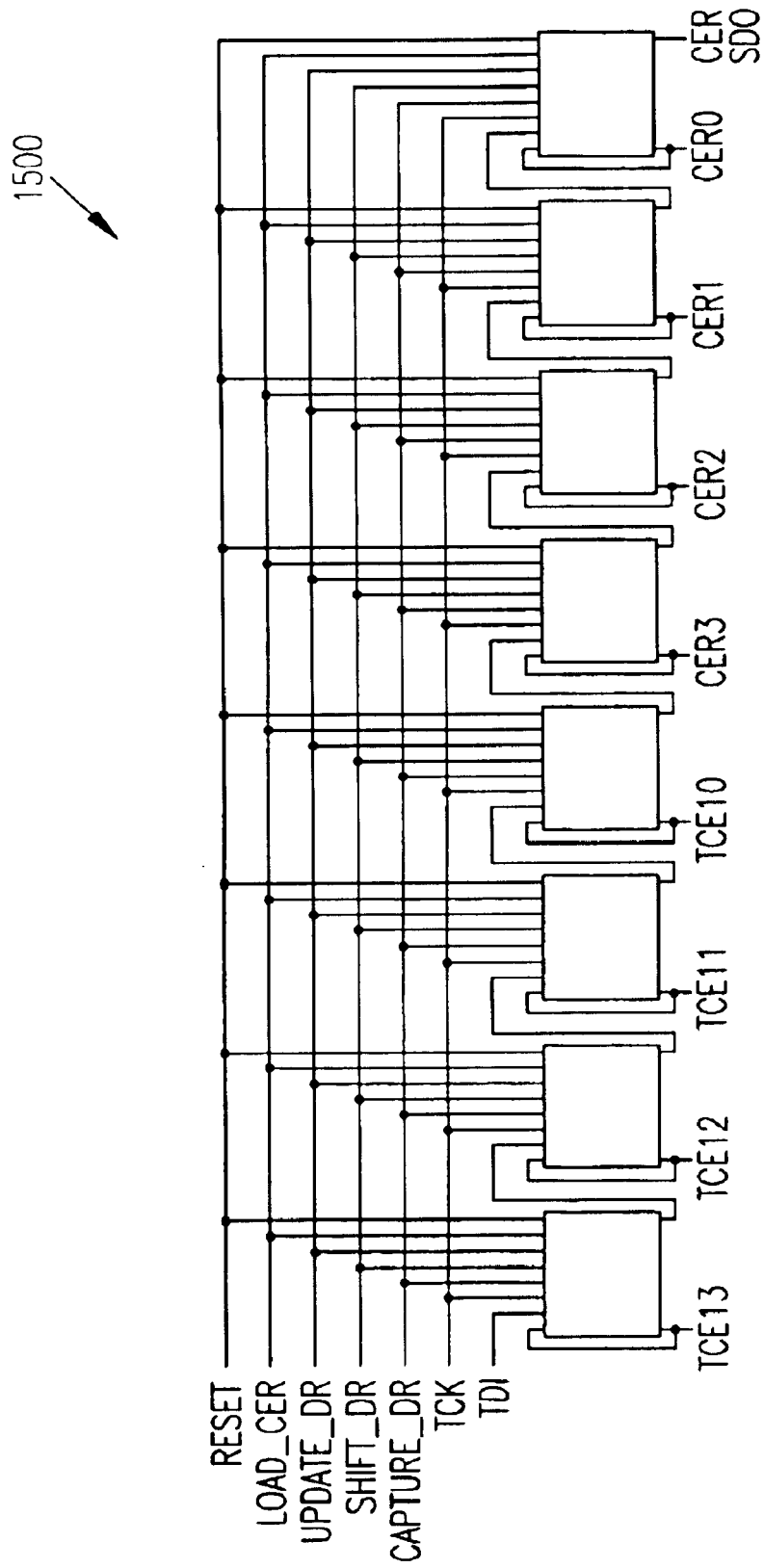
FIG. 19 is a block diagram of one embodiment of a SIC chain enable register.

FIG. 19 is a block diagram of chain enable register 1500, one embodiment of chain enable register 538. Chain enable register 1500 comprises Register Bit Macros CER0 through CER3 and TCEI0 through TCEI3. In one embodiment of chain enable register 1500 the ports of the register bit macros provide communication paths for SIC signals, including the reset port for a RESET signal, the enable port for a LOAD_CER signal, the update port for an UPDATE_DR signal, the shift port for a SHIFT_DR signal, a capture port for a CAPTURE_DR signal and the clock port for a TCK signal. The SDI port of register bit macro TCEI3 provides a communication path for a TDI signal. The CDI port is coupled to the PDO port in each register bit macro. The PDO ports of register bit macro TCEI3 through register bit macro TCEI0 output a TCEI3 signal through TCEI0 signal respectively. The PDO ports of register bit macro CER3 through register bit macro CER0 output a CER3 signal through CER0 signal respectively. The SDO ports of register bit macro TCEI3 through register bit macro TCEI1 are coupled to the SDI ports of register bit macro TCEI2 through register bit macro TCEI0 respectively. The SDO port of register bit macro TCEI0 is coupled to the SDI ports of register bit macro CER3. The SDO ports of register bit macro CER3 through register bit macro CER1 are coupled to the SDI ports of register bit macro CER2 through register bit macro CER0 respectively. The SDO port of register bit macro CER0 outputs an CER_SDO signal.

Board JTAG Signal Macro

In one embodiment of the present invention, scan test signals sent out from a SIC to devices or components on a board the SIC services are transmitted via a board signal macro circuit. For example, each 1149.1 JTAG signal sent out from a SIC to devices on a scan test chain is implemented with a board JTAG signal macro circuit. One purpose of a board JTAG signal macro circuit is to save the state of the JTAG signal and preserve it when the scan test chain is not enabled. This allows for a reset to force the proper values for the JTAG signals and also prevents spurious transitions on a scan chain during programming operations. The JTAG signal macro also implements selection of an output as a tri-state output or an pseudo open collector output.

Figure 20:
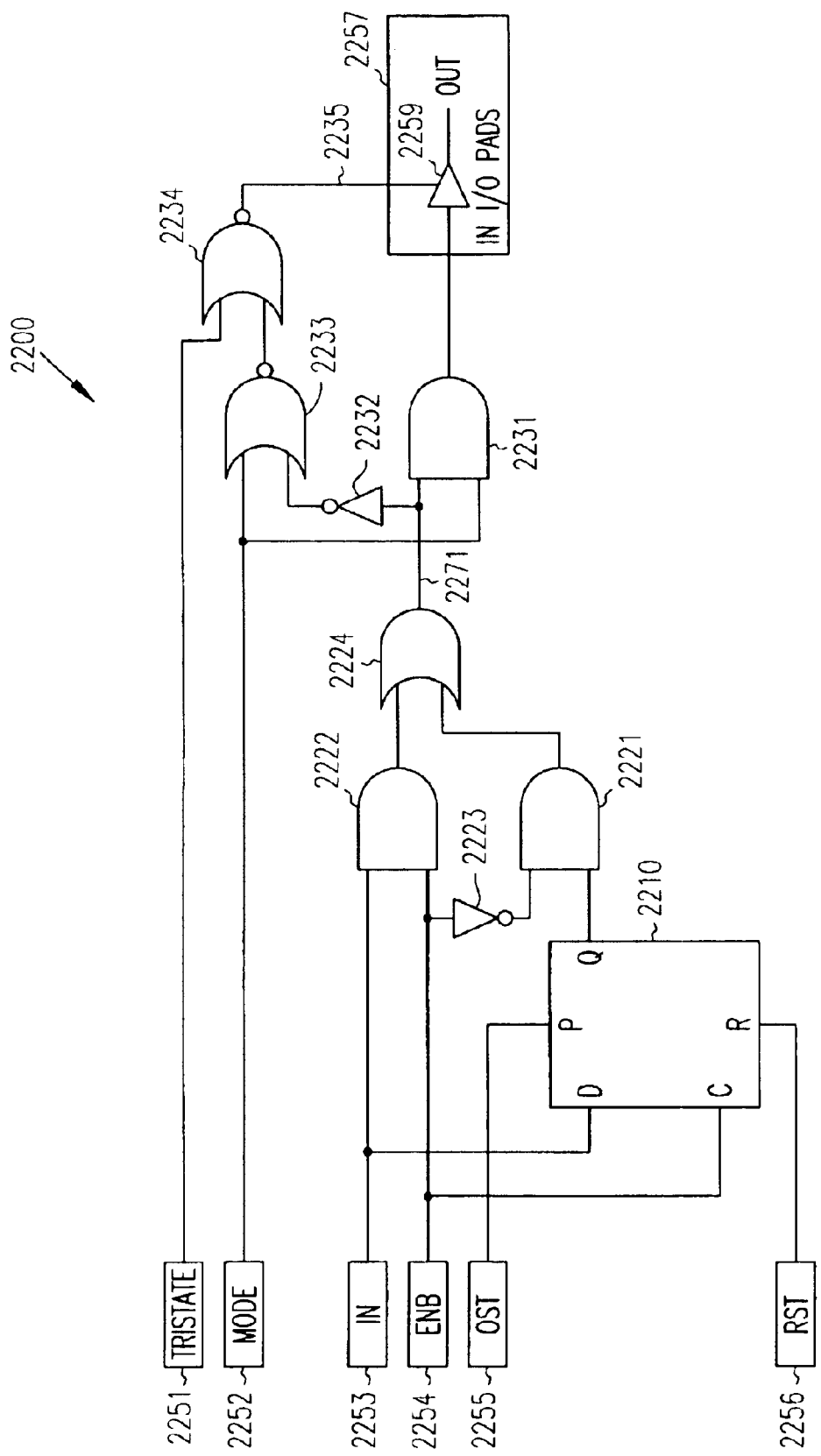
FIG. 20 is a schematic of one embodiment of a board JTAG signal macro circuit of the present invention.

FIG. 20 is a schematic of board JTAG signal macro circuit 2200, one embodiment of the present invention. Board JTAG signal macro circuit 2200 comprises a D latch 2210, a first AND gate 2221, a second AND gate 2222, a first inverter 2223, an OR gate 2224, a third AND gate 2231, a second inverter 2232, a first NOR gate 2233 and a second NOR gate 2234 and out node 2257. Board JTAG signal macro circuit 2200 also comprises communications nodes, including tri-state (TRI) node 2251, mode node 2252, in node 2253, enable (ENB) node 2254, preset (PST) node 2255, reset (RST) node 2256 and out node 2257. D latch 2210 is coupled to in node 2253, enable (ENB) node 2254, PST node 2255, reset (RST) node 2256 and first AND gate 2221 which is coupled to a first inverter 2223 and OR gate 2224. A second AND gate 2222 is coupled first inverter 2223 and OR gate 2224, in node 2253 and enable node 2254. Third AND gate 2231 is coupled to OR gate 2224, second inverter 2232, out node 2257 and mode node 2252. First NOR gate 2233 is coupled to mode node 2252, second inverter 2232 and a second NOR gate 2234 which is coupled to out node 2257 and 2251.

The components of board JTAG signal macro circuit 2200 cooperatively operate to communicate downstream scan test chain signals and to facilitate retention of the JTAG signal state when the scan test chain is not enabled. D latch 2210 latches a signal (e.g., TDI) received via in node 2253 when transition occurs from a functional scan test operation (e.g., not programming mode) and saves it during programming.

This enables board JTAG signal macro circuit 2200 to hold a scan test operation signal static during programming. TRISTATE node 2251, mode node 2252, in node 2253, enable node 2254, preset node 2255, reset node 2256 provide a communication path for signals into board JTAG signal macro circuit 2200. Out node 2257 provides a communication path for signals out of board JTAG signal macro circuit 2200. First AND gate 2221, second AND gate 2222 and third AND gate 2231 perform Boolean "and" functions on signals received at their respective inputs. First inverter 2223 and second inverter 2232 invert signals received at their respective inputs. OR gate 2224 performs a Boolean "or" function on signals received at its inputs. First NOR gate 2233 and second NOR gate 2234 perform Boolean "nor" functions on signals received at their respective inputs.

In one embodiment of the present invention, D latch 2210 latches the signals (e.g., TDI) received via in node 2253 when node 2254 transitions from a logical 1 value to a logical 0 value. D latch 2210 saves the state of a scan test chain signal and preserves it until enable node 2254 transitions from a logical 0 value to a logical 1 value. In one embodiment of the present invention, when a JTAG macro enable signal transmitted via enable node 2254 is asserted (e.g., logical 1 value or high), signals transmitted via out node 2257 have the same logic values as signals received via in node 2253. When a JTAG macro enable signal transmitted via enable node 2254 is not asserted (e.g., logical 0 value or low), signals transmitted via out node 2257 have the same logic values as signals transmitted by D latch 2210. In one embodiment of the present invention, the JTAG macro enable signal transmitted via enable node 2254 is not asserted if a CHIP_ENABLE is not enabled or a CHAIN_ENABLE register bit is not enabled. If the CHIP_ENABLE and a CHAIN_ENABLE register bit are enabled, the JTAG macro enable signal transmitted via enable node 2254 is asserted if a PSI signal is not asserted (e.g., a logical 0 value).

In one embodiment of the present invention, out node 2257 includes a tri-state gate ("I/O pad") 2259 that operates as a tri-state output or pseudo open collector output depending upon tri-state gate enable signal 2235. If tri-state gate enable signal 2235 is asserted tri-state gate 2259 operates as a pseudo open collector output and if OC selection signal 2235 is not asserted tri-state gate 2259 operates as a tri-state output (rail to rail mode). The tri-state gate enable signal is programmatically controlled by a pseudo OC selection circuit comprising a third AND gate 2231, a second inverter 2232, a first NOR gate 2233 and a second NOR gate 2234.

In one exemplary implementation of the present invention, tri-state gate enable signal 2235 depends upon an addresses received by SIC 500, the state of modes shifted into mode register 537 and the output signal 2271. Tri-state gate enable signal 2235 is not asserted if the "overriding" TRISTATE signal received via TRISTATE node 2251 is asserted and allows SIC 500 to tri-state an output (e.g., for test purposes). In one embodiment of the present invention, the TRISTATE signal is asserted by address compare circuit 513 if the address 255 (OXFF) is received by SIC 500. In one embodiment, tri-state gate enable 2235 is not asserted if a mode register bit (e.g., MR01 or MR19:16) associated with a OC selection control signal on mode node 2252 is set. If tri-state gate enable signal 2235 is not asserted tri-state gate 2259 operates as a tri-state output. In one embodiment, tri-state gate enable 2235 is asserted if a mode register bit (e.g., MR01 or MR19:16) is not set and tri-state gate 2259 operates as a pseudo open collector output in that it drives low or is a high impedance. In one embodiment of the present invention, this mode requires the presence of an external pull-up resistor to pull the voltage up to the desired voltage (e.g., the same voltage as the input voltage of the system JTAG interface TDOI port) for logical 1 value outputs.

Scan Test Chain Selection Macro

One embodiment of the present invention includes a scan test chain selection macro that facilitates the selection of a scan test chain. In one embodiment of the present invention the scan test chain selection marco comprises four JTAG Signal macros and one scan test chain duplicate TAP controller. The purpose of having a "duplicate" TAP controller included in the chain selection macro is to track the TAP state of each of the scan test chains serviced by the JTAG signal macros and return it a TAP state register (e.g., TAP state register 541) in response to a STORE_TSR instruction.

Figure 21:
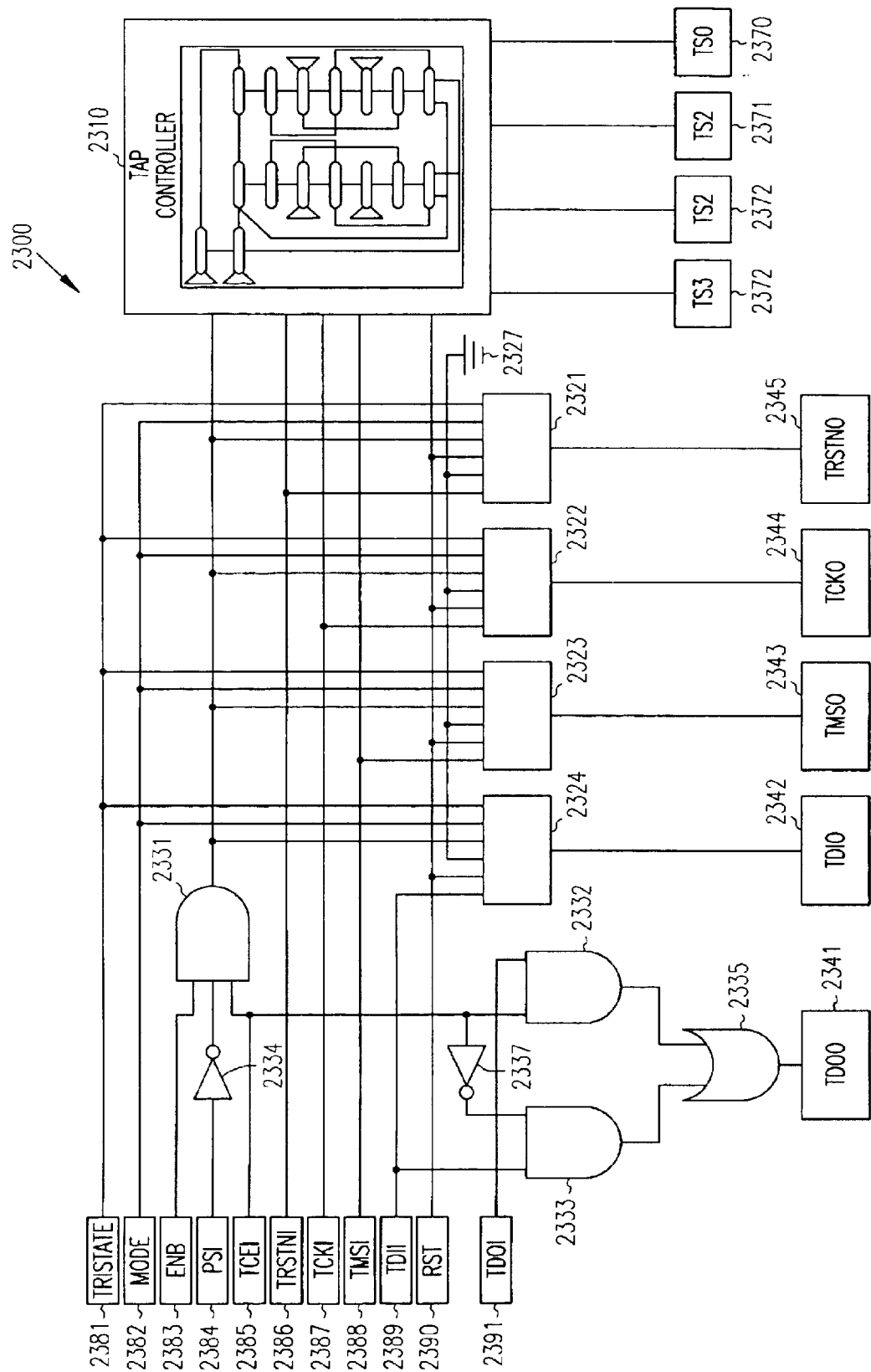
FIG. 21 is a schematic of scan test chain selection macro (STCSM) 2300, one embodiment of the present invention.

FIG. 21 is a schematic of scan test chain selection macro (STCSM) 2300, one embodiment of the present invention. Scan test chain selection macro 2300 comprises a scan test chain duplicate TAP controller 2310, Board JTAG signal macro circuits 2321 through 2324, AND gates 2331 through 2333, OR gate 2335 and inverter gates 2334 and 2337. STCSM 2300 also comprises input nodes, including STCSM tri-state node 2381, STCSM mode node 2882, STCSM enable (ENB) node 2383, STCSM program scan interface (PSI) node 2384, STCSM test chain enable indication (TCEI) node 2385, STCSM test reset input (TRSTNI) node 2386, STCSM test clock input (TCKI) node 2387, STCSM test mode select input (TMSI) node 2388, STCSM test data in input (TDII) node 2389, STCSM reset (RST) node 2390, STCSM test data out input (TDOI) node 2391. STCSM 2300 also comprises output nodes, including STCSM test data out output (TDOO) node 2341, STCSM test data in output (TDIO) node 2342, STCSM test mode select output (TMS0) node 2343, STCSM test clock output (TCKO) node 2344, STCSM test reset output negative asserted (TRSTN0) node 2345, STCSM TAP state third bit (TS3) node 2373, STCSM TAP state second bit (TS2) node 2372, STCSM TAP state first bit (TS1) node 2371, and (STCSM)TAP state zero bit (TSO) node 2370.

The components of STCSM 2300 are communicatively coupled to facilitate the selection of a scan test chain. Scan test chain duplicate TAP controller 2310 is coupled to Board JTAG signal macro circuits 2321 through 2324, AND gate 2331 and STCSM TAP state third bit (TS3) node 2373, STCSM TAP state second bit (TS2) node 2372, STCSM TAP state first bit (TS1) node 2371, and STCSM TAP state zero bit (TSO) node 2370. Board JTAG signal macro circuits 2321 through 2324 are coupled to STCSM tri-state node 2381, STCSM mode node 2382, AND gate 2331, STCSM RST node 2390 and ground reference 2327. Board JTAG signal macro circuit 2321 is coupled to STCSM TRSTNI node 2386 and STCSM TRSTN0 node 2345. Board JTAG signal macro circuit 2322 is coupled to STCSM TCKI node 2387 and STCSM TCKO node 2344. Board JTAG signal macro circuit 2323 is coupled to STCSM TMSI node 2388 and STCSM TMS0 node 2343. Board JTAG signal macro circuit 2324 is coupled to STCSM TDII node 2389 and STCSM TDIO node 2342. The AND gate 2331 is coupled to AND gate 2332, STCSM TCEI node 2385, STCSM ENB node 2383 and inverter gate 2334 which is coupled to STCSM PSI node 2384. AND gate 2332 is coupled to inverter gate 2337, STCSM TDOI node 2391 and OR gate 2335. AND gate 2333 is coupled to inverter 2337 and STCSM TDII 2389 and OR gate 2335 which is coupled to STCSM TDDO node 2341.

SIC and scan test signals are communicated via the nodes of STCSM 2300. For example, a TRISTATE signal is communicated via STCSM tri-state node 2381, a MODE signal via STCSM mode node 2382, a CHIP_ENABLE signal via STCSM ENB node 2383, a PSI signal via STCSM PSI node 2384, a TCEN signal via STCSM CER node 2385 and a RESET signal via STCSM reset (RST) node 2390. A TRSTN signal is communicated via STCSM TRSTNI node 2386 and STCSM TRSTN0 node 2345. A TCK signal is communicated via STCSM TCKI node 2387 and STCSM TCKO node 2344. A TMS signal is communicated via STCSM TMSI node 2388 and STCSM TMS0 node 2343. A TDI signal or TDO signal from a another STCSM is communicated via STCSM TDII node 2389. A TDO signal is communicated via STCSM test data out input (TDOI) node 2391. A TDO or a TDI signal is communicated via STCSM TDOO node 2341. A TDI signal is communicated via STCSM TDIO node 2342. TAP state signals are communicated via STCSM TAP TS3 node 2373, STCSM TAP TS2 node 2372, STCSM TAP TS1 node 2371, and STCSM TAP TS0 node 2370.

Scan test chain duplicate TAP controller 2310 tracks the state of a primary scan test interface TAP controller (e.g., TAP controller 511 in FIG. 5) when serving the chain associated with scan test chain duplicate TAP controller 2310. Scan test chain duplicate TAP controller 2310 performs "tracking" functions when the scan test chain downstream of scan test chain selection macro 2300 is selected. For example, when the signals on STCSM enable (ENB) node 2383 and STCSM test chain enable indication (TCEI) node 2385 are a logical 1 value and the signal on STCSM program scan interface (PSI) node 2384 is a logical 0 value. The signals tracked by scan test chain duplicate TAP controller 2310 are stored in a TAP state register (e.g. TAP state register 541 shown in FIG. 5). Thus, the state of a primary TAP controller and scan test signals associated with a scan test stream downstream of scan test chain selection macro 2300 are stored when a scan test interface primary TAP controller (e.g., TAP controller 51) stops performing functions associated with a scan test stream downstream of scan test chain selection macro 2300 and performs functions associated with other scan test chains. The state of the primary TAP controller is preserved even if other operations of the system (e.g., multiple users on the system running different processes) inadvertently cause the primary TAP controller state to change. As long as the TAP state register is not reset, the last state of the primary TAP controller and scan test signals associated with a scan test stream downstream of scan test chain selection macro 2300 is available when the primary TAP controller returns to servicing the scan test stream downstream of scan test chain selection macro 2300. Furthermore, the scan test interface is capable of returning the stored or saved aspects of the primary TAP controller state information to system level devices or software. The TAP state decodes for one embodiment of the present invention are included in TAP state decode table 2387 shown in FIG. 21A.

Scan Test Chain Selection Circuit

Figure 22:
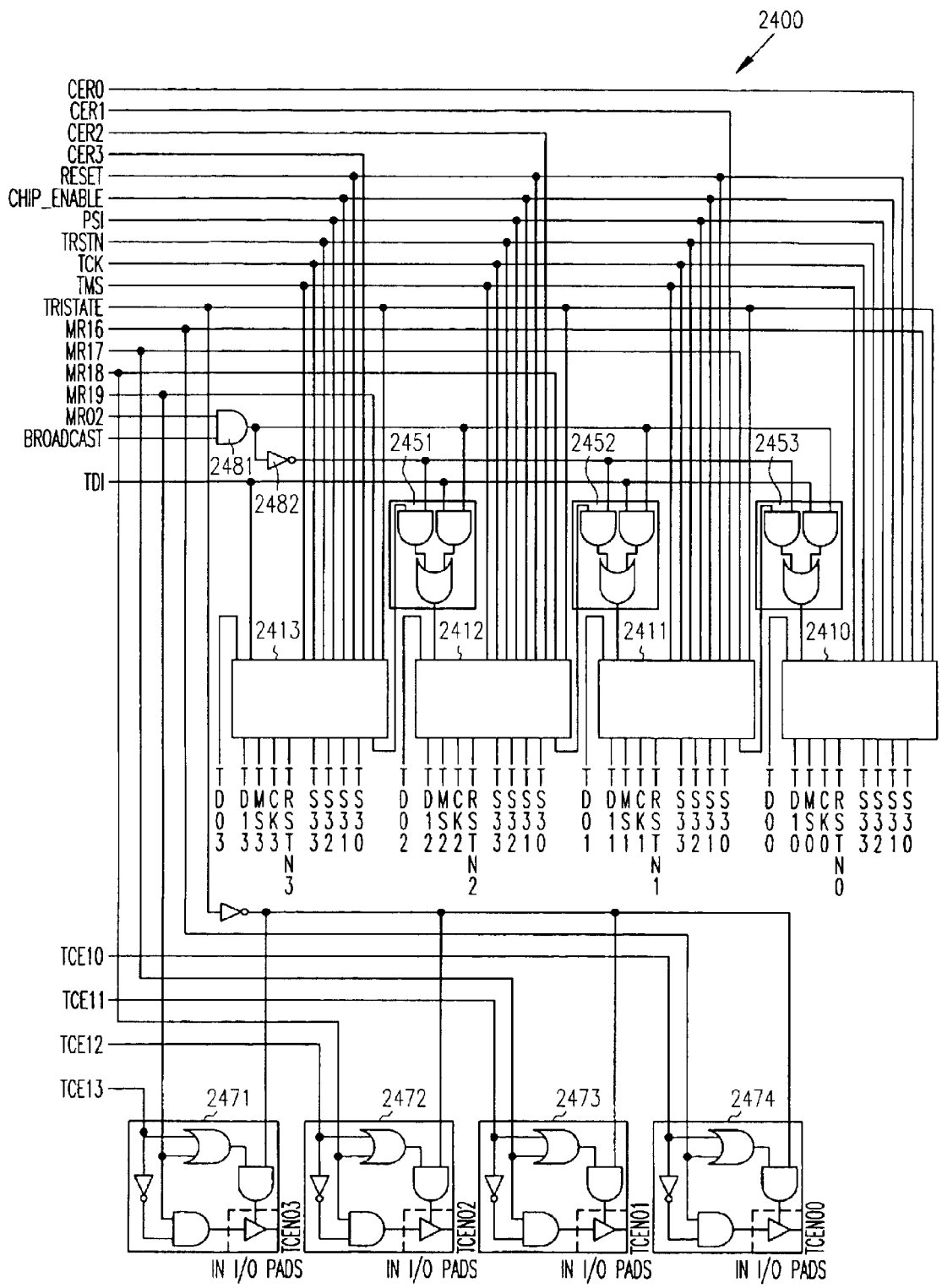
FIG. 22 is a schematic of one embodiment of a SIC scan test chain selection circuit.

FIG. 22 is a schematic of scan test chain selection circuit 2400, one embodiment of scan test chain selection circuit 518. Scan test chain selection circuit 2400 includes four scan test chain selection macros cascaded together. This is accomplished by coupling the test data out output (TDOO) of a preceding macro to the test data in input (TDII) of a subsequent bit with the remaining inputs coupled together. Scan test chain selection circuit 2400 comprises scan test chain selection macros 2410 through 2413, TDIO selection circuits 2451 through 2453, scan test chain enable output (STCEO) selection circuits 2471 through 2474, broadcast output AND gate 2481 and broadcast inverter 2482. Each TDIO selection circuit 2451 through 2453 comprises a first TDIO selection AND gate, a second TDIO selection AND gate and a TDIO selection OR gate. Each STCEO selection circuit 2471 through 2474 comprises a STCEO inverter, a STCEO OR gate, a first STCEO AND gate, a second STCEO AND gate, and a STCEO tri-state gate ("I/O pad"). In one embodiment of the present invention, selection circuits 2471 through 2474 operates as pseudo OC outputs.

The components of scan test chain selection circuit 2400 are communicatively coupled and adapted to communicate signals with other components of SIC 500. Scan test chain selection macros 2413 through 2410 are sequentially coupled by coupling the test data out output (TDOO) of a preceding scan test chain selection macro to the test data in input (TDII) of a subsequent scan test chain selection macro. As indicated above, scan test signals are communicated via nodes of scan test chain selection macros 2410 through 2413. In one embodiment of the present invention, the TCEI signals communicated via STCSM TCEI nodes of scan test chain selection macros 2410 through 2413 correspond to the logical values of bits CER0 through CER3 respectively, stored in chain enable register 538. The MODE signals communicated via STCSM mode nodes of scan test chain selection macros 2410 through 2413 correspond to the logical values of bits MR16 through MR19 respectively, stored in mode register 537. In one embodiment of the present invention scan test chain selection macros 2413 through 2410 facilitate communication with a separate scan test chain (e.g., a first though forth scan test chain).

The TDIO selection circuits 2451 through 2453 are coupled to scan test chain selection macros 2410 through 2413 respectively. One input of the first TDIO selection AND gates is coupled to the output of broadcast inverter 2482 and the other input is coupled to a STCSM TDOO node of a preceding scan test chain selection circuit. One input of the second TDIO selection AND gates is coupled to a TDI signal node and the other input is coupled to the output of broadcast output AND gate 2481. The two inputs of the TDIO selection OR gates are coupled to the corresponding first TDIO selection AND gate and second TDIO selection AND gate. The output of the TDIO selection OR gates of TDIO selection circuits 2451 through 2453 are coupled to the TDII nodes of scan test chain selection macros 2412 through 2410 respectively. The TDII node of scan test chain selection macro 2413 is coupled to TDI.

Scan test chain selection macros 2413 through 2410 are coupled to STCEO selection circuits 2471 through 2474 respectively. In one embodiment of the present invention each scan test chain selection macros 2413 through 2410 and STCEO selection circuits 2471 through 2474 are respectively coupled to MR19 through MR16 and TCEI (3:0). The TCEI (3:0) signals are coupled to the STCEO inverter and a STCEO OR gate of STCEO selection circuits 2471 through 2474 respectively. The STCEO OR gates are coupled to first STCEO AND gate and second STCEO AND gate of each respective STCEO selection circuits 2471 through 2474, which coupled to the STCEO tri-state gate ("I/O pad').

Test Data I/O Control

MUX control circuit 514 controls the test data input (TDI) and test data output (TDO). MUX control circuit 514 is broken into two circuit sections, the TDI input control circuit section and the TDO output control circuit section.

TDI Input Control

In general, during normal scan test operations the SIC's TDI input is driven out on the TDI output pin of an enabled scan test chain. In one embodiment of the present invention, two exceptions to the general normal scan test operation occur when a PSI signal is asserted (high) or when mode register 537 bit MR0 is set to a logical 1. In the first case, all the TDI outputs for all the scan test chains remain at the same value they were prior to the PSI signal being asserted. This is a function of the JTAG_SIGNAL_MACRO. In the latter case, the TDO input from the last selected chain is bypassed to the TDI output of the first enabled chain in order to shift back in the data being shifted out of the enabled scan test chain(s). This function is controlled by the assertion (high) of mode register 537 bit MR0. Once the TDI input signal has been selected from either the SIC input pin or bypassed from the selected TDO input pin, the TDI input control is accomplished in the register bit macro itself. The TDI input simultaneously feeds the first bit of each register (as the SDI input) but is not enabled to clock in to the bit unless the ENABLE and SHIFT inputs are true. The enable input will only be true if the instruction in instruction register 533 is decoded to enable the particular register and only one register can be enabled at a time.

Figure 23:
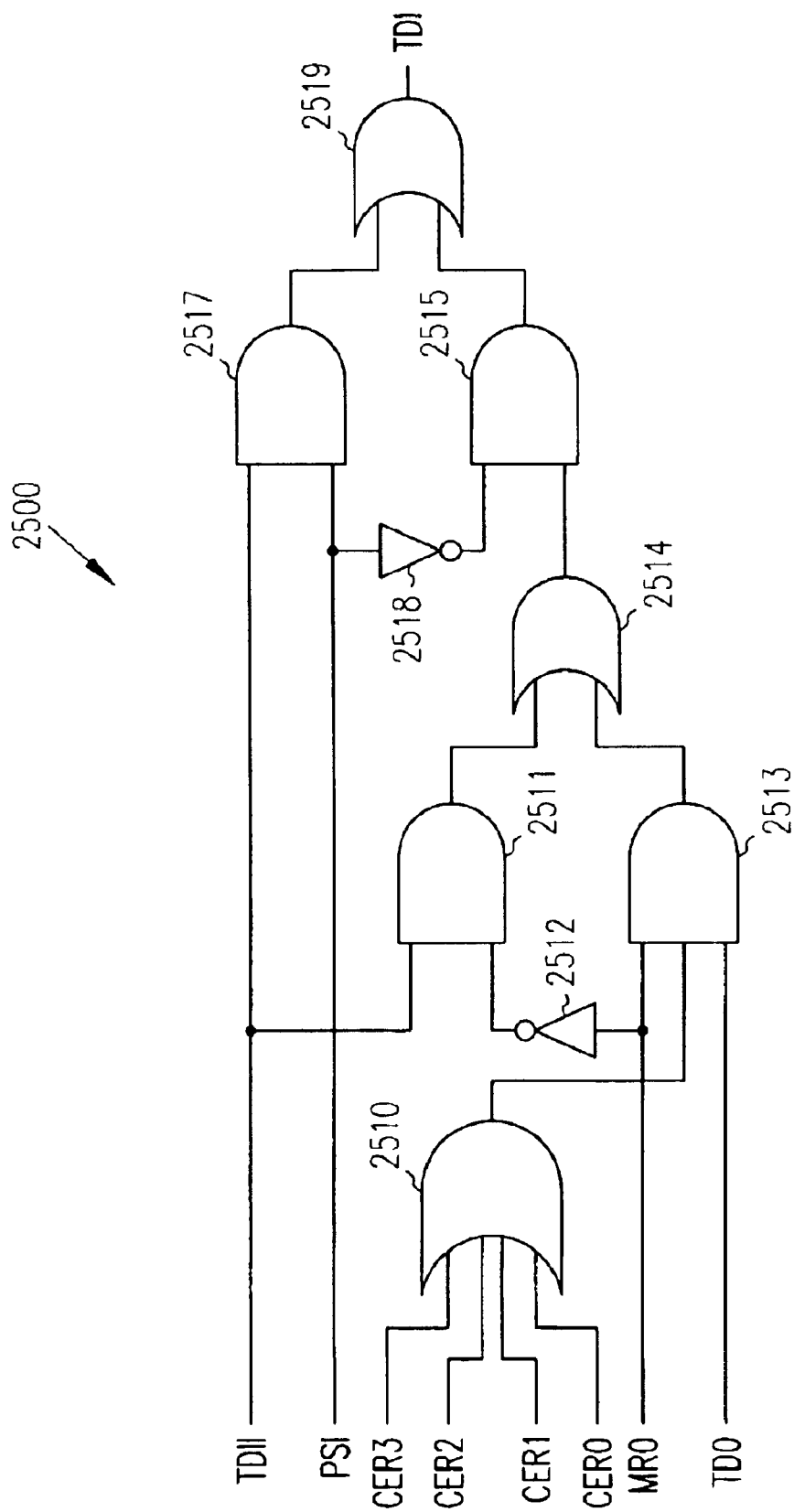
FIG. 23 is a schematic of one embodiment of a TDI input control circuit section.

FIG. 23 is a schematic of TDI input control circuit section 2500, one embodiment of a TDI input control circuit section of MUX control circuit 514. TDI input control circuit section 2500 comprises a first TDII control OR gate 2510, a first TDII control inverter 2512, a first TDII control AND gate 2511, a second TDII control AND gate 2513, a second TDII control OR gate 2514, a second TDII control inverter gate 2518, a third TDII control AND gate 2515, a forth TDII control AND gate 2517, and a third TDII control OR gate 2519. First TDII control OR gate 2510 is coupled to second TDII control AND gate 2513 which is coupled to second TDII control OR gate 2514 and first TDII control inverter 2512. The second TDII control OR gate 2514 is coupled to first TDII control AND gate 2511 and third TDII control AND gate 2515. Third TDII control AND gate 2515 is coupled to second TDII control inverter gate 2518, and third TDII control OR gate 2519 and forth TDII control AND gate 2517.

TDO Output Control

Figure 24:
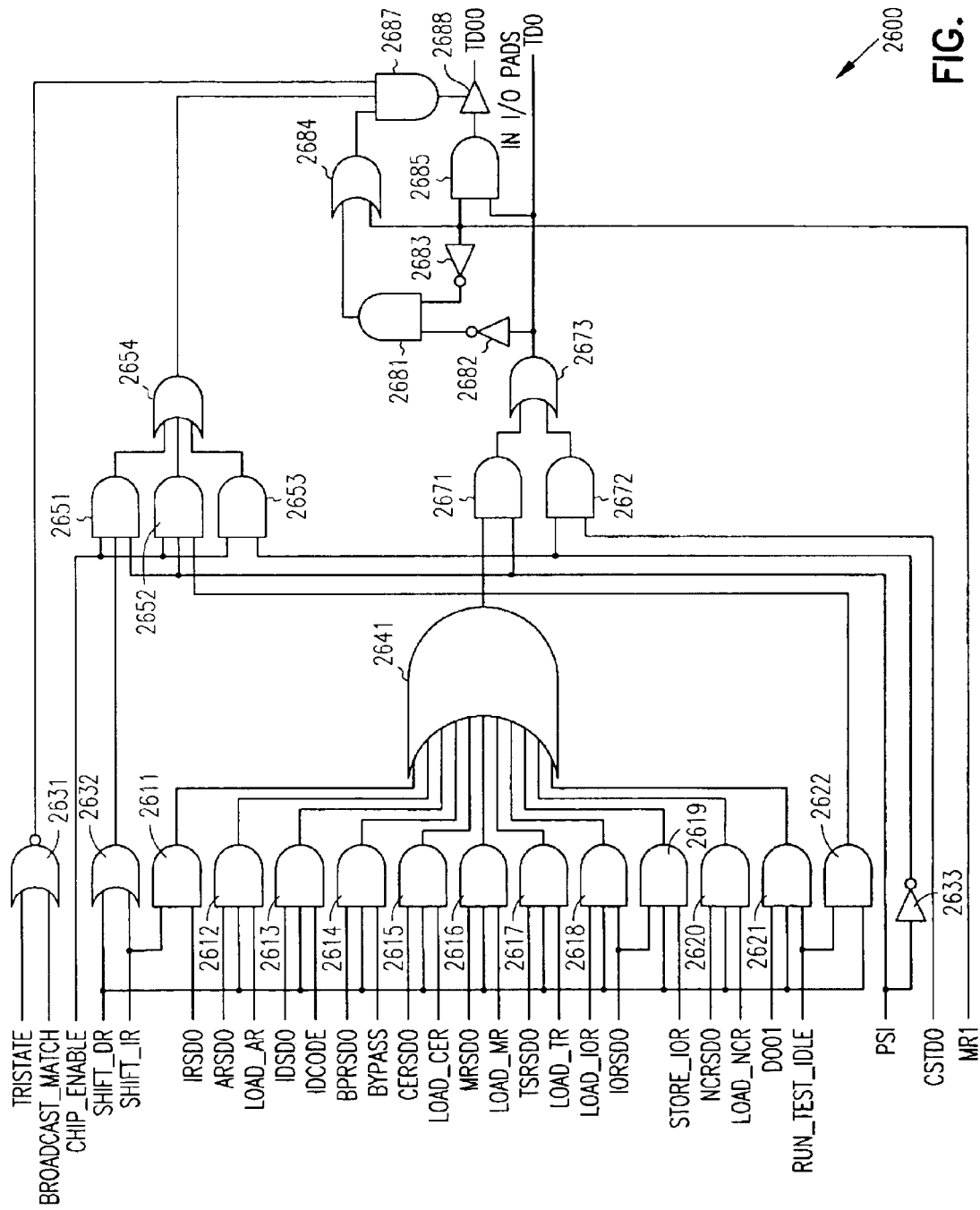
FIG. 24 is a schematic of one embodiment of a SIC TDO output control circuit section.

In one embodiment of the present invention the multiplexing of the TDO output is accomplished in the TDO output control circuit section and not in a Register Bit Macro. FIG. 24 is a schematic of TDO output control circuit section 2600. TDO output control circuit section 2600 comprises data out AND gates 2611 through 2622, data out OR gate 2641, data out control NOR gate 2631, data out control OR gate 2632, data out inverter 2633, data out control AND gates 2651 through 2653, data out control OR gate 2654, data out selection AND gates 2671 and 2672, data out selection OR gate 2673, data out pad inverters 2682 and 2683, data out pad AND gates 2681, 2685, and 2687, data out pad OR gate 2684 and data out tri-state gate ("I/O pad") 2688. Data out AND gates 2611 through 2622 are coupled to data out OR gate 2641 which is coupled to data out selection AND gate 2671. Data out selection AND gate 2671 is coupled to data out selection OR gate 2673 and data out control AND gate 2652. Data out control AND gate 2652 is coupled to data out control AND gates 2651 and 2653, and data out control OR gate 2654 which is coupled to data out pad AND gate 2687. Data out control AND gate 2651 is coupled to data out control OR gate 2632. Data out pad AND gate 2687 is coupled to data out pad OR gate 2684 and data out tri-state gate ("I/O pad") 2688 which is coupled to data out pad AND gate 2685. Data out selection OR gate 2673 is coupled to data out pad inverter 2682 and data out pad AND gate 2685. Data out pad OR gate 2684 is coupled to data out pad AND gate 2681 which is coupled to data out pad inverters 2682 and 2683.

In one embodiment of the present invention, tri-state gate ("I/O pad") 2688 is a pseudo OC tri-state gate. A pseudo open collector (OC) tri-state circuit comprising data out pad inverters 2682 and 2683, data out pad AND gates 2681, 2685, and 2687, and data out pad OR gate 2684 control whether data out tri-state gate ("I/O pad") 2688 operates as a tri-state output or pseudo OC output.

Input Output Register

Input/Output register 534 tracks the designation of communication ports as inputs or outputs. In one embodiment of the present invention Input Output Register 534 is implemented with 8 Register Bit Macros. It is enabled with the decode of either the LOAD_IOR instruction or the STORE_IOR instruction in the instruction register. It captures the value of the I/O pins for all bits defined by Mode Register bits 15:8 as inputs (Designated by a 0) during the CAPTURE_DR TAP controller state and shifts them out during the SHIFT_DR TAP controller state. Bits defined as outputs are forced to capture a 0 value (See FIG. 26). It holds the shifted in state for all bits defined by Mode Register bits 15:8 as outputs (Designated by a 1). To prevent the bits defined as outputs from changing their value during a STORE_IOR instruction operation (Read of the pins defined as inputs.) the Input Output Register doesn't update during the UPDATE_DR TAP State.

Figure 25:
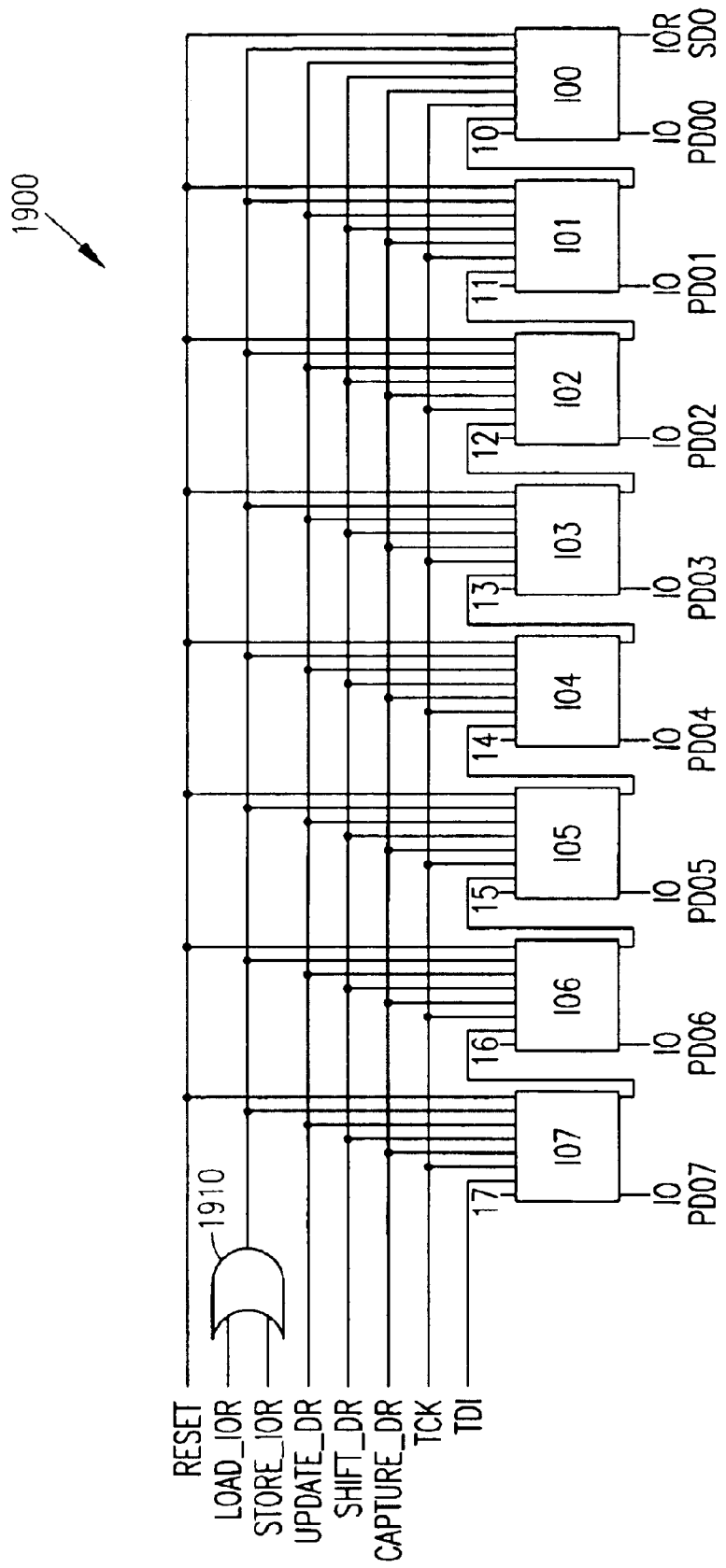
FIG. 25 is a block diagram of one embodiment of a SIC Input/Output register.

FIG. 25 is a block diagram of Input Output Register 1900, one embodiment of Input Output Register 534. Input Output Register 1900 comprises register bit macros IO0 through IO7. In one embodiment of Input Output Register 1900, the ports of the register bit macros provide communication paths for SIC signals. including the reset port for a RESET signal, the enable port for a signal from the output of OR gate 1910, the update port for an UPDATE_DR signal, the shift port for a SHIFT_DR signal, a capture port for a CAPTURE_DR signal and the clock port for a TCK signal. The output of OR gate 1910 is the result of performing an "or" Boolean function on logical values of LOAD_IOR signal and STORE_IOR signal. The SDI port of register bit macro IO7 provides a communication path for a TDI signal. The CDI port of register bit macros IO7 through IO0 are coupled to I7 through I0 signals respectively. The PDO ports of register bit macro IO7 through register bit macro IO0 output an IO_PDO7 signal through IO_PDO0 signal respectively. The SIO ports of register bit macro IO7 through register bit macro IO1 are coupled to the SDI ports of register bit macro IO6 through register bit macro IO0 respectively. The SDO port of register bit macro IO0 outputs an IOR_SDO signal.

Input/Output Selection Circuit

Figure 26:
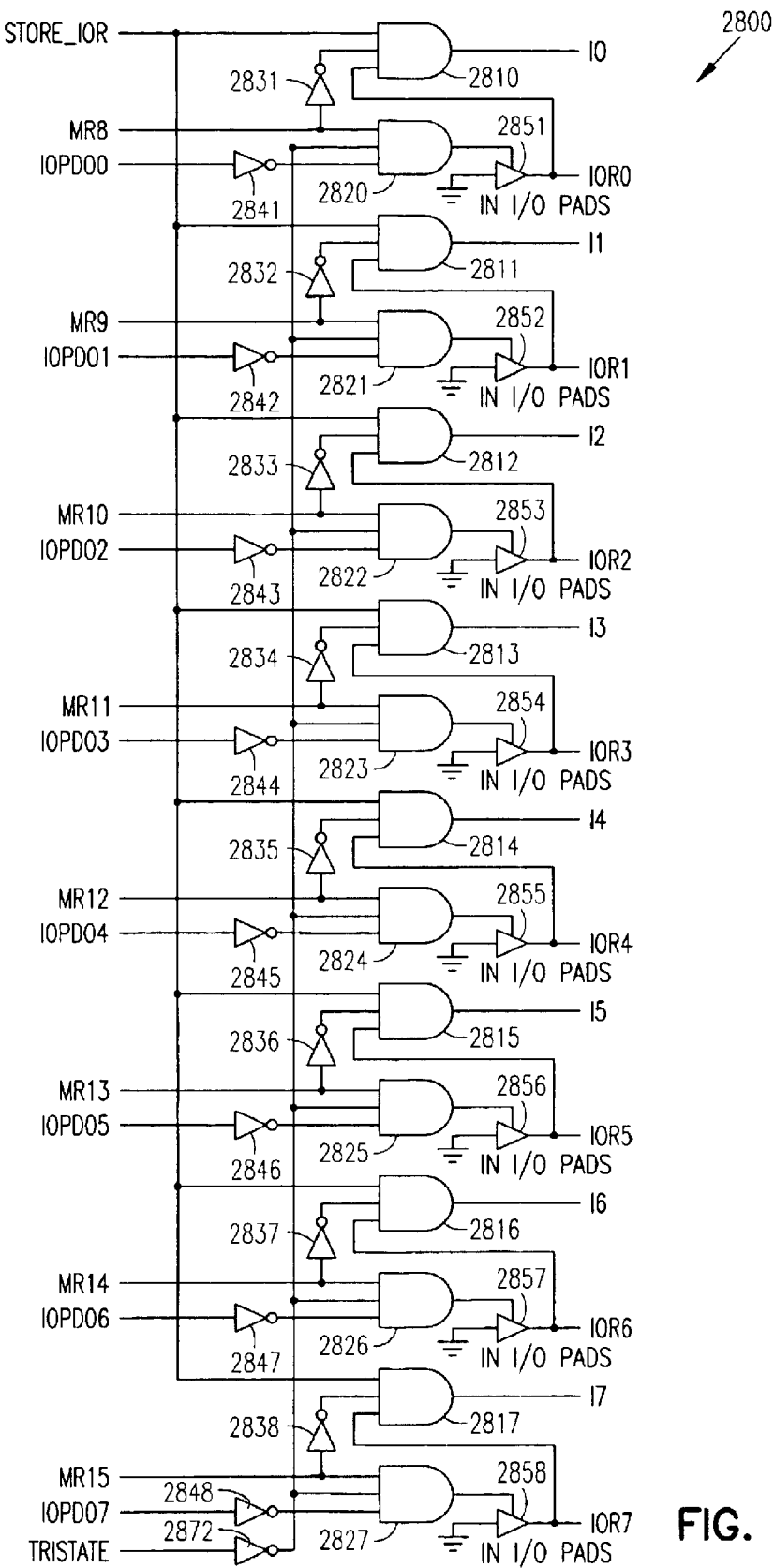
FIG. 26 is a schematic of an Input/Output selection circuit included in one embodiment of the present invention.

Input/Output selection circuit 517 performs a bi-directional selection of input or output mode. FIG. 26 is a schematic of Input/Output selection circuit 2800, one embodiment of input output selection circuit 517. Input/Output selection circuit 2800 comprises Input/Output selection AND gates 2810 through 2827, Input/Output selection inverters 2831 through 2848, and 2872, and Input/Output selection tri-state gate ("I/O pads") 2851 through 2858. Input/Output selection inverter 2872 is coupled to Input/Output selection AND gates 2810 through 2827. Input/Output selection AND gates 2820 through 2817 are coupled to Input/Output selection inverters 2831 through 2838, respectively. Input/Output selection AND gates 2820 through 2827 are coupled to Input/Output selection inverters 2841 through 2848, respectively. Input/Output selection AND gates 2820 through 2827 are coupled to Input/Output selection tri-state gates ("I/O pads") 2851 through 2858.

In one embodiment of the present invention, Input/Output selection circuit 517 performs a bi-directional input output selection based on mode register 537 bits MR15:8. If a mode register bit MR15:8 is set to a logical 1 value the corresponding Input/Output port is defined as a pseudo OC output and the corresponding input to Input/Output register 534 is forced to a logical 0 value. If a mode register bit MR15:8 is reset, (e.g., a logical 0 value is the reset state) the corresponding Input/Output port is defined as an input and presents the value at the Input/Output port to Input/Output register 534 during a CAPTURE_DR TAP controller state of the STORE_IOR instruction where it is shifted out during the SHIFT_DR TAP controller state.

NIC Control Register

NIC Control Register 542 stored information associated with NIC information recovery. In one embodiment of the present invention, NIC Control Register 542 includes thirty two Register Bit Macros. In one example of NIC control register 542, the SIC reads the contents of the NIC device, and the board type, revision level and serial number are extracted. The SIC test software utilizes the NIC information to automatically configure itself rather than needing to be provided this information or empirically extracting the information.

In one embodiment of the present invention NIC Control Register 542 is enabled with the decode of the LOAD_NCR instruction in instruction register 533. NIC Control Register 542 captures the DATA_OUT interface from the NIC Sequence Block into bits 19:0 during the CAPTURE_DR TAP controller state. Additionally, the current contents of the NIC Control Register bits 29:28 and 26:20 are captured during the CAPTURE_DR TAP controller state and shifted out during the SHIFT_DR TAP controller state. NIC control register bits: 31:30 and 27 capture the fixed value of 0 and are shifted out during the SHIFT_DR TAP controller state. (See FIG. 27).

NIC control register bits 29:28 hold the encoded selection value of which 1 of 4 Micro LAN IN/OUT pins are enabled. NIC control register bit 27 is the write enable bit and must be set during all of the operations that write to the NIC Sequence block. (It deliberately captures a 0 value to prevent writing the NIC Control block when shifting out the contents of the NIC Control Register.) NIC control register bits 26:20 hold the value one less than the number of microseconds between rising edges of the TCK signal. NIC control register bits 19:10 hold the Bus Master pulse duration in microseconds. NIC control register bits 9:2 hold the sampling offset relative to de-assertion of the of the Bus Master strobe in microseconds. (There is no sampling done if the value is 0.) NIC control register bit 1 is the Sample Data Valid bit which is asserted (high) when the data has been sampled by the Bus Master. NIC control register bit 0 is the sampled data.

Figure 27:
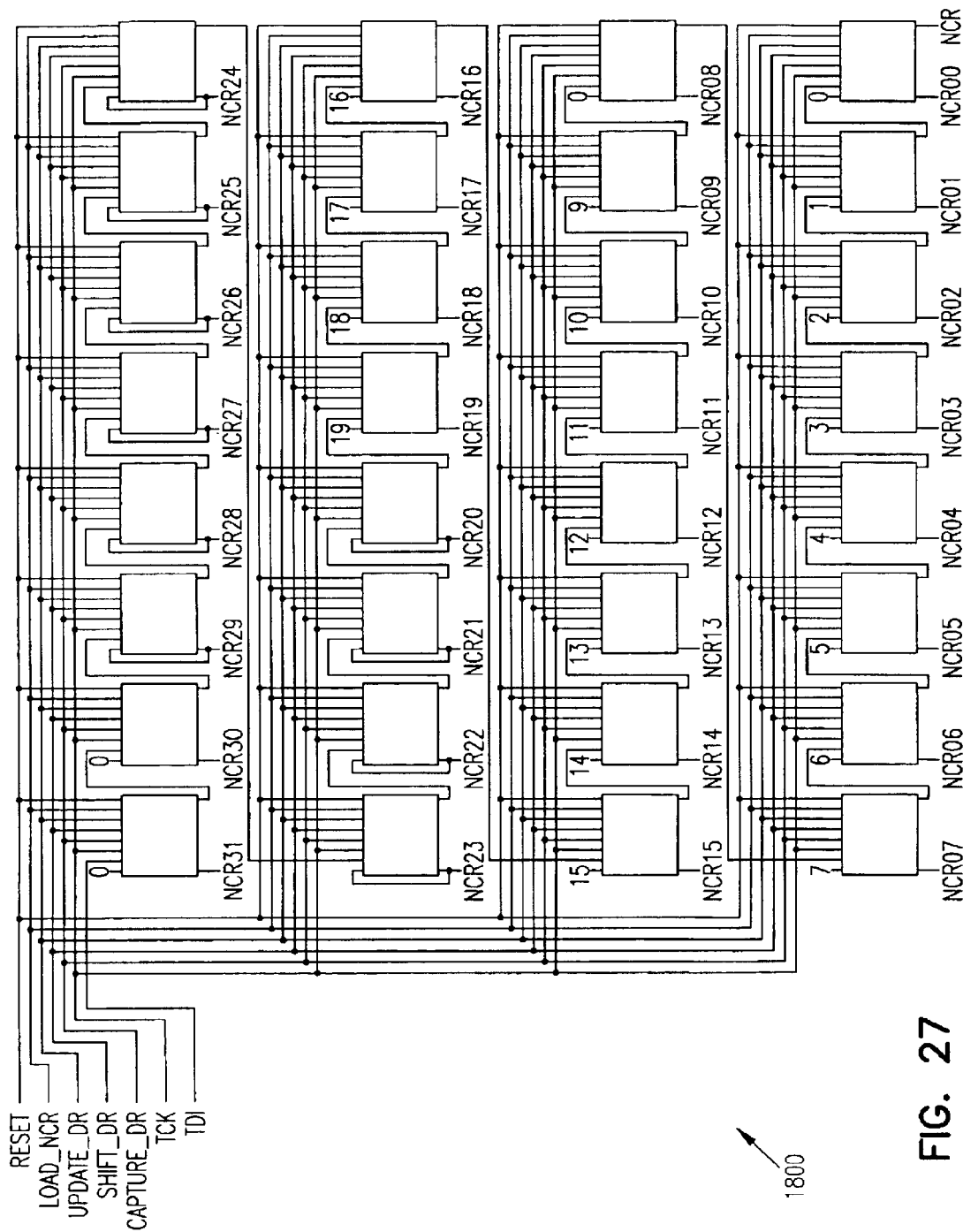
FIG. 27 is a block diagram of one embodiment of a SIC NIC control register.

FIG. 27 is a block diagram of NIC Control Register 1800, one embodiment of NIC Control Register 542. NIC Control Register 1800 comprises register bit macros NCR00 through NCR31. In one embodiment of NIC Control Register 1800, the ports of the register bit macros provide communication paths for SIC signals, including the reset port for a RESET signal, the enable port for a LOAD_NCR signal, the update port for an UPDATE_DR signal, the shift port for a SHIFT_DR signal, a capture port for a CAPTURE_DR signal and the clock port for a TCK signal. The SDI port of register bit macro NCR31 provides a communication path for a TDI signal. The CDI port of register bit macros NCR31, NCR30 and NCR27 are coupled to logic 0 values. The CDI port of register bit macros NCR29, NCR28 and NCR26 through NCR 20 are coupled to the PDO ports of NCR29, NCR28 and NCR26 through NCR 20 respectively. The CDI port of register bit macros NCR19, through NCR00 are coupled to DO19 through DO00 signals respectively. The PDO ports of register bit macro NCR31 through NCR00 output an NCR31 signal through NCR00 signal respectively. The SDO ports of register bit macro NCR31 through register bit macro NCR01 are coupled to the SDI ports of register bit macro NCR30 through register bit macro NCR00 respectively. The SDO port of register bit macro NCR00 outputs an NCR_SDO signal.

NIC Sequence Circuit

Figure 28A:
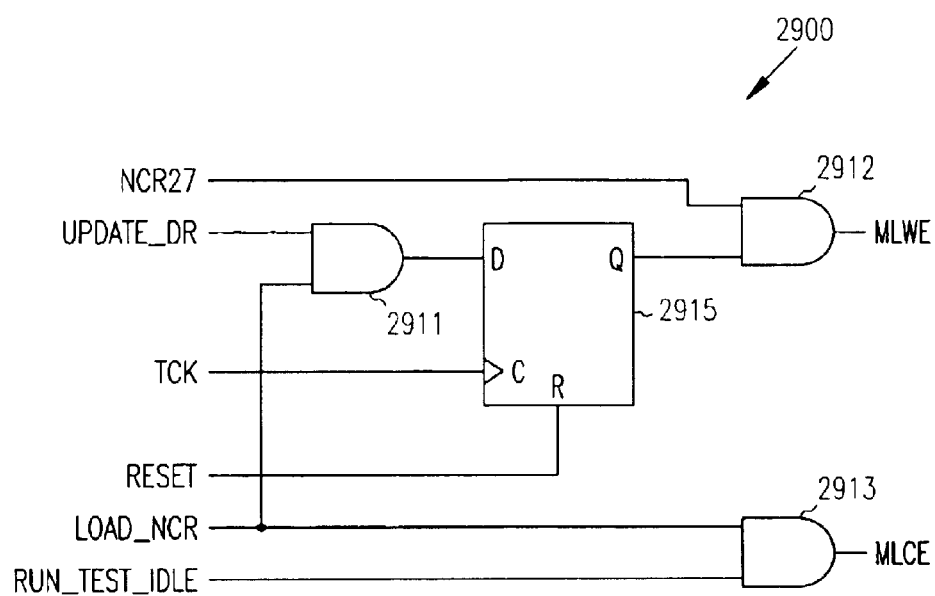
FIG. 28A is schematic of one embodiment of a SIC NIC sequence circuit.
Figure 28B:
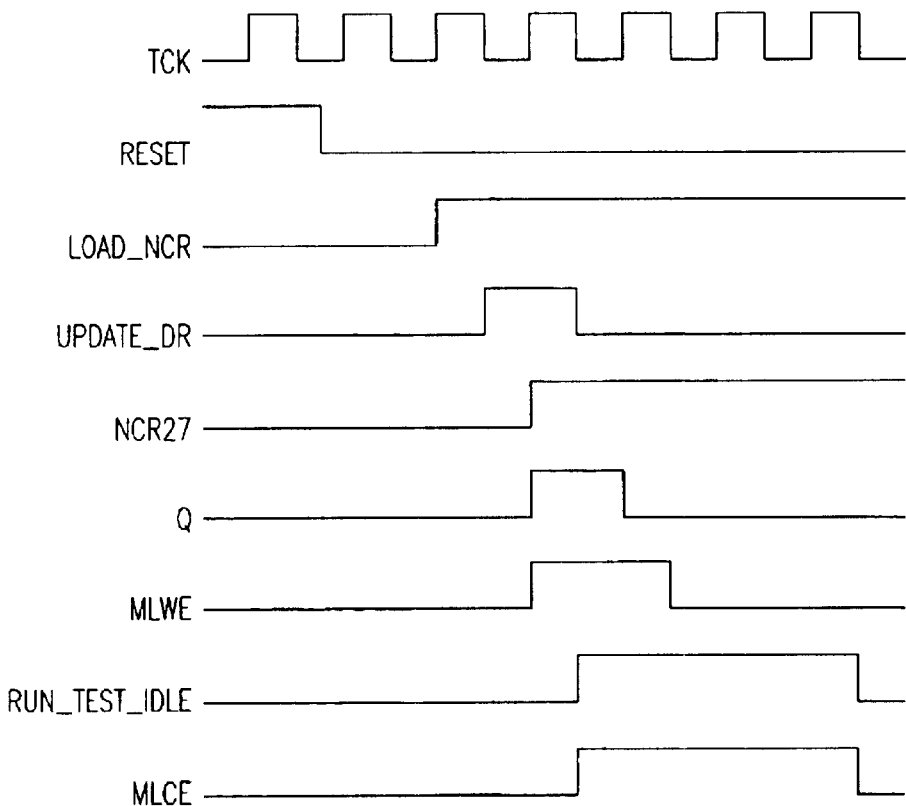
FIG. 28B is a timing diagram for a SIC NIC sequence circuit.

NIC sequence circuit 543 provides sequencing control for retrieval of NIC information associated with components included on a board SIC 500 services. FIG. 28A is schematic of NIC sequence circuit 2900, one embodiment of NIC sequence circuit 543. NIC sequence circuit 2900 comprises NIC sequence circuit AND gates 2911 through 2913 and NIC sequence circuit D flip-flop 2915. NIC sequence circuit D flip-flop 2915 is coupled to NIC sequence circuit AND gates 2912 and 2911 which is coupled to NIC sequence circuit AND gate 2913. NIC sequence circuit AND gate 2911 performs a Boolean "and" function on logical values of signals UPDATE_DR and LOAD_NCR. The output of NIC sequence circuit AND gate 2911 is latched in NIC sequence circuit D flip-flop 2915. NIC sequence circuit AND gate 2912 performs a Boolean "and" function on logical value output of NIC sequence circuit D flip-flop 2915 and signal NCR27. NIC sequence circuit AND gate 2913 performs a Boolean "and" function on logical values of signals LOAD_NCR and RUN_TEST_IDLE. The output of NIC sequence circuit AND gate 2912 functions as a write enable and the output of NIC sequence circuit AND gate 2913 functions as a clock enable. FIG. 28B is a timing diagram for NIC sequence circuit 2900.

In one embodiment of the present invention, NIC information is stored in a memory device. NIC sequence circuit 543 interfaces with the memory device through a NIC memory interface circuit. In one embodiment of the present invention NIC sequence circuit 543 generates a write enable and clock enable for the NIC sequence circuit 2900. In one embodiment of the present invention the NIC memory interface circuit interfaced with a Microlanυ interface. This interface operates by the memory device bus master driving the interface wire low for specified periods of time to signal the device to perform its various functions. The logic block to implement this protocol therefore asserts a logical zero value on the interface for different periods of time, tri-states the interface wire and then samples the state of the interface wire after different periods of time.

Figure 29:
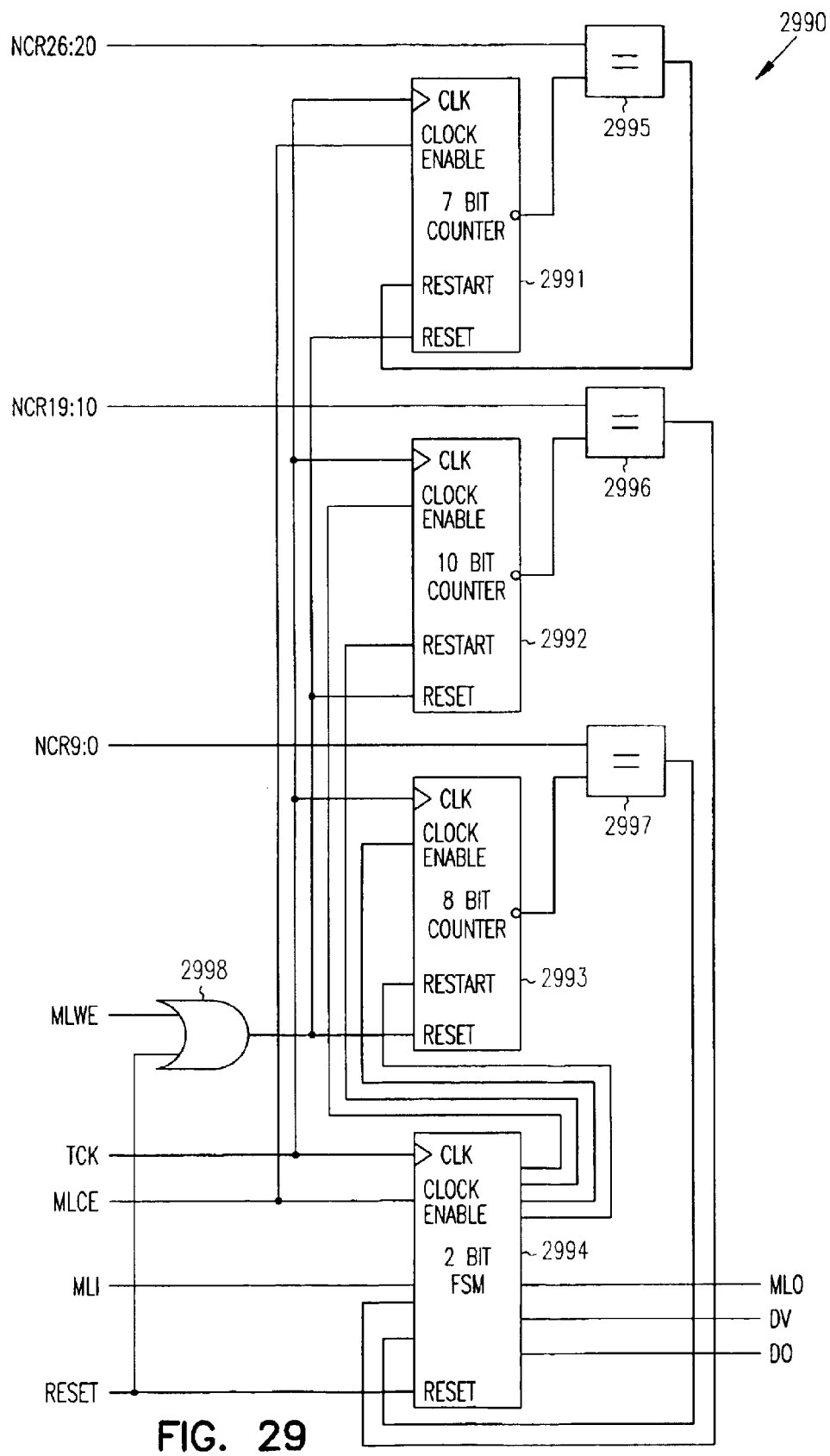
FIG. 29 is a functional block diagram of one embodiment of a present invention NIC memory interface circuit.

In one embodiment of the present invention NIC memory interface circuit is implemented with a finite state machine. For example, a NIC memory interface circuit interfacing with a Microlan™ block uses 2 bits for 4 fully decoded states (Idle, Bus Master, Sample Offset and Sample Data). FIG. 29 is a functional block diagram of Microlan™ NIC memory interface circuit 2990, one embodiment of a NIC memory interface circuit of the present invention. Microlan™ NIC memory interface circuit 2990 comprises NIC 7 bit counter 2991, NIC 10 bit counter 2992, NIC 8 bit counter 2993, NIC 2 bit finite state machine (FSM) 2994 equivalence logic 2995, 2996 and 2997, and write enable OR gate 2998. NIC 2 bit finite state machine (FSM) 2994 is coupled to NIC 7 bit counter 2991, NIC 10 bit counter 2992, NIC 8 bit counter 2993, and equivalence logic 2995, 2996 and 2997, and write enable OR gate 2998. NIC 7 bit counter 2991 divides the input TCK down to 1 μs. NIC 10 bit counter 2992 counts the number of micro seconds the Microlan™ interface wire is low. NIC 8 bit counter 2993 counts the number of micro seconds to delay before sampling the Microlan™ interface wire. Each counter is clocked with the positive edge of TCK and has a positive clock enable, a positive synchronous restart and a positive asynchronous reset.

NIC Selection Circuit

Figure 30:
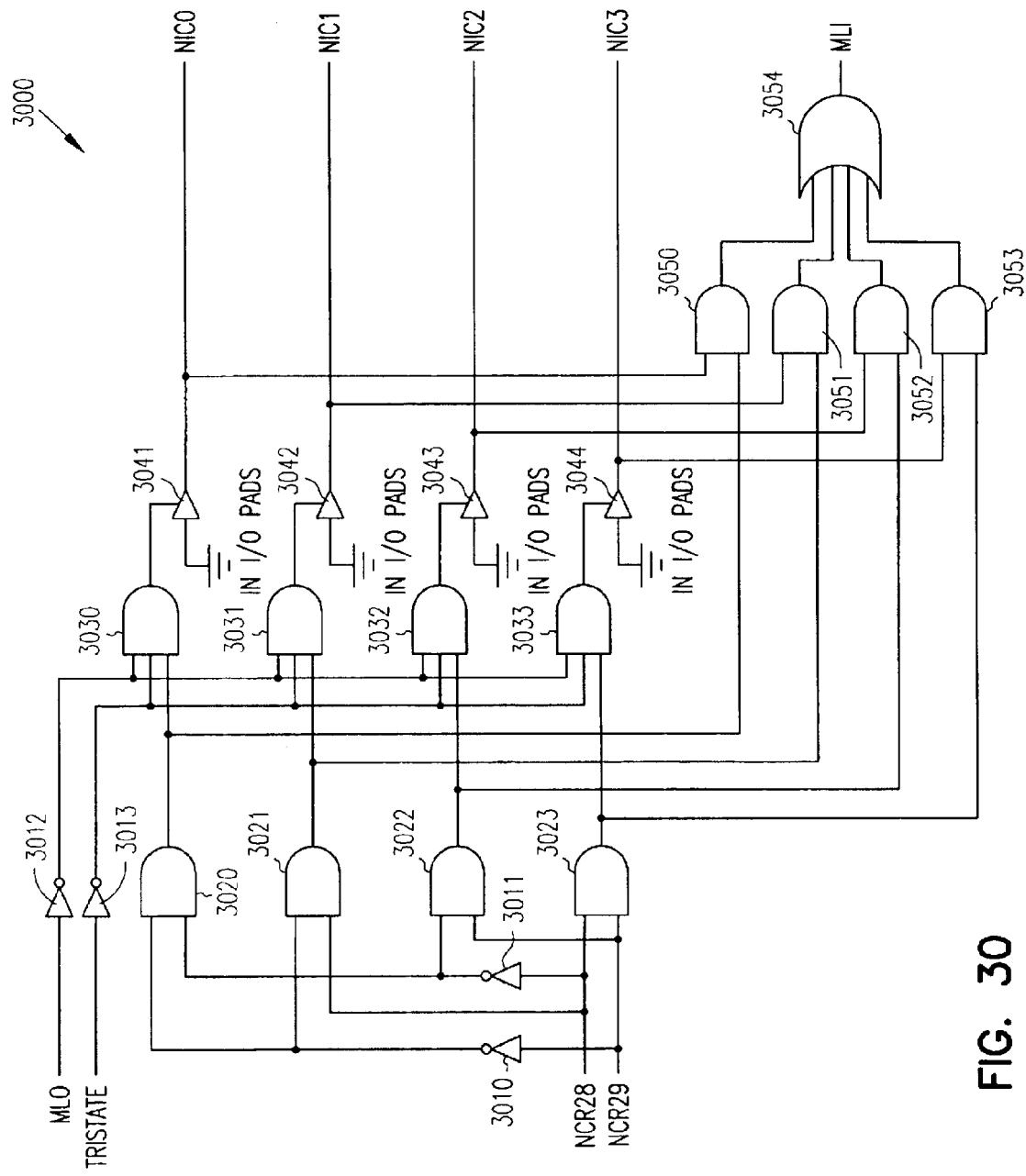
FIG. 30 is a schematic of a NIC selection circuit included in one embodiment of the present invention.

NIC selection circuit 544 selects a NIC port of scan chain interface 555. NCR bits 29:28 encode to select one of four pins (NIC3:0) to the NIC selection circuit 544. FIG. 30 is a schematic of NIC selection circuit 3000, one embodiment of NIC selection circuit 544. NIC selection circuit 3000 comprises NIC selection circuit input inverters 3010 through 3013, NIC selection circuit input AND gates 3020 through 3023, NIC selection circuit output AND gates 3030 through 3033, NIC selection circuit tri-state gate (I/O pads) 3041 through 3044, NIC selection circuit MLI AND gates 3050 through 3053 and NIC selection circuit MLI OR gate 3054. NIC selection circuit input AND gates 3020 through 3023 are coupled to NIC selection circuit output AND gates 3030 through 3033 which are coupled to NIC selection circuit tri-state gates (I/O pads) 3041 through 3044 and NIC selection circuit input inverters 3012 and 3013 respectively. NIC selection circuit input inverters 3010 is coupled to NIC selection circuit input AND gates 3020 and 3021. NIC selection circuit input inverters 3011 is coupled to NIC selection circuit input AND gates 3020 and 3022. NIC selection circuit output AND gates 3030 through 3033 are coupled to NIC selection circuit MLI AND gates 3050 through 3053 respectively. NIC selection circuit MLI AND gates 3050 through 3053 are coupled to NIC selection circuit MLI OR gate 3054.

Debug Select Circuit

Figure 31:
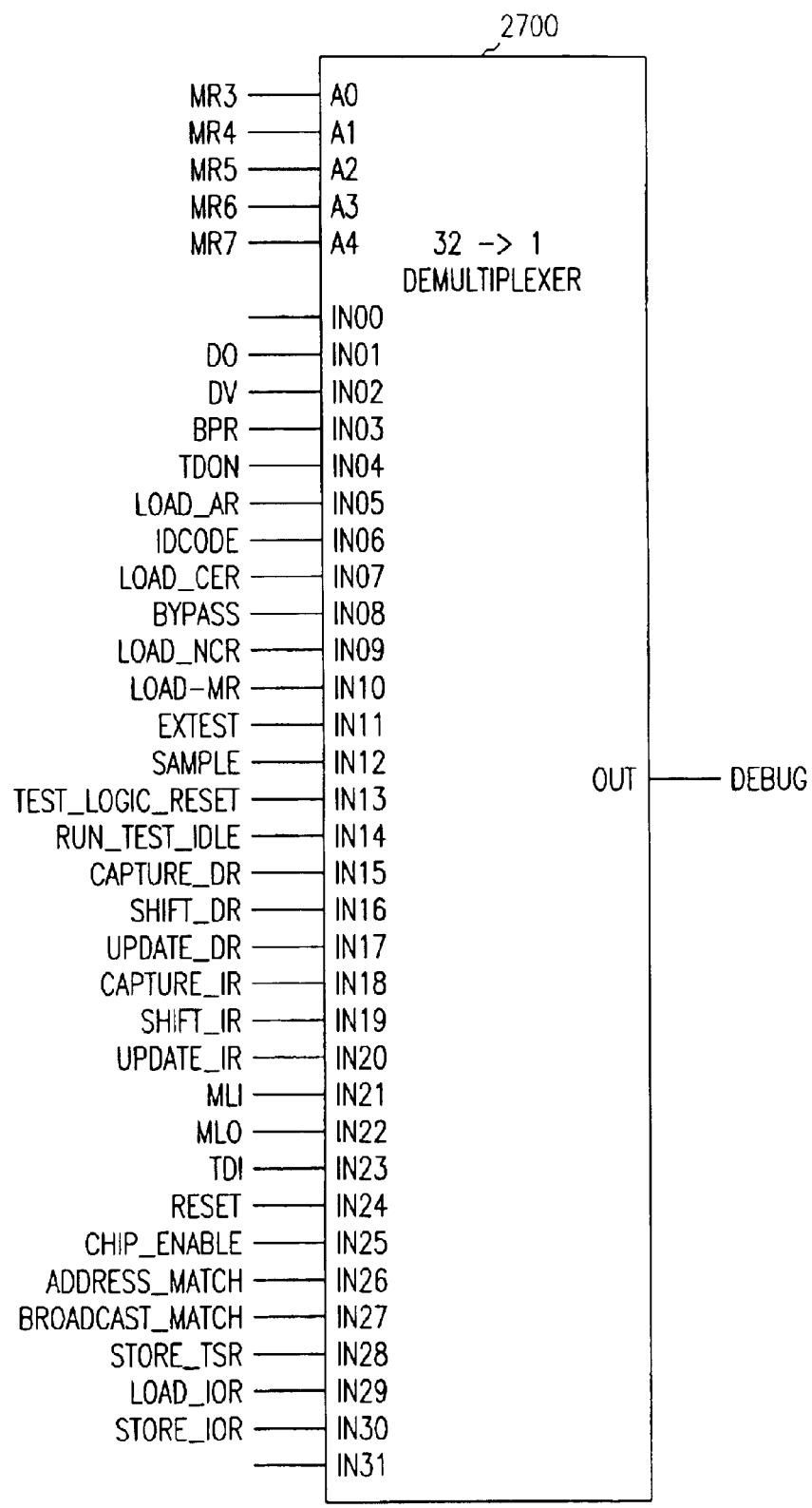
FIG. 31 is a block diagram of a SIC debug selection circuit.

FIG. 31 is a block diagram of debug selection circuit 2700, one embodiment of a debug selection circuit included in SIC 500. Debug selection circuit 2700 selects an internal SIC signal for transmission via debug port 558. The debug selection is accomplished by decoding mode register 537 bits MR7:3 to select one of 31 different internal signals in the SIC and driving it out on debug port 558. FIG. 32 is a debug select decode table 3200 of one embodiment of the present invention. Debug select decode table 3200 illustrates the correspondence between mode register 537 bits MR7:3 and a debug signal included in one embodiment of the present invention.

TAP State Register

Figure 21A:
FIG. 21A is a table of TAP state decodes for one embodiment of the present invention.

TAP state register 541 tracks the TAP state for scan test chains. In one embodiment of the present invention TAP state register 541 is implemented with 16 register bit macros and is enabled with the decode of the STORE_TSR instruction in the instruction register. TAP state register 541 captures the current contents of the TAP state for scan test chains during the CAPTURE_DR TAP controller state and shifts them out during the SHIFT_DR TAP controller state. In one embodiment of the present invention, the TSR15:0 outputs of the TAP state register do not perform any function on the SIC and therefore, it does not matter what the shifted in data is. The purpose of the TAP state register is to capture the current state of each of the individual chain TAP controllers. This is accomplished in the SIC by adding a scan test chain duplicate TAP controller for every scan test chain and monitor the TAP controller state for each scan test chain. The TAP controller state is captured in the TAP state register and shifted out during the STORE_TSR instruction. The TAP controller state for a first scan test chain is captured in TAP state register 541 bits 3:0, the TAP controller state for a second scan test chain is captured in TAP state register 541 bits 7:4, the TAP controller state for a third scan test chain is captured in TAP state register 541 bits 11:8 and the TAP controller state for a forth scan test chain is captured in TAP state register 541 bits 15:12. The TAP state decodes for one embodiment of coded TAP state signals of the present invention are shown in FIG. 21A.

Figure 33:
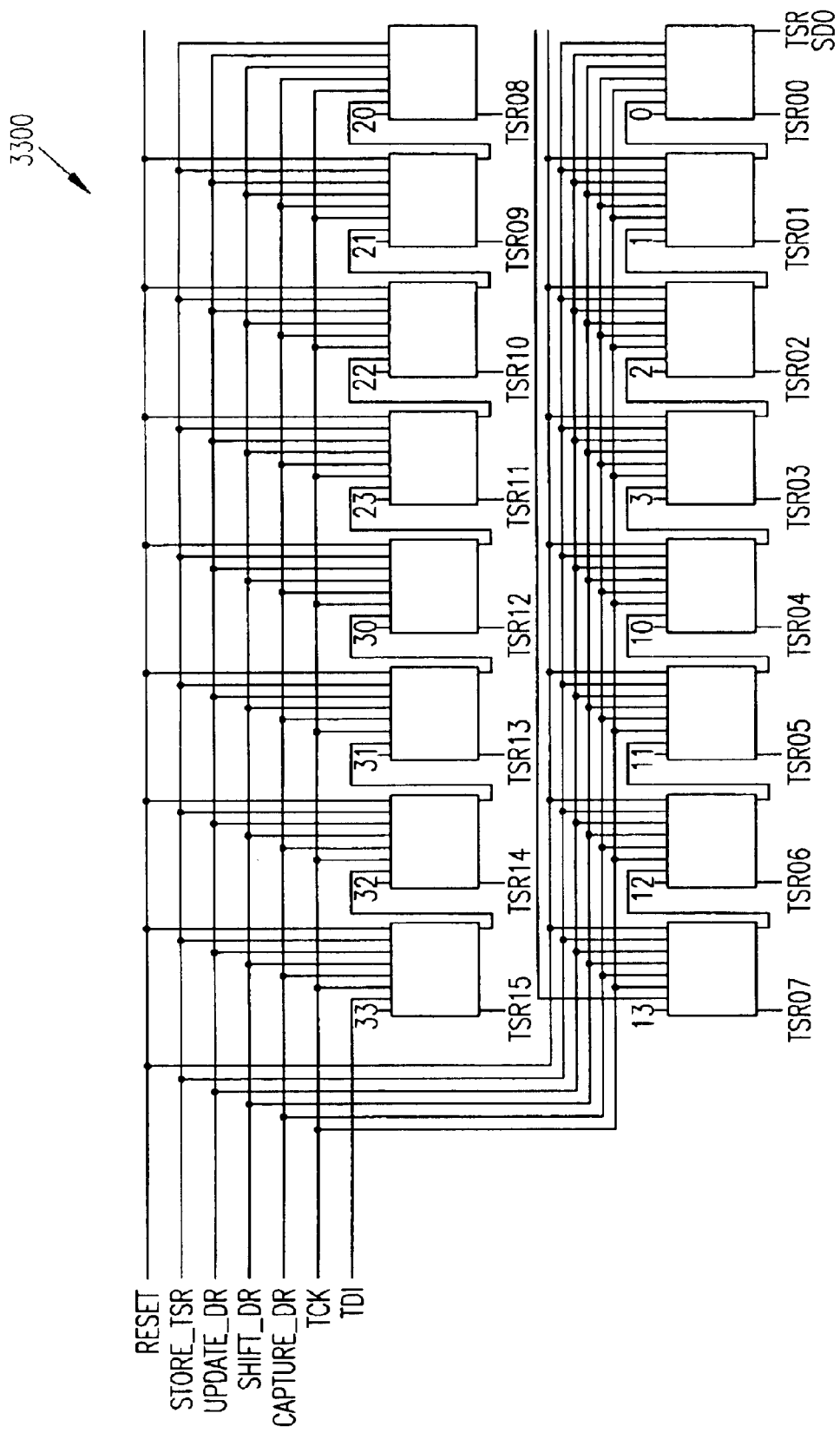
FIG. 33 is a block diagram of one embodiment of TAP State Register of the present invention.

FIG. 33 is a block diagram of TAP State Register 3300, one embodiment of TAP state register 541. TAP state register 3300 comprises register bit macros TSR00 through TSR15. In one embodiment of TAP state register 3300, the ports of the register bit macros provide communication paths for SIC signals, including the reset port for a RESET signal, the enable port for a STORE_TSR signal, the update port for an UPDATE_DR signal, the shift port for a SHIFT_DR signal, a capture port for a CAPTURE_DR signal and the clock port for a TCK signal. The SDI port of register bit macro TSR15 provides a communication path for a TDI signal. The CDI port of register bit macros TSR15 through TSR08 are coupled to TS33 through TS20 and the CDI port of register bit macros TSR07 through TSR00 are coupled to TS13 through TS00. The PDO ports of register bit macro TSR15 through register bit macro TSR00 output an TSR15 signal through TSR00 signal respectively. The SDO ports of register bit macro TSR15 through register bit macro TSR01 are coupled to the SDI ports of register bit macro TSR14 through register bit macro TSR00 respectively. The SDO port of register bit macro TSR00 outputs an TSR_SDO signal.

Special Scan Test Support Signals

One embodiment of the present invention provides special scan test support signals. The special scan test support signals are utilized to facilitate adjustments for special scan test characteristics of devices included in a scan test chain. For example, special scan test support signals are utilized to make adjustments for non standard IEEE 1149.1 JTAG devices or external scan test enablement. The TCEN ports of a SIC provide a communication port for special scan test support signals. In one exemplary embodiment of the present invention, signals TCEN0 through TCEN3 are active low outputs from SIC 500 and are included as compliance facilitating signals for scannable devices (not shown) or enable facilitating signals for scan devices that require external stimulus to enable their scan functions. In one exemplary implementation of the present invention, a special scan test support signal (e.g., TCEN) is coupled to a pin of a downstream device that is required to be a certain logical value before the downstream device responds to scan test operations. In one embodiment of the present invention, the TCEN signals are inverted copies of the corresponding bit in the chain enable register.

Figure 33A:
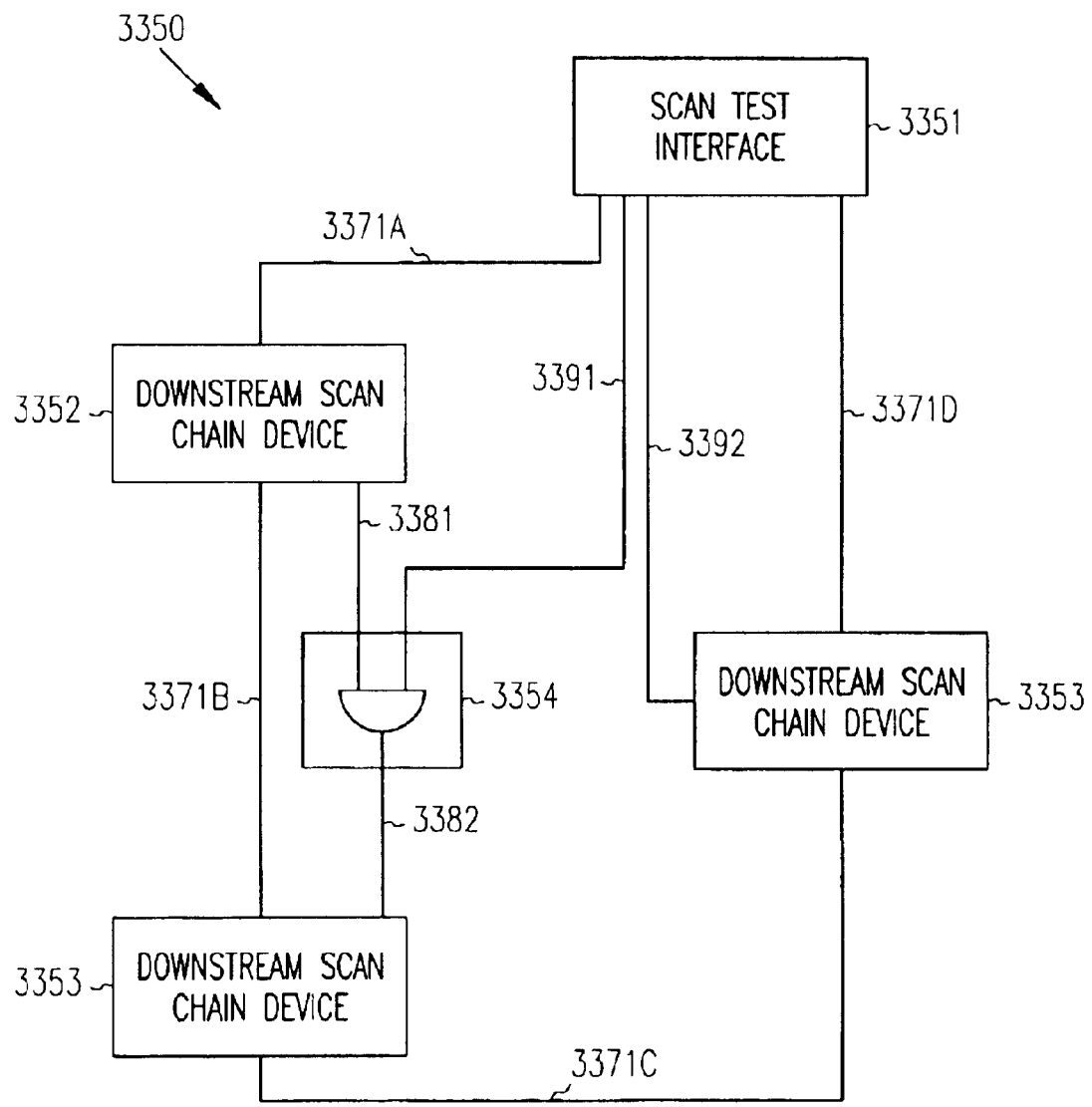
FIG. 33A is a block diagram of one embodiment of the present invention in which a TCEN signal is utilized to make adjustments for a non-standard IEEE 1149.1 JTAG device.

FIG. 33A is an block diagram of one embodiment of the present invention in which a TCEN signal is utilized to make adjustments for a non standard IEEE 1149.1 JTAG device. Non standard downstream devices 3352, 3353 and 3355 are downstream devices in a scan test chain of scan test interface (e.g., a SIC ) 3351. Scan test interface (e.g., a SIC ) 3351 communicates scan test chain signals (e.g., TDI, TDO, TMS, TCK, etc.) via scan test chain bus segments 3371A, 3371B, 3371C and 3371D. Downstream device 3353 relies upon a single downstream device reset signal 3382 to provide both normal operation functional resets and scan test resets and does not include a dedicated pin for a JTAG TRSTN signal. Special compliance scan test circuit 3354 (e.g., an AND gate) responds to special scan test support signal TCEN 3391 and controls whether downstream device reset signal 3382 matches the logical value of reset signal 3381 or is maintained at a predetermined logical value during scan testing that does not "break" the scan test chain (e.g., reset a TAP controller of downstream device 3353). Thus, downstream device 3353 is reset based upon reset signal 3381 during normal non scan test operations and is not reset during scan test operations unless permitted by TCEN signal 3391. Downstream device 3355 includes a dedicated scan test enable pin and requires assertion of a scan test enable signal. Special scan test support signal TCEN 3392 functions as a dedicated scan test enable signal for downstream device 2255.

Internal SIC Test Logic

Figure 34:
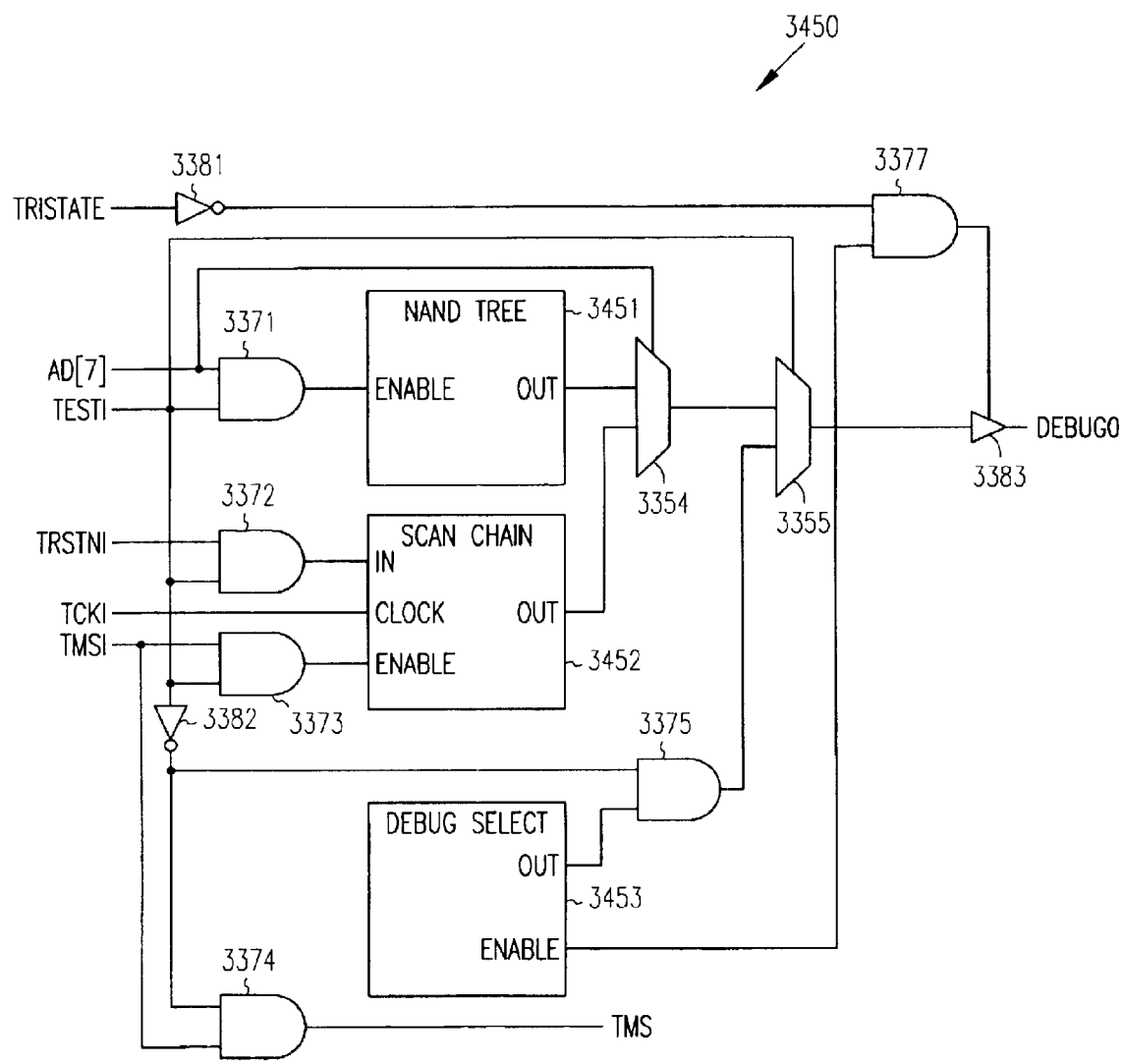
FIG. 34 is a schematic of one embodiment of internal SIC test logic of the present invention.

In one embodiment of the present invention SIC 500 implements both full scan and an input NAND tree in order to perform internal SIC testing functions. In one embodiment of the present invention neither the full scan nor NAND tree functions are accessible at the system level. The functions of several of SIC pins are overloaded in order to implement the testing features in one embodiment of the SIC. The TESTI pin controls the mode between functional and test operations. When a TESTI signal is asserted (e.g., high) the SIC is in test mode. When the TESTI signal is deserted (e.g., low) the SIC is in functional mode. While in test mode the AD[7] pin controls the mode between scan test chain and NAND tree operations and AD[7] pin therefore does not participate in the NAND tree. FIG. 34 is a schematic of one embodiment of internal SIC test logic of the present invention.

Scan Test Interface Method

Figure 35:
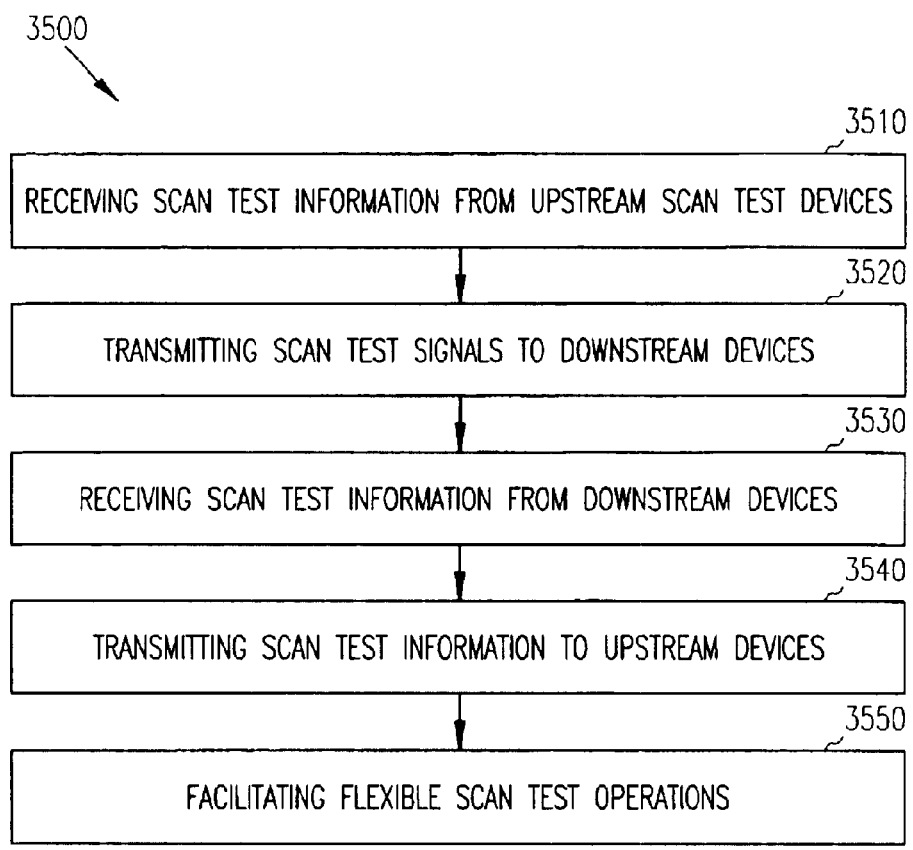
FIG. 35 is a flow chart of one embodiment of a scan test interface method.

FIG. 35 is a flow chart of scan test interface method 3500, one embodiment of the present invention. Scan test interface method 3500 is a method of interfacing scan test signals between upstream scan test devices and downstream scan test devices. In one embodiment of the present invention, the downstream devices are included on a PCB. In one embodiment of the present invention, scan test interface method 3500 is implemented on a scan test interface comprising a SIC. In one embodiment of the present invention, scan test interface method 3500 provides flexible configuration and communication of scan test signals. Scan test interface method 3500 includes numerous features that facilitate efficient and effective scan testing operations. For example, one embodiment of the present invention includes support for multiple subordinate scan test chains, expedient programming characteristics, downstream device accommodations, and scan test information recovery attributes.

In step 3510, scan test information is received from upstream scan test devices. In one embodiment of the present invention, scan test information received from upstream scan test devices includes IEEE 1149 JTAG compliant signals (e.g., TDI, TDO, TCKS, TMS and TRST). In one exemplary implementation of the present invention, step 3510 includes a program instruction or initiation signal (e.g., a PSI signal) that puts a scan test interface (e.g., a SIC) in a mode that permits the scan test interface to be programmed. In one embodiment of scan test interface method 3500, a scan test interface receives scan test information from a scan test controller via a multi-drop communication system comprising a plurality of scan test interfaces.

Figure 36:
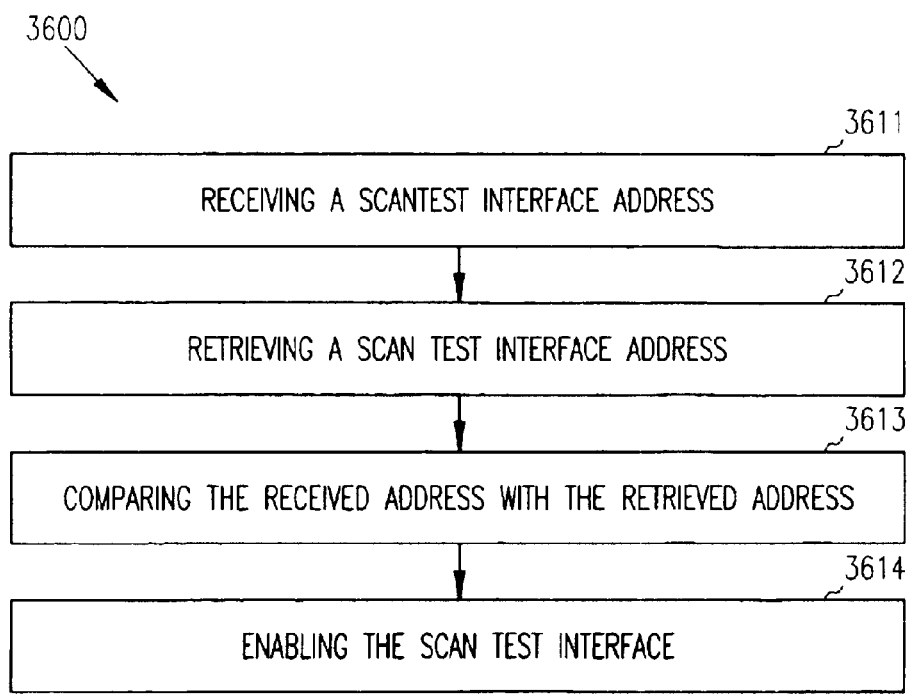
FIG. 36 is a flow chart of a system scan test communication initiation process included in one example of a scan test interface method.

In one embodiment of the present invention, step 3510 includes a scan test interface communication initiation process. FIG. 36 is a flow chart of a scan test interface communication initiation process 3600 included in one example of scan test interface method 3500. In step 3611 an address of a scan test interface is received by a scan test interface (e.g., on address interface 522). The address identifies a scan test interface, for example by the location of the scan test interface in a system (e.g., a PCB slot address). In step 3612 an address identifying the scan test interface is retrieved (e.g., from a location remote from the scan test interface such as a system memory, static signals on a PCB or from a location included in the scan test interface such as a register). In step 3613 the received address is compared to the retrieved address (e.g., by address compare circuit 523). In step 3614 the scan test interface is enabled to participate in scan test operations (including communication to and from upstream scan test devices) if the retrieved address and the received address are the same.

There are a variety of methods in which scan test interface method 3500 enables a scan test interface. In one embodiment of the present invention, scan test interface method 3500 enables a scan test interface by permitting scan test signals to be communicated via the scan test interface. For example, permitting transmissions from a selected scan test interface to upstream scan test devices and preventing transmissions from non selected devices. In one embodiment of the present invention, scan test interface method 3500 also permits internal scan test interface circuits to function. In one embodiment of the present invention, the scan test interface is a SIC and enabling a SIC enables an instruction decode circuit (e.g., instruction decode circuit 515), a chain selection circuit(e.g., chain selection circuit 518), and a TDO output MUX control (e.g., MUX control 514).

In one embodiment of scan test interface method 3500, the scan test interface enable is set synchronously. In one exemplary execution of asynchronously resetting the scan test interface enable, scan test interface method 3500 utilizes a rising edge of a program signal (e.g., a PSI signal) to trigger an enable. In another example, scan test interface method 3500 utilizes a reset signal (e.g., a TRSTN signal) asserted (e.g., low) while the program scan interface signal is asserted (e.g., high) to reset a scan test interface enable. In one embodiment of the present invention, scan test interface method 3500 includes a scan test interface enable process. In one embodiment of scan test interface method 3500, the scan test interface enable process includes decoding an UPDATE_DR TAP controller state, decoding a LOAD_AR instruction in an instruction register, and after a predetermined number of clock cycles enabling the scan test interface if the received address matches that of the scan test interface or a broadcast address.

In step 3520 of scan test interface method 3500, scan test signals are transmitted to downstream devices. In one embodiment of step 3520, scan test interface method 3500 facilitates flexible configuration of scan test signals communicated to downstream scan test devices. In one embodiment of the present invention, scan test interface method 3500 provides programmatic control over subordinate scan test chain signals. In one embodiment of the present invention, scan test interface method 3500 supports scan testing of multiple subordinate scan test chains with a separate set of scan test signals to each downstream scan test chain. Supporting multiple scan test chains allows downstream devices (e.g., daughter boards) to be reconfigured easily. The downstream devices are separated into "addressable" scan test chains eliminating many problems associated with tracking numerous configuration combinations. Scan test interface method 3500 assists programmatic control of the scan test chain signals and facilitates scan testing of devices operating in different voltage and clock domains. In one embodiment of the present invention, the subordinate scan test chains are arranged according to voltage and clock domains. For example, devices operating in the same voltage and clock domains are included in the same scan test chain.

In one embodiment of the present invention, scan test interface method 3500 provides voltage "conversion" of signals associated with different scan test chains and concatenates scan test signals back together so that the scan test signals appear as one scan test chain to upstream scan test devices. Scan test interface method 3500 provides voltage conversion in one embodiment of the present invention by pulling up a signal to an appropriate voltage (e.g., a voltage that matches the scan test chain operation voltage). In one example, scan test interface method 3500 utilizes a pseudo OC output method to provide an appropriate voltage signal (e.g., a voltage that matches the downstream scan test chain operation voltage) to downstream scan test devices.

Figure 37:
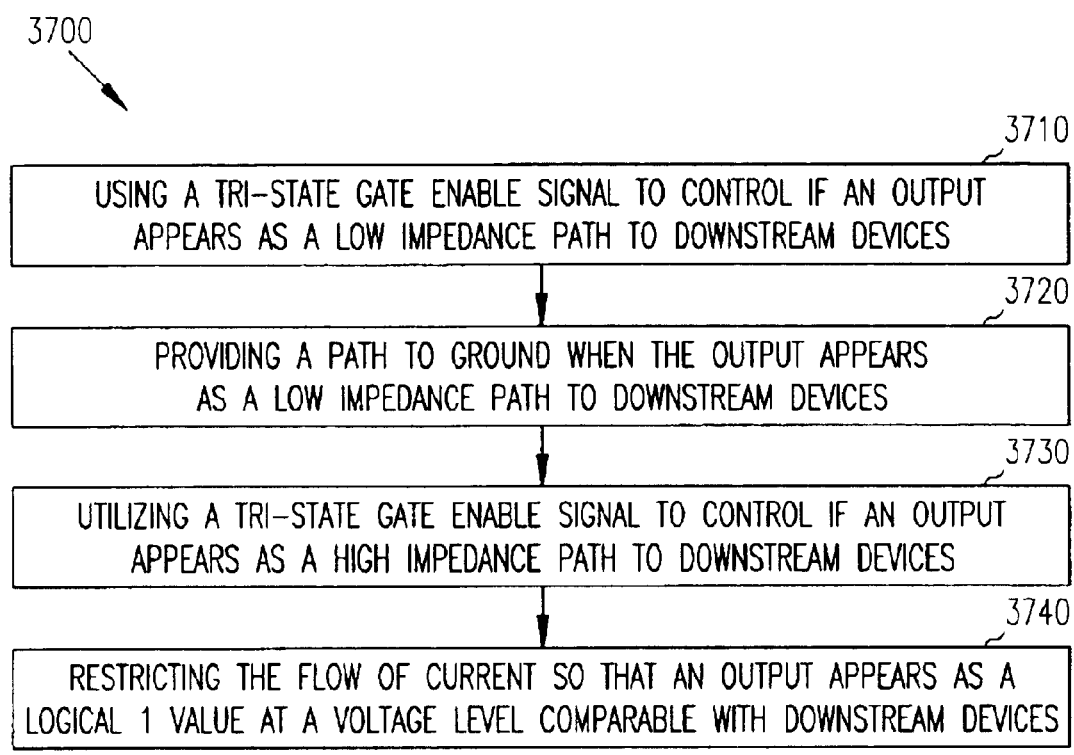
FIG. 37 is a flow chart of a pseudo OC output method according to one embodiment of the present invention.

FIG. 37 is a flow chart of pseudo OC output method 3700 included in step 3520 of one embodiment of scan test interface method 3500. In Step 3710 a tri-state gate (e.g., tri state gate 22) is used to control if an output appears as a low impedance path to downstream devices. In Step 3720 the output provides a path to ground and is a logical 0 value when the output appears as a low impedance to downstream devices. In Step 3730 a tri-state gate is utilized to control if an output appears as a high impedance path to downstream devices. In Step 3740 the high impedance restricts the flow of current so that the output is a logical 1 value at a voltage level compatible with downstream devices. In one embodiment of the present invention the output voltage level is from a voltage supply and pull up resistor coupled to a PCB serviced by scan test interface method 3500. In one embodiment of the present invention, pseudo OC output method 3700 utilizes a pseudo OC output (e.g., pseudo open collector (OC) tri-state circuit 20) that switches between a high impedance output and a logical 0 value (e.g., low voltage or ground).

Figure 38:
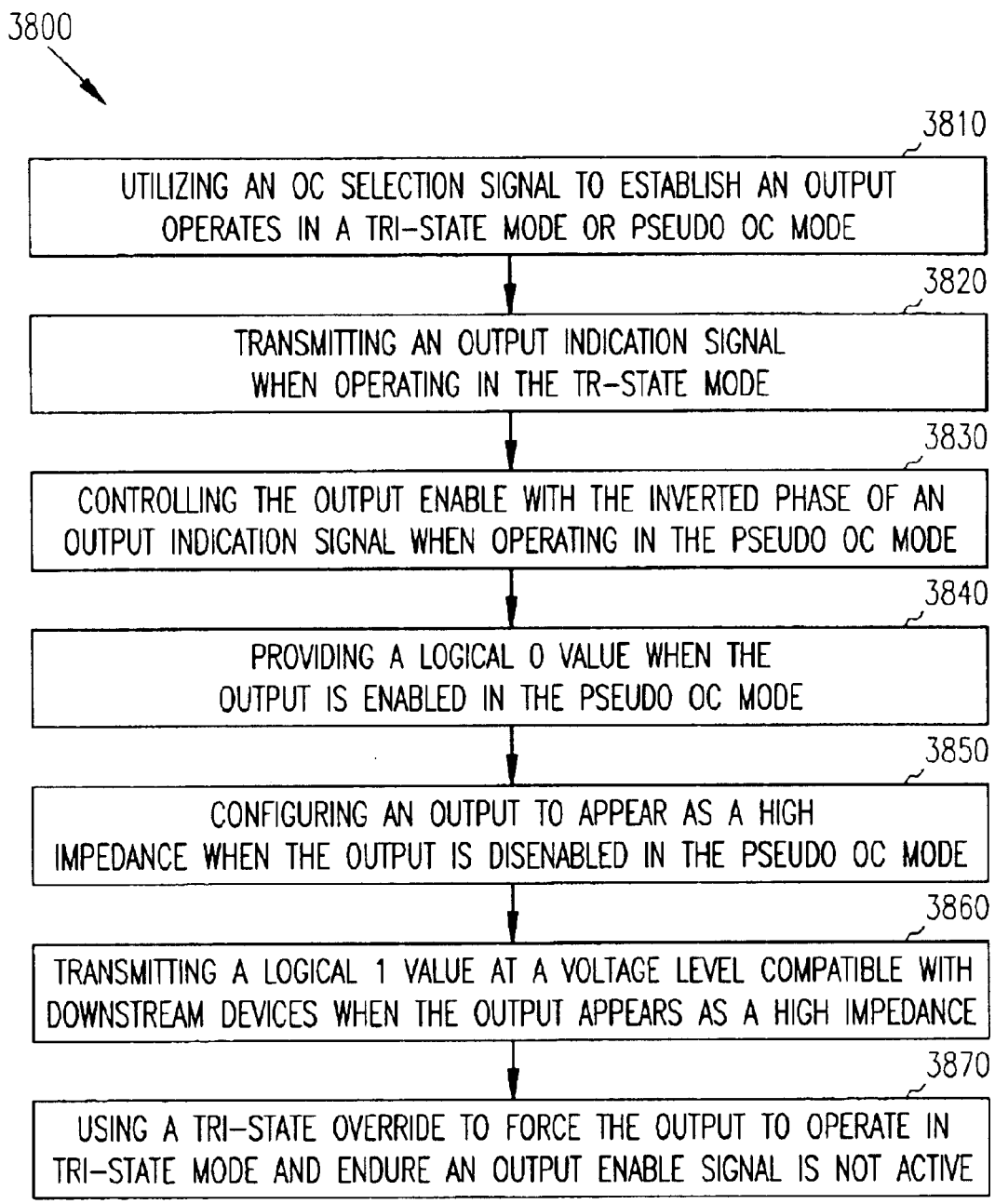
FIG. 38 is a flow chart of another embodiment of a present invention pseudo OC output method.

FIG. 38 is a flow chart of pseudo OC output method 3800 included in one embodiment of step 3520 of scan test interface method 3500. In Step 3810 an OC selection signal is utilized to establish if an output operates in a tri-state mode or pseudo OC mode. In Step 3820 an output indication signal is transmitted when operating in the tri-state mode. In Step 3830 the output enable is controlled with the inverted phase of an output indication signal when operating in the pseudo OC mode. In Step 3840 a logical 0 value is provided when the output is enabled in the pseudo OC mode. In Step 3850 an output is configured to appear as a high impedance when the output is disabled in the pseudo OC mode. In one embodiment of the present invention, a tri-state gate enable is controlled by a mode signal (e.g., an OC selection control signal), and an output indication signal. In Step 3860, a logical 1 value at a voltage level compatible with downstream devices is transmitted (e.g., from a voltage supply and pull up resistor coupled to a PCB) when the output appears as a high impedance. In Step 3870 a tri-state override is used to ensure an output enable signal is not active and forces the output to operate in tri-state mode.

Figure 39:
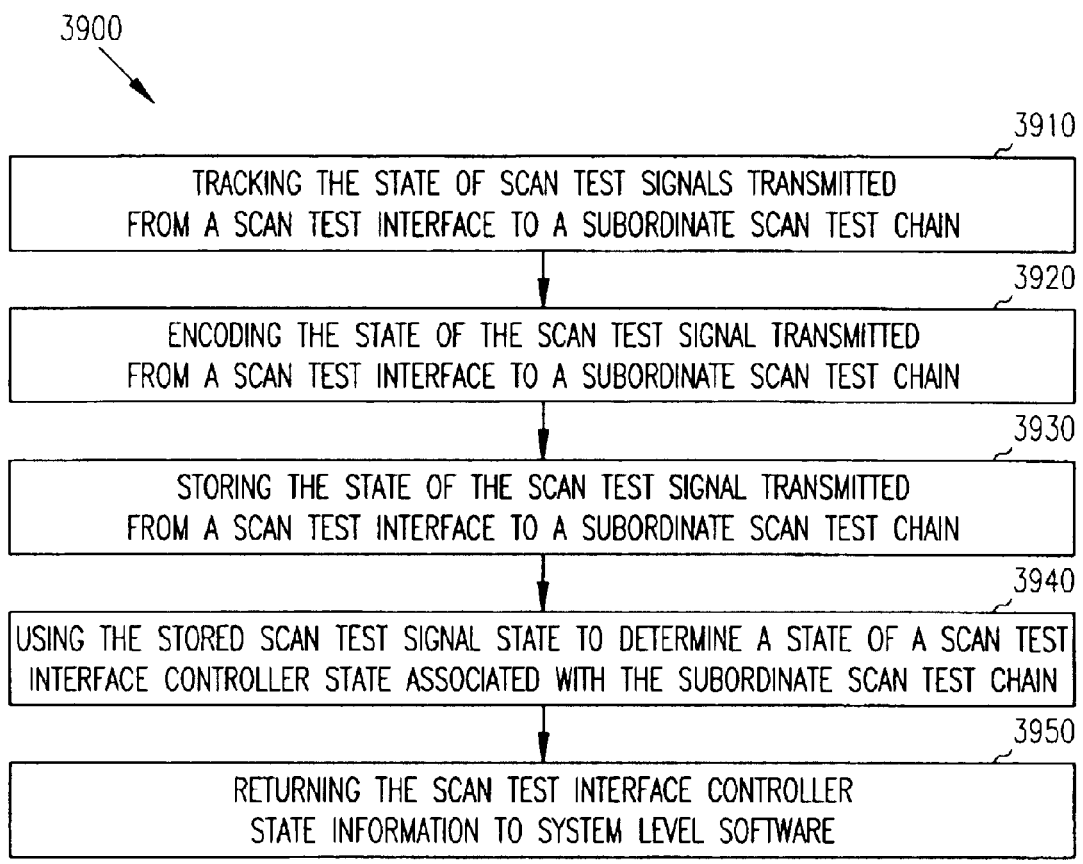
FIG. 39 is a flow chart of a scan test information recovery process included in one embodiment of the present invention.

One embodiment of scan test interface method 3500 step 3520 includes a scan test information recovery process for recovering the state of a scan test signal. In one exemplary implementation of the present invention the scan test recovery process facilitates multi-thread operations. FIG. 39 is a flow chart of scan test information recovery process 3900, one embodiment of the present invention. In step 3910, scan test information recovery process tracks the state of scan test signals transmitted from a scan test interface to a subordinate scan test chain. In one exemplary implementation of the present invention, scan test interface method 3500 utilizes a duplicate TAP controller (e.g., duplicate TAP controller 2310 shown in FIG. 21) to track the state of a primary TAP controller (e.g., TAP controller 511 in FIG. 5) and state of scan test chain signals. In step 3920 the state of a scan test signal transmitted from a scan test interface to downstream devices is encoded. The TAP state decodes for one embodiment of the present invention are shown in FIG. 21A. In step 3930, the state of a scan test signal transmitted from a scan test interface is stored. In one embodiment of the present invention, scan test information recovery process 3900 uses a TAP state register (e.g., TAP state register 541) to store the state of a duplicate TAP controller and scan test chain signals. In step 3940 the stored state of scan test signals are used to determine a scan test interface controller state associated with a subordinate scan test chain. Thus, the state of a duplicate TAP controller associated with a subordinate scan test chain is effectively preserved, even if operations associated with other scan test chains of the system inadvertently cause the primary TAP controller state to change. In Step 3950, scan test information recovery process 3900 returns the stored or saved scan test interface controller state information to system level software. In another embodiment of the present invention, scan test information recovery process 3900 returns the stored or saved scan test interface controller state information to the primary TAP controller.

In step 3530 scan test interface method 3500 receives scan test information from downstream devices. In one exemplary implementation of the present invention, scan test interface method 3500 receives a standard JTAG IEEE 1149 compliant TDO signal.

Scan test information is transmitted to upstream scan test devices in step 3540. For example, a standard JTAG IEEE 1149 compliant TDO signal is transmitted to upstream devices.

In step 3550, scan test interface method 3500 facilitates flexible scan test operations. In one embodiment of step 3550, scan test interface method 3500 facilitates expedient programming of a scan test interface (e.g., a SIC device). In one embodiment of step 3550, scan test interface method 3500 facilitates downstream device scan test compliance. In one embodiment of scan test interface method 3500, step 3550 includes providing general purpose Input/Output signals. In one embodiment of step 3550, scan test interface method 3500 automatically retrieves information regarding a PCB and determines the configuration of devices being scan tested.

In one embodiment of scan test interface method 3500, step 3550 includes a flexible scan test interface reset process.

Figure 40A:
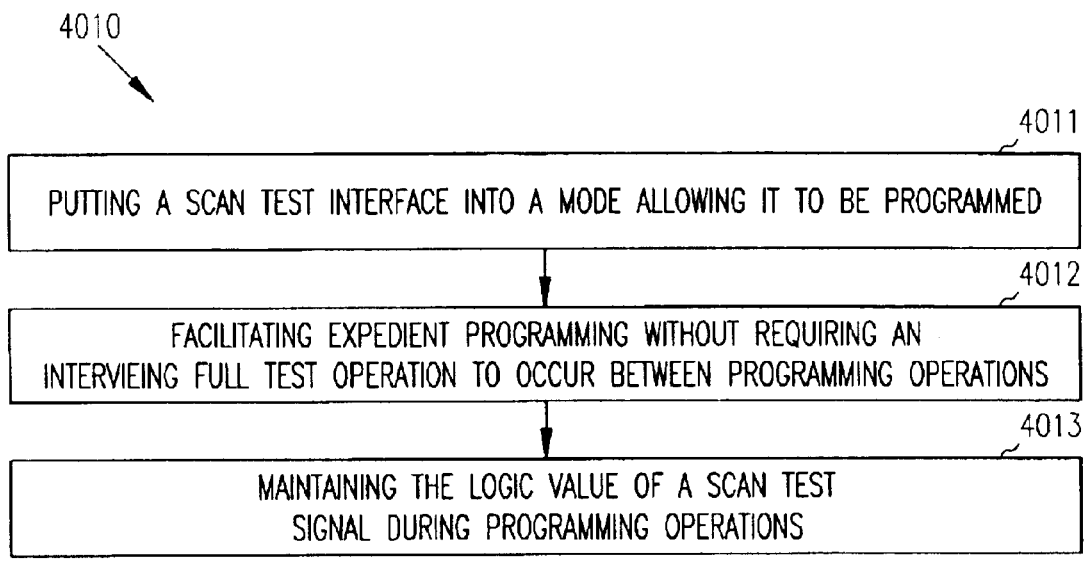
FIG. 40A is a flow chart of one embodiment of a flexible scan test interface reset process of the present invention.

FIG. 40A is a flow chart of flexible scan test interface reset process 4010, one embodiment of the present invention. In step 4011, scan test interface method 3500 puts a scan test interface into a mode allowing it to be programmed. For example, scan test interface method 3500 synchronously enables a TAP controller on a scan test interface while preventing upstream outputs of the scan test interface to drive signals. In step 4012, scan test interface method 3500 facilitates expedient programming without requiring an intervening full reset operation to occur between programming operations. In step 4013, scan test interface method 3500 maintains the logic value of a scan test signal during programming operations.

Figure 40B:
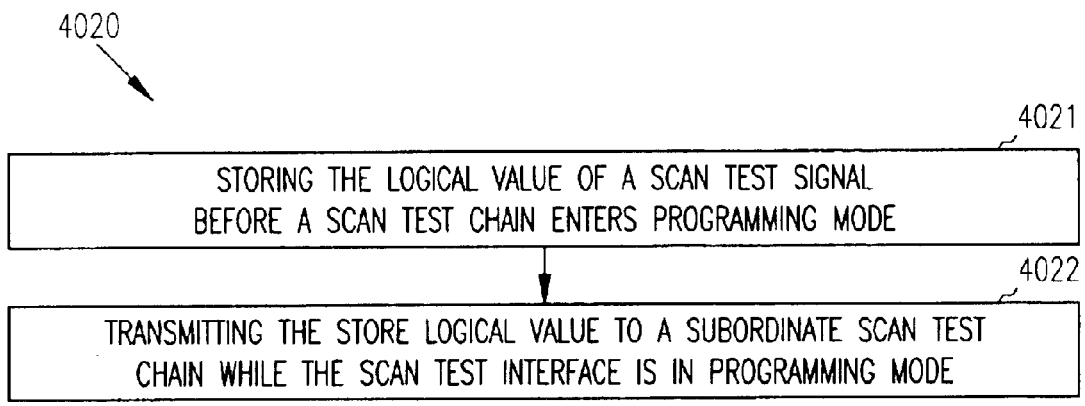
FIG. 40B is a flow chart of scan chain signal static maintenance process, one embodiment of the present invention.

One embodiment of scan test interface method 3500 includes a scan chain signal static maintenance process that prevents a scan test interface from causing spurious scan test chain signal movement in a subordinate scan test chain signal. FIG. 40B is a flow chart of scan chain signal static maintenance process 4020, one embodiment of the present invention. In Step 4021, scan chain signal static maintenance process 4020 stores the logical value of a scan test signal before a scan test chain enters programming mode. In Step 4022 scan chain signal static maintenance process 4020 transmits the stored logical value to a subordinate scan test chain while the scan test interface is in programming mode. For example, a TCK, a TMS, a TDI and a TRSTN signals are buffered by latching them in a scan test chain signal value maintaining D latch included in a scan test interface (e.g., a D latch of a JTAG signal macro included in a SIC). The stored logic values are transmitted when the JTAG macro is disabled. One embodiment of scan chain signal static maintenance process 4000 includes a step (not shown) in which a JTAG macro is disabled. In one exemplary implementation of the present invention a JTAG macro is disabled by deasserting a PSI signal.

In one embodiment of the present invention, scan test interface method 3500 step 3550 includes a flexible scan test interface reset process that supports a partial scan test interface reset and a full scan test interface reset. A partial scan test interface reset facilitates expedient programming without requiring an intervening full reset operation to occur between programming operations. Scan test interface method 3500 resets an internal scan test interface circuit (e.g., scan test interface controller 12 during a partial reset without resetting other internal scan test interface circuits (e.g., scan test interface register 14). In one embodiment of the present invention, a full reset resets internal scan test interface circuits reset in a partial reset in addition to other internal other internal scan test interface circuits.

Figure 41:
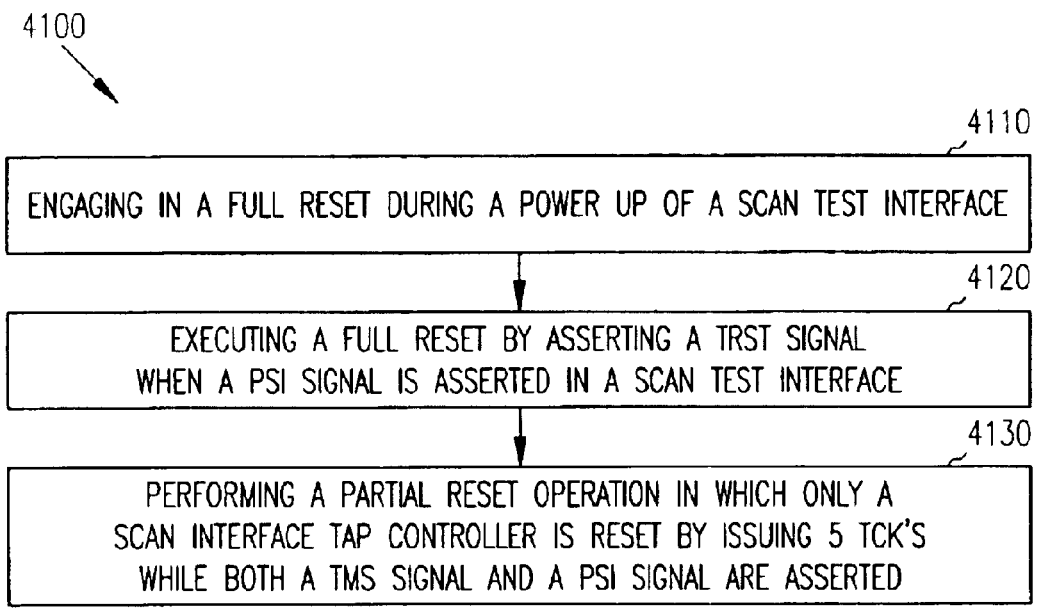
FIG. 41 is a flow chart showing one embodiment of a flexible scan test interface reset process of the present invention.

FIG. 41 is a flow chart showing flexible scan test interface reset process 4100, one embodiment of the present invention. In step 4110 scan test interface method 3500 engages in a full reset during a power up of a scan test interface. In a step 4410 full reset, a scan test interface controller and other circuits in the scan test interface (e.g. a scan test interface register) are reset. For example a scan test interface TAP controller is powered up in a TEST_LOGIC_RESET state, and scan test interface registers are reset except an IDCODE instruction is forced into an instruction register if it is implemented or a BYPASS instruction if the IDCODE instruction is not implemented. In Step 4120, a full reset is executed by asserting a TRST signal when a PSI signal is asserted (e.g., high). In step 4130, a partial reset operation is performed in which only a scan test interface controller is reset. In one embodiment of the present invention, scan test interface method 3500 performs a partial reset by putting a scan test interface TAP controller in the TEST_LOGIC_RESET state but does not reset other scan test interface registers. In one exemplary implementation of scan test interface method 3500, a partial reset is accomplished by issuing 5 TCKs while both a TMS signal and PSI signal are asserted (e.g., a logical one value). In one embodiment of a the present invention partial reset, a TAP controller is put in a TEST_LOGIC_RESET state and an IDCODE instruction is not forced into an instruction register if it is implemented or a BYPASS register if the IDCODE instruction is not implemented.

Figure 42:
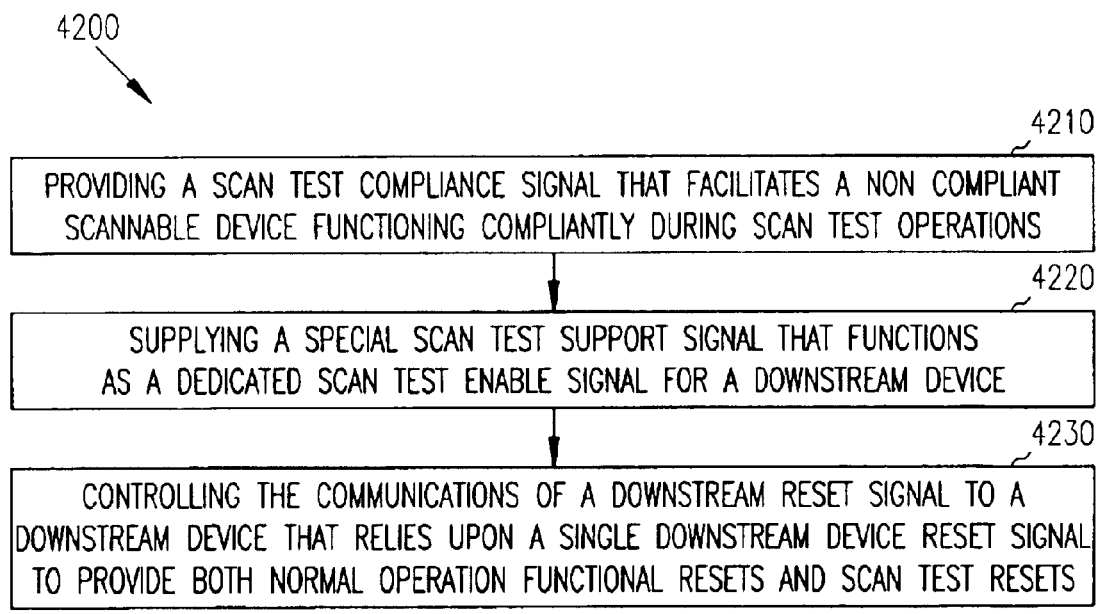
FIG. 42 is a flow chart of a downstream device scan test compliance process included in one embodiment of the present invention.

In one embodiment of step of 3550, scan test interface method 3500 includes a downstream device scan test compliance process. The downstream scan test compliance process supplies programmatically controlled scan test compliance signals (e.g., one for each subordinate scan test chain) to facilitate scan testing of non-compliant scannable devices. The scan test compliance signals are utilized to assist non-compliant devices to function compliantly during scan test operations. FIG. 42 is a flow chart of downstream device scan test compliance process 4200 one embodiment of the present invention. In step 4210 downstream device scan test compliance process provides a scan test compliance signal that facilitates a non compliant scannable device functioning compliantly during scan test operations. In step 4220, downstream device scan test compliance process supplies a special scan test support signal (e.g., special scan test support signal TCEN 3392) that functions as a downstream device dedicated scan test enable signal. In step 4230, downstream device scan test compliance process controls the communication of downstream device reset signal to a downstream device that relies upon a single downstream device reset signal (e.g., downstream device reset signal 3382) to provide both normal operation functional resets and scan test resets (e.g., does not include a dedicated pin for a JTAG TRSTN signal). In one embodiment of the present invention, the scan test compliance signals include a signal that copies the logical values of another signal or the inverse logical values of another signal. (e.g., the inverse of the logical values of a scan test chain enable signal). For example, a scan test compliance signal is a TCENO signal of a SIC chip (e.g., a TCEN signal output on a TCENO port).

In one embodiment of scan test interface method 3500, step 3550 includes providing general purpose Input/Output signals. Scan test interface method 3500 utilizes the general purpose Input/Output signals to support a variety of functions (e.g., lighting an LED). One embodiment of scan test interface method 3500 step 3550 includes a scan test interface general purpose Input/Output process.

Figure 43:
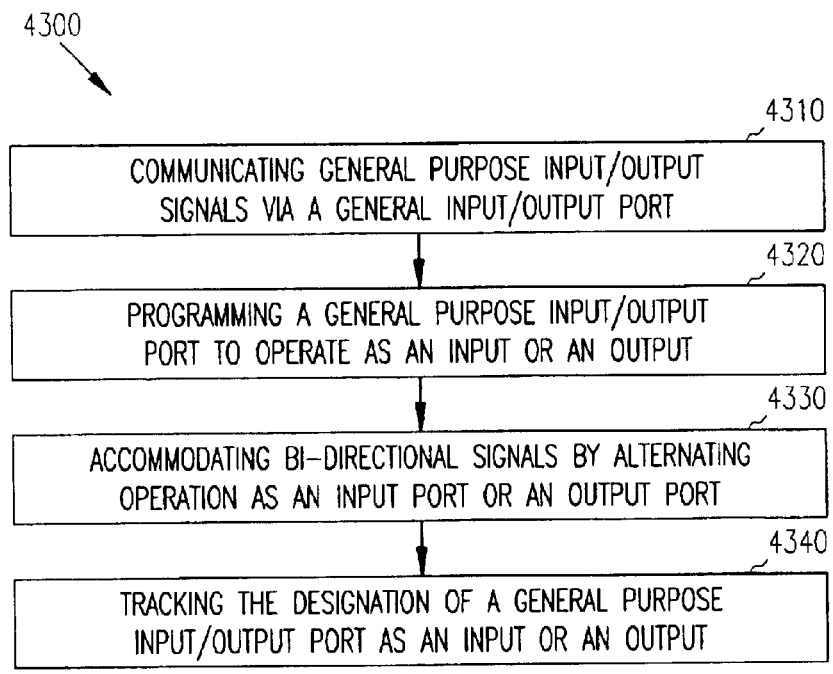
FIG. 43 is a flow chart of one embodiment of a present invention scan test interface general purpose Input/Output process.

FIG. 43 is a flow chart of scan test interface general purpose Input/Output process 4300, one embodiment of the present invention. In step 4310, general purpose Input/Output signals are communicated via a general Input/Output port. In step 4320 the general purpose Input/Output port (e.g., general purpose Input/Output interface 554) is independently programmed to operate as an input or an output port. In one embodiment of the present invention, a scan test interface general purpose Input/Output process utilizes an Input/Output selection circuit (e.g., Input/Output selection circuit 517) to perform selection of a general purpose Input/Output port to function as an input or an output port. In step 4330 the general purpose Input/Output port accommodates bidirectional signals by alternating operation as an input port or an output port. In one embodiment of step 4330, a mode register bit (e.g., mode register 537 bit) is switched on and off at appropriate times through programming sequences. In step 4340 scan test interface general purpose Input/Output process tracks the designation of a general purpose Input/Output port as an input or output. In one embodiment of the present invention, scan test interface general purpose Input/Output process utilizes an Input/Output register (e.g., Input/Output register 534) to track a general purpose Input/Output port as an input or output.

In one embodiment of the present invention, a scan test interface general purpose Input/Output process defines a general purpose I/O port as a pseudo open-collector output. In one embodiment of a scan test interface general purpose Input/Output process a PCB pulls a general purpose Input/Output signal up to a desired (e.g., PCB corresponding) output voltage level. In one embodiment of the present invention, a scan test interface general purpose Input/Output process configures a general purpose I/O port as an input. In one exemplary implementation of the present invention, the I/O port includes a low voltage TTL (3.3 volts) circuit with a logic switching level of 2.0 (Vih) volts and operates properly in lower voltage applications. In one embodiment of the present invention, a scan test interface general purpose Input/Output process makes a general purpose I/O port operate as a non open-collector type output. The general purpose I/O port is not enabled as an output thereby avoiding damage to a scan test interface (e.g., a SIC) or another other device or both. To help prevent damage, in one embodiment of a scan test interface general purpose Input/Output process powers up and resets a general purpose I/O port defined as an input.

Figure 44:
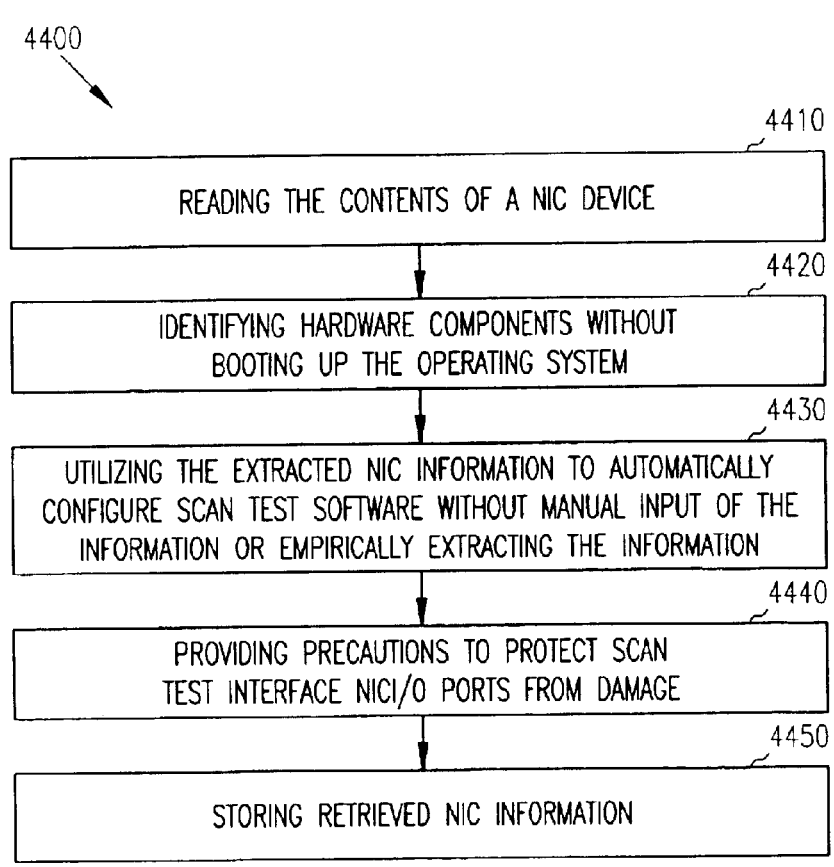
FIG. 44 is a flow chart of scan test device information recovery process included in one embodiment of the present invention.

In one embodiment of step 3550, scan test interface method 3500 automatically retrieves information regarding a PCB and determines the configuration of devices being scan tested. In one embodiment of the present invention, scan test interface method 3500 includes a scan test device information recovery process. FIG. 44 is a flow chart of scan test device information recovery process 4400, one embodiment of the present invention. In step 4410, scan test device information recovery process 4400 reads the contents of a NIC device (e.g., the board type, revision level, serial number, etc.) . In step 4420, scan test interface method 3500 identifies hardware components without booting up the operating system. In step 4430, scan test interface method 3500 utilizes the extracted NIC information to automatically configure test software without manual input of the information or empirically extracting the information. Scan test device information recovery process 4400 provides precautions (e.g., an additional current limiting resistor) to protect scan test interface NIC I/O ports from damage in step 4440. In step 4450, scan test device information recovery process 4400 stores the retrieved NIC information.

In one embodiment of scan test interface method 3500, NIC information is stored in a memory device and scan test interface method 3500 interfaces with the memory device. In one exemplary implementation of the present invention, scan test device information recovery process 4400 interfaces with a Microlan™ interface. This interface operates by a memory device bus master driving the interface wire low for specified periods of time to signal the device to perform its various functions. Scan test device information recovery process 4400 asserts a logical zero value on the interface for different periods of time, tri-states the interface wire and then samples the state of the interface wire after different periods of time. In one embodiment of the present invention, scan test device information recovery process 4400 utilizes 2 bits to interface with 4 fully decodes states. In one embodiment of the present invention, scan test interface method 3500 selects one of a plurality of NIC pins upon with to perform a NIC interface.

In one embodiment of the present invention, scan test interface method 3500 facilitates debug operations and provides a debug signal from a scan test interface. In one embodiment of scan test interface method 3500 selects an internal SIC signal for transmission via a debug port. In one exemplary implementation the debug selection is accomplished by decoding internal signals in the SIC.

Figure 45A:
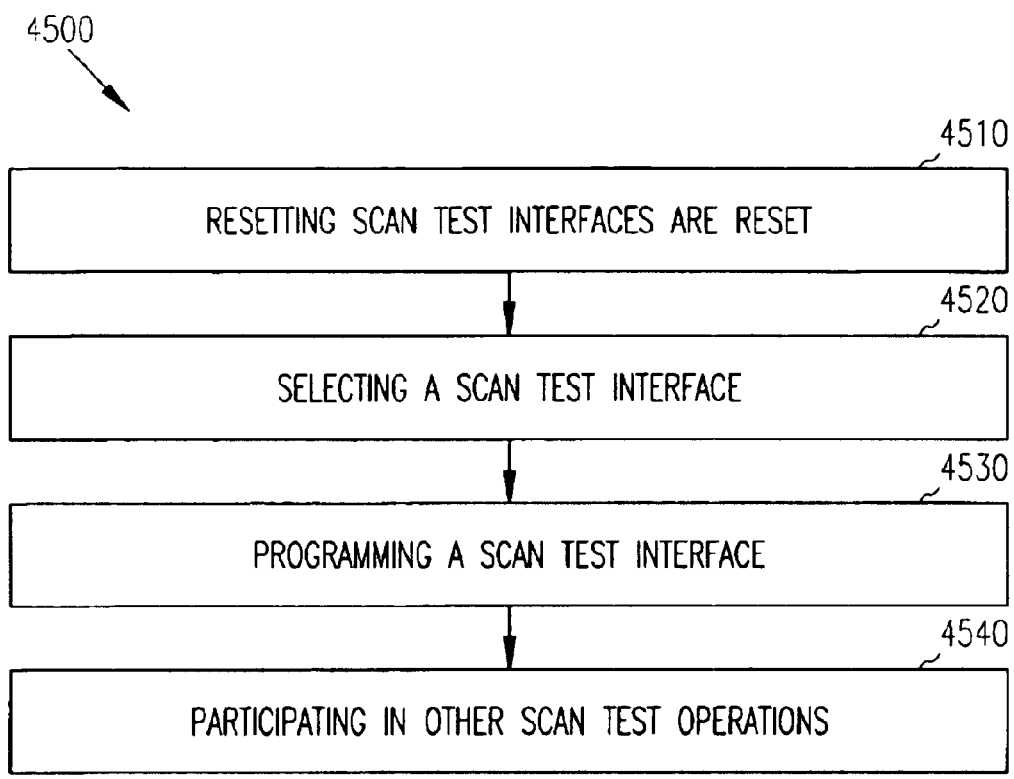
FIG. 45A is a flow chart of one embodiment of a system scan test interface method of the present invention.

FIG. 45A is a flow chart of system scan test interface method 4500, one embodiment of the present invention. System scan test interface method 4500 is a method of interfacing scan test signals between a scan test system controller and downstream scan test devices. In one embodiment of the present invention, the downstream devices are arranged in a multi-drop method in which one copy of each system scan test signal from the scan test system controller is distributed to multiple downstream scan test interfaces via a master scan test bus. In one embodiment of the present invention, the downstream scan test devices are included on PCBs and serviced by scan test interfaces. The multi-drop method of the present invention facilitates the movement of scan test control to the system controller rather than being located at a central workstation and distributed to each module via a separate cable and separate PCB plugged into each module. The multi-drop method also greatly reduces the number of signals that are routed from the system controller to each scannable slot in the module and has less limitations than a star system as to the number of boards that can be scanned in an individual module. In one embodiment of the present invention, system scan test interface method 4500 individually enables a scan test interface included in a system and facilitates flexible configuration and communication of scan test signals. Scan test interface method 4500 includes numerous features that facilitate efficient and effective scan testing operations.

In step 4510 of system scan test interface method 4500, a scan test interface is reset. In one embodiment of the present invention a full reset of a scan test interface occurs whenever power is turned on to a scan test interface. In one embodiment of the present invention, a full reset of a scan test interface also occurs while a TRSTN signal is asserted (e.g., low) and a PSI signal is asserted (e.g., high). In one example implementation, when a full reset occurs a scan test interface TAP controller is reset to the TEST_LOGIC_RESET state, the scan test internal registers bits are reset (e.g., to a logical 0 value), the scan test interface enable (e.g., CHIP ENABLE flip-flop) is reset (e.g., a logical 0 value), the upstream scan test interface outputs (e.g., TDOO) stop driving, the scan test interface downstream outputs (e.g., TDIO, TMSO, TCKO, and TCENO) for the scan test chain interfaces stop driving, the scan test interface reset (e.g., TRSTN) outputs for scan test chain interfaces drive to an asserted logical value (e.g., low), state elements in scan test interface NIC circuits are reset, and scan test interface Input/Output ports are defined as inputs. In one embodiment of the present invention system scan test interface method 4500 implements a partial reset in which a scan test interface TAP controller is reset without resetting other scan test interface circuits (e.g., an internal scan test interface register such as an Idcode register). In one embodiment of the present invention partial reset process includes asserting a PSI signal and issuing 5 TCK signal cycle transitions while a TMS signal is asserted.

In step 4520 of system scan test interface method 4500 the scan test interface is selected. In one embodiment of the present invention the scan test interface is selected after the reset operation or the assertion (e.g., high) of a PSI signal. In one embodiment of step 3320, a PSI signal is asserted (e.g., high) and scan test interface TAP controllers are shifted to the SHIFT_IR state. A LOAD_AR instruction is then shifted into an instructions register in the scan test interface. The TAP controller is sequenced to the SHIFT_DR state and the address of the scan test interface is shifted into an address register. An address of a desired scan test interface is transmitted to the scan test interface. The loaded address and transmitted address are compared. The TAP controller is sequenced to the RUN_TEST_IDLE state. Upon passing through the UPDATE_DR TAP state, if the compared addresses match, the CHIP_ENABLE flip-flop on the addressed scan test interface is set.

In one embodiment step 4520, system scan test interface method 4500 includes a broadcast address transmission. In one embodiment of the present invention a scan interface also includes a broadcast address that enables it for programming purposes. In one embodiment of the present invention, a plurality of scan test interfaces are enabled to perform internal functions (e.g., programming). If a broadcast address is specified, the scan interface enables of all scan test interfaces corresponding identifying broadcast addresses (e.g., SICs on a bus) will be set.

In step 4530 of system scan test interface method 4500 the scan test interface is programmed. In one embodiment of the present invention, once a specific scan test interface is enabled (e.g., indicated by its CHIP_ENABLE flip-flop being set) subsequent operations performed while the PSI signal is asserted (e.g., high) affect the selected scan test interface. In one embodiment of the present invention, the TAP controllers included in the non-selected scan test interfaces sequence through the various states and load the same instructions shifted into an enabled scan test interface. However, the non selected scan test interfaces do not load their internal registers nor enable upstream output ports. If the scan test interfaces are enabled, due to Broadcast mode, their internal registers will be loaded but, their TDO output will be disabled from driving.

Figure 45B:
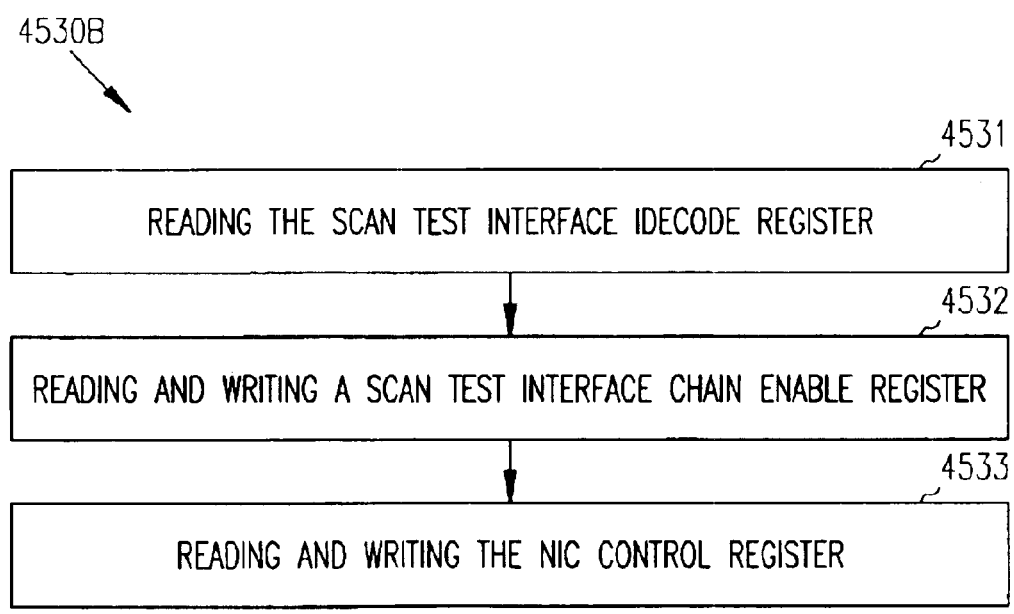
FIG. 45B is a flow chart of a scan test interface method programming process included in one embodiment of the present invention.

FIG. 45B is a flow chart of scan test interface programming process 4530B, one embodiment of a programming process of step 4530. In step 4531 a scan test interface IDcode register is read after a scan test interface is selected. In one example implementation, an IDcode register is read by shifting the IDCODE instruction into an instruction register and shifting out the identification code. In step 4532, scan test interface method programming process 4530B reads and writes a scan test interface chain enable register. The scan test interface chain enable register is read and written in one embodiment of the present invention by shifting a LOAD_CER instruction into an instruction register and simultaneously shifting in a "new" chain enable mask while shifting out the "old" chain enable mask. Scan test interface method programming process 4530B writes the chain enable register with the "old" value of the chain enable mask shifted out during a read operation if it is not to be modified. In step 4533 scan test interface method programming process 4530B reads and writes a NIC control register (NCR). Once the specified scan test interface is selected. In one embodiment of the present invention, a NIC control register is read and written by shifting a LOAD_NCR instruction into the instruction register and shifting in the "new" NIC control word while shifting out the "old" NIC control word.

In one embodiment of the present invention in which the scan test interface includes a NIC, the general timing and sequencing of NIC control logic is to write a NCR bits 26:20 with a clock divide value, NCR bits 19:10 with a Bus Master Pulse Duration value, NCR bits 9:2 with a Sampling Offset value, NCR bit 1 (Sample Data Valid) with logical 0 value and NCR bit 0 (Sample Data) with X (in one example this is a read only bit). Once the NCR has been loaded, the TAP controller sequences to a RUN_TEST_IDLE state where it remains while subsequent TCKs are issued until a sample data valid signal is asserted (high) on a TDOO port. In one embodiment of the present invention, the scan software is not interrupt driven and it polls the TDOO port until it sees the sample data valid signal asserted. The polling frequency is software dependent.

In step 4540 of system scan test interface method 4500, a scan test interface participates in other scan test operations. For example, scan test operations to a PCB with an enabled scan interface are performed. This is accomplished by de-asserting (e.g., a low logic value) the PSI input. In one embodiment of system scan test interface method 4500, transitions on the JTAG signals are propagated via the scan test interface to the corresponding ports of enabled scan test chains. In one embodiment of the present invention, the internal state of the scan test interface does not change while the PSI signal is deasserted with the exception of latches that capture and hold the state of enabled JTAG signals themselves.

Thus, the present invention facilitates a flexibly programmable system level scan test architecture. The present invention provides a scan test signal interface between an upstream scan test device and downstream scan test devices and facilitates resets of a scan test interface TAP controller without necessarily resetting other scan test registers. A present invention scan test interface system also facilitates reduction of spurious transitions on a scan chain and assists one board to hold the state of a scan operation while a second board is selected for scan test operations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A scan test interface comprising:

a scan test interface register for storing information related to scan test operations that support both partial reset operations and full reset operations;

a system interface coupled to said scan test interface register, said system interface provides a communication port for communicating scan test operation information between said scan test interface and upstream scan test devices;

a scan test interface controller coupled to said scan test interface register, said scan test interface controller directs operations of said scan test interface register to support both a partial reset operation and full reset operation;

a selection circuit coupled to said scan test interface register, said selection circuit facilitates selection of a scan test chain;

a board interface coupled to said selection circuit, said board interface includes multiple scan test chain ports for communicating a separate set of scan test signals for each downstream scan test chain; and a reset circuit coupled to said scan test interface register, said reset circuit initiates a reset of said scan test interface register during a full reset operation, wherein said reset circuit comprises:
- a reset OR gate for issuing a reset signal when power is turned off or when a program scan interface (PSI) and test reset (TRSTN) signal are asserted;
- a voltage inverter coupled to said reset OR gate, said high logic voltage inverter outputs a logical one value momentarily when the power to said scan test interface is turned on and then outputs a logical zero value;
- a reset AND gate coupled to said reset OR gate, said reset AND gate outputs a logical one value when a program scan interface (PSI) signal and test reset (TRSTN) signal are asserted; and
- a test reset inverter coupled to said reset AND gate, said test reset inverter inverts said TRSTN signal.

2. The scan test interface of claim 1 wherein a full reset operation occurs during power up.

3. The scan test interface of claim 1 wherein a full reset operation occurs when a program scan interface (PSI) signal and a test reset (TRSTN) signal are asserted.

4. The scan test interface of claim 1 wherein a partial reset operation occurs when a program scan interface (PSI) signal and a test mode select (TMS) signal are asserted and five test clock (TCK) signal cycles are issued.

5. The scan test interface of claim 1 wherein said scan test interface controller comprises a test access port (TAP) controller that is reset in both a partial and full reset.

6. The scan test interface of claim 5 wherein said TAP controller is reset when a program scan interface (PSI) signal and a test mode select (TMS) signal are asserted and five test clock (TCK) signal cycles are issued without resetting other circuits of said scan test interface.

7. The scan test interface of claim 1 further comprising a reset circuit coupled to said scan test interface register, said reset circuit resets a chip enable circuit included in said scan test interface controller during a full reset operation.

8. A multi-drop scan interface chip (SIC) scan test system comprising:
- a plurality of downstream scannable devices arranged in a first separate scan test chains and a second separate scan test chain;
- a SIC coupled to said plurality of downstream scannable devices, said SIC supports both full reset and partial reset programming operations without requiring a full reset between programming operations; and
- a scan test system controller coupled to said SIC, said scan test system controller communicating said scan test signals to and from said SIC.

9. A multi-drop SIC scan test system of claim 8 wherein said SIC comprises:
- a test access port (TAP) controller that is reset when a test mode select (TMS) signal is asserted and a test clock (TCK) signal cycles five times; and
- a scan test interface register coupled to said TAP controller, said scan test interface register is not reset when said TMS signal is asserted and said TCK signal cycles five times.

10. A multi-drop SIC scan test system of claim 9 wherein said TAP controller and said scan test interface register are reset on power up.

11. A multi-drop SIC scan test system of claim 9 wherein said TAP controller and said scan test interface register are reset when a program scan interface (PSI) signal asserted and a test reset (TRSTN) signal are asserted.

12. A multi-drop SIC scan test system of claim 8 wherein a TEST_LOGIC_RESET state of the TAP controller does not impact the RESET signal for a SIC register.

13. A scan test interface comprising:
- a scan test interface register for storing information related to scan test operations;
- a system interface coupled to said scan test interface register, said system interface provides a communication port for communicating scan test operation information between said scan test interface and upstream scan test devices;
- a scan test interface controller coupled to said scan test interface register, said scan test interface controller directs operations of said scan test interface register;
- a selection circuit coupled to said scan test interface register, said selection circuit facilitates selection of a scan test chain and holds logic levels of subordinate scan test chain signals static when said scan test interface enters programming mode; and
- a board interface coupled to said selection circuit, said board interface includes multiple scan test chain ports for communicating a separate set of scan test signals for each downstream scan test chain.

14. The scan test interface system of claim 13 wherein said selection circuit maintains the state of a downstream scan test signal transmission during programming operations and restricts spurious transitions on a scan chain during programming operations.

15. The scan test interface system of claim 13 wherein said selection circuit holds the logic levels of subordinate scan test chain signals static by storing the logical value of the last logic value of a scan test signal in a scan chain signal storage circuit before entering a programming mode and transmitting the stored logical value to the subordinate scan test chain during programming mode.

16. The scan test interface system of claim 13 wherein said selection circuit further comprises a JTAG macro circuit that stores the JTAG signal state when the scan test chain is not enabled.

17. The scan test interface system of claim 13 wherein said selection circuit further comprises a latch for tracking the state of a scan test signal.

18. The scan test interface system of claim 17 wherein said latch latches a scan test signal when transition occurs from a nonprogramming scan test operation scan test operation and saves it during a scan test interface programming operation.

19. A scan test interface method comprising the steps of:
- receiving scan test information from upstream scan test devices;
- transmitting scan test information to downstream devices;
- receiving scan test information from downstream devices;
- transmitting scan test information to upstream scan test devices; and
- facilitating flexible scan test operations including holding logic levels of subordinate scan test chain signals static when a scan test interface enters a programming mode.

20. The scan test interface method of claim 19 further comprising the steps of:
- putting a scan test interface into a mode allowing it to be programmed;
- facilitating expedient programming without requiring an intervening full reset operation to occur between programming operations; and
- maintaining the logic value of a scan test signal during programming operations.

21. The scan test interface method of claim 19 further comprising the step of synchronously enabling a test access port (TAP) controller on a scan test interfaces while preventing upstream outputs of the scan test interface to drive signals.

22. The scan test interface method of claim 19 wherein a scan chain signal static maintenance process reduction of spurious scan test chain signal movement in a subordinate scan test chain signal during programming operations.

23. The scan test interface method of claim 19 further comprising the steps of:

storing the logical value of a scan test signal before a scan test chain enters programming mode; and transmitting the stored logical value to a subordinate scan test chain while the scan test interface is in programming mode.

24. The scan test interface method of claim 19 further comprising the steps of:

latching a test clock (TCK), a test mode select (TMS), a test data in (TDI) and a test reset (TRSTN) signal in a scan test chain signal value maintaining D latch included in a scan test interface JTAG macro; and transmitting the latched logical values when said scan test interface JTAG macro is disabled.

25. The scan test interface method of claim 22 further comprising the step of deasserting said scan test interface JTAG macro by deasserting a program scan interface (PSI) signal.

* * * * *

UNITED STATES PATENT AND TRADEMARK OFFICE
CERTIFICATE OF CORRECTION

PATENT NO. : 6,754,863 B1  Page 1 of 1
DATED : June 22, 2004
INVENTOR(S) : Grannis, III It is certified that error appears in the above-identified patent and that said Letters Patent is hereby corrected as shown below:

Column 49,
Line 40, delete "chains" and insert -- chain --, therefor.

Column 50,
Line 43, after "nonprogramming" delete "scan test operation".

Signed and Sealed this

Seventh Day of September, 2004

JON W. DUDAS
*Director of the United States Patent and Trademark Office*